US008648517B2

(12) United States Patent
Okamura et al.

(10) Patent No.: US 8,648,517 B2
(45) Date of Patent: Feb. 11, 2014

(54) MULTILAYER PIEZOELECTRIC ELEMENT AND INJECTOR USING THE SAME

(71) Applicant: Kyocera Corporation, Kyoto (JP)

(72) Inventors: Takeshi Okamura, Kirishima (JP); Masaki Terazono, Kirishima (JP); Tomohiro Kawamoto, Kirishima (JP); Takafumi Tsurumaru, Kirishima (JP); Shigenobu Nakamura, Kirishima (JP); Ken Yamamoto, Kirishima (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 13/728,184

(22) Filed: Dec. 27, 2012

(65) Prior Publication Data
US 2013/0161421 A1 Jun. 27, 2013

Related U.S. Application Data

(62) Division of application No. 11/917,747, filed as application No. PCT/JP2006/312046 on Jun. 15, 2006.

(30) Foreign Application Priority Data

Jun. 15, 2005 (JP) ................... 2005-175719
Jun. 28, 2005 (JP) ................... 2005-188986
Sep. 29, 2005 (JP) ................... 2005-283682
Sep. 29, 2005 (JP) ................... 2005-283684
Oct. 28, 2005 (JP) ................... 2005-313865
Mar. 29, 2006 (JP) ................... 2006-089697
Mar. 29, 2006 (JP) ................... 2006-089698
May 31, 2006 (JP) ................... 2006-152288
May 31, 2006 (JP) ................... 2006-152289

(51) Int. Cl.
H01L 41/083 (2006.01)

(52) U.S. Cl.
USPC ............ 310/365; 310/328; 310/364; 310/367

(58) Field of Classification Search
USPC .................... 310/365, 366, 328, 364
See application file for complete search history.

(56) References Cited

U.S. PATENT DOCUMENTS 5,089,739 A    2/1992  Takahashi et al.
7,420,319 B2 * 9/2008  Kastl et al. .................... 310/363
(Continued)

FOREIGN PATENT DOCUMENTS

EP    0448349    9/1991
JP    60-086880  5/1985
(Continued)

OTHER PUBLICATIONS

Chinese language office action and its English translation for corresponding Chinese application 200680021047.

(Continued)

Primary Examiner — Derek Rosenau
Assistant Examiner — Bryan Gordon
(74) Attorney, Agent, or Firm — DLA Piper LLP (US)

(57) ABSTRACT

A multilayer piezoelectric element includes a plurality of piezoelectric layers and a plurality of metal layers stacked alternately. The plurality of metal layers include a plurality of low-filled metal layers having a lower filling rate of metal composing the metal layers than oppositely disposed metal layers adjacent to each other in a stacking direction. The plurality of metal layers may include a plurality of thin metal layers having a smaller thickness than oppositely disposed metal layers adjacent to each other in a stacking direction. Where the plurality of metal layers are composed mainly of an alloy, the plurality of metal layers may include a plurality of high-ratio metal layers having a higher ratio of a component constituting the alloy than oppositely disposed metal layers adjacent to each other in a stacking direction.

13 Claims, 22 Drawing Sheets

(56) References Cited

U.S. PATENT DOCUMENTS

| | | |
|---|---|---|
| 2002/0150508 A1 | 10/2002 | Nagaya et al. |
| 2004/0185278 A1 | 9/2004 | Sato ............................. 428/469 |
| 2004/0232843 A1* | 11/2004 | Kim et al. ..................... 313/586 |
| 2006/0181178 A1 | 8/2006 | Kastl et al. |
| 2006/0238073 A1 | 10/2006 | Ragossnig et al. ............ 310/328 |
| 2007/0273251 A1 | 11/2007 | Okamura et al. .............. 310/364 |
| 2008/0238264 A1* | 10/2008 | Nakamura et al. ............ 310/364 |
| 2009/0122462 A1* | 5/2009 | Suzuki et al. ............... 361/321.2 |
| 2009/0295256 A1* | 12/2009 | Okamura et al. .............. 310/363 |
| 2010/0282874 A1* | 11/2010 | Nakamura et al. ......... 239/585.1 |

FOREIGN PATENT DOCUMENTS

| | | |
|---|---|---|
| JP | 61-133715 | 6/1986 |
| JP | 63-142875 | 6/1988 |
| JP | 01-130568 | 5/1989 |
| JP | 03-064979 | 3/1991 |
| JP | 03-106082 | 5/1991 |
| JP | 06-326370 | 11/1994 |
| JP | 07-030165 | 1/1995 |
| JP | 07-154005 | 6/1996 |
| JP | 10-199750 | 7/1998 |
| JP | 11-186626 | 7/1999 |
| JP | 2000-022228 | 1/2000 |
| JP | 2001-144340 | 5/2001 |
| WO | WO 2006000479 | 1/2006 |

OTHER PUBLICATIONS

Extended European Search Report dated Feb. 24, 2012 issued in corresponding European application 06766780.8.

* cited by examiner

Fig.1
(a)
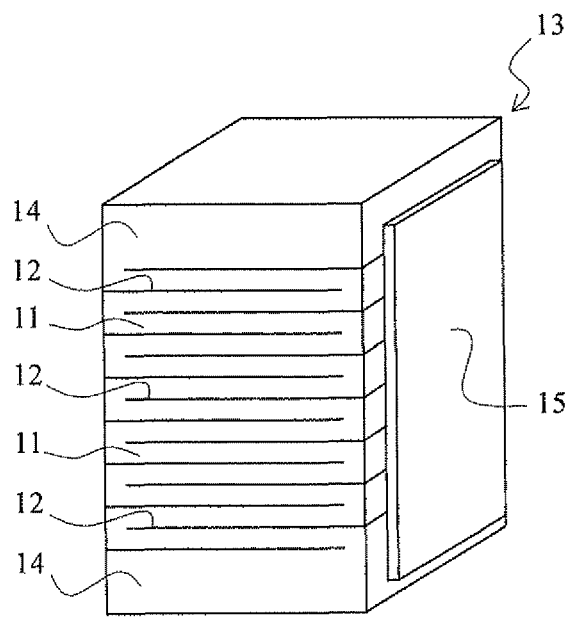
(b)
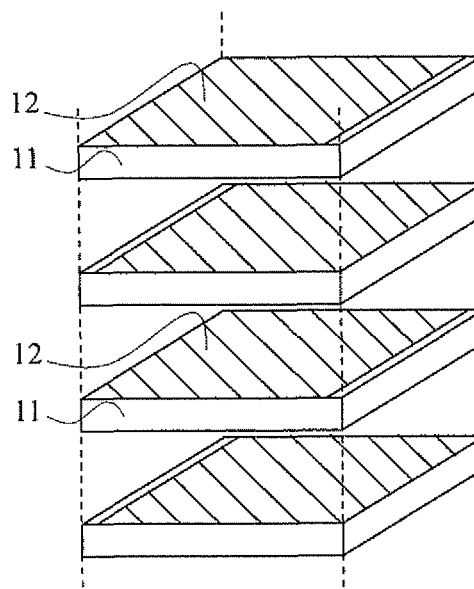

Fig.21
(a)
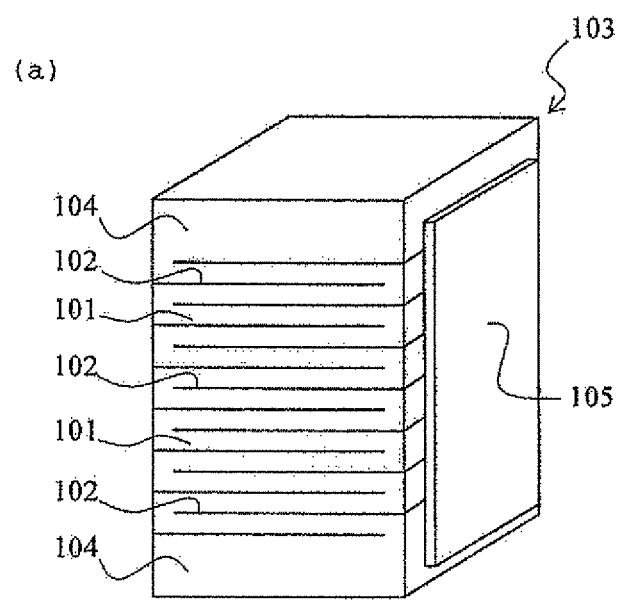
(b)
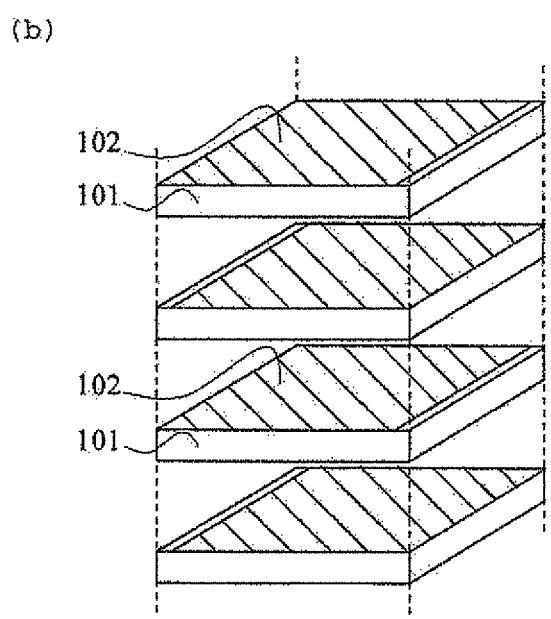

MULTILAYER PIEZOELECTRIC ELEMENT AND INJECTOR USING THE SAME

TECHNICAL FIELD

The present invention relates to a multilayer piezoelectric element (in some cases hereinafter referred to simply as an "element") and an injector, and in particular, to a multilayer piezoelectric element and an injector which are suitable for a long-term continuous driving under high voltage and high pressure.

BACKGROUND ART

As an example employing a multilayer piezoelectric element, piezoelectric actuators in which piezoelectric layers and metal layers are alternately stacked one upon another have conventionally been proposed. In general, the piezoelectric actuator can be classified into the following two types of simultaneous sintering type and multilayer type in which piezoelectric porcelains consisting of a piezoelectric body and metal layers of plate-like body are alternately stacked one upon another. Among others, the simultaneous sintering type piezoelectric actuators are often used from the viewpoints of lower voltage and manufacturing cost reduction. The simultaneous sintering type piezoelectric actuators facilitate a reduction in layer thickness and have excellent miniaturization and durability.

FIG. 21(a) is a perspective view showing a conventional multilayer piezoelectric element. FIG. 21(b) is a partial perspective view showing the stacked state of piezoelectric layers and metal layers in FIG. 21(a). FIGS. 22 and 23 are partially enlarged cross sections showing the stacked structure in the conventional multilayer piezoelectric element. As shown in FIG. 21, the multilayer piezoelectric element is composed of a stacked body 103, and a pair of external electrodes 105 formed on opposed side surfaces, respectively. The stacked body 103 is configured by alternately stacking piezoelectric layers 101 and metal layers 102. Inactive layers 104 are stacked on both end surfaces of the stacked body 103 in the stacking direction, respectively. The metal layers 102 are not formed entirely over the main surfaces of the piezoelectric layers 101, thereby forming a so-called partial electrode structure. The metal layers 102 in the partial electrode structure are stacked so as to be exposed by every other layer to different side surfaces of the stacked body 103, and the metal layers 102 are connected by every other layer to the pair of external electrodes 105.

A conventional method of manufacturing the conventional multilayer piezoelectric element is as follows. That is, firstly, a metal paste is printed on a ceramic green sheet containing the raw material of the piezoelectric layers 101, in such a pattern as shown in FIG. 21(b), which forms a predetermined metal layer structure. Then, a plurality of the green sheets with the metal paste printed thereon are stacked one upon another to prepare a stacked forming body. The stacked forming body is then sintered to obtain the stacked body 103. Thereafter, the metal paste is applied to the opposed side surfaces of the stacked body 103, and then sintered to form a pair of the external electrodes 105, resulting in the multilayer piezoelectric element as shown in FIG. 21(a) (for example, refer to Patent Document No. 1).

As the metal layers 102, in general, an alloy of silver and palladium is often used. In order to simultaneously sinter the piezoelectric layers 101 and the metal layers 102, the metal composition of the metal layers 102 is often set to a 70% by mass of silver and a 30% by mass of palladium (for example, refer to Patent Document No. 2). The following is the reason that the metal layers 102 composed of the alloy of silver and palladium are used instead of the metal layers consisting only of silver.

That is, the composition of the metal layers 102, which consists only of silver and contains no palladium, causes so-called ion migration phenomenon that when a potential difference is applied to between the opposed metal layers 102, the silver ions in the metal layers 102 migrate through the element surface, from the positive electrode to the negative electrode in the opposed metal layers 102. This phenomenon tends to occur remarkably in the atmosphere of high temperature and high moisture.

On the other hand, for the purpose of forming the metal layers 102 of substantially identical metal filling rate (proportion), a metal paste whose metal composition rate and metal concentration are prepared so as to be substantially the same has conventionally been used. When this metal paste is screen-printed on the ceramic green sheet, the stacked body 103 is prepared by setting a mesh density and a resist thickness to substantially the same condition. In the metal layers 102 formed with this metal paste, voids 102' can be formed nearly uniformly, as shown in FIG. 22.

As shown in FIG. 23, for the purpose of forming the metal layers 102 of substantially identical thickness, a metal paste whose metal composition rate and metal concentration are prepared to be substantially the same has been conventionally used. When this metal paste is screen-printed on the ceramic green sheet, the stacked body 103 is prepared by setting a mesh density and a resist thickness to substantially the same.

In the case of pressing and stacking ceramic green sheets, the metal layers 102 have a partial electrode structure. Therefore, the area where the metal layers 102 are overlapped with each other, and the area where the metal layers 102 are not overlapped with each other have different pressed states. As a result, the metal layer density may become non-uniform even in the same surface of the metal layer 102. Hence, there has been proposed the method in which the metal filling rate is equalized by forming recess portions in a ceramic sheet corresponding to the area where the metal layer 102 should be formed (for example, refer to Patent Document No. 3).

In the case of using the abovementioned multilayer piezoelectric element as a piezoelectric actuator, it can be driven by connecting and securing lead wires (not shown) by soldering to the external electrodes 105, respectively, and then applying a predetermined potential to between the external electrodes 105. The multilayer piezoelectric element used for this purpose is recently miniaturized and also required to ensure a large displacement under large pressure. Hence, the abovementioned multilayer piezoelectric element is required to be usable even under severe conditions of higher electric field (voltage) application and a long-term continuous driving.

In order to meet the abovementioned requirement, namely, the requirement of a long-term continuous driving under high voltage and high pressure, Patent Document No. 4 describes the element provided with a layer in which the thickness of the piezoelectric layer 101 is varied. That is, stress relaxation is performed utilizing the fact that the difference in thickness changes the displacement with respect to other layer.

In the simultaneous sintering type of multilayer piezoelectric element, attempts have been made to form a uniform metal layer so that a voltage can be applied uniformly to every piezoelectric body. Particularly, in order to equalize the electric conductivity of each metal layer, and equalize the surface area of the portion connected to the piezoelectric body, attempts have been made to equalize the metal composition of the metal layer. Further, in order to equalize the surface area of the portion connected to the piezoelectric body, attempts have been made to equalize the thickness of the metal layers.

In the stacked type of multilayer piezoelectric element, it has been proposed to control so that the contact resistance of the interface between the electrode and the piezoelectric body is high at the center in the stacking direction of the multilayer piezoelectric element, and is lowered toward the both ends, and so that no stress concentrates at the center in the stacking direction of the multilayer piezoelectric element (for example, refer to Patent Document No. 5).

However, unlike the normal multilayer electronic components such as capacitors, the multilayer piezoelectric element itself continuously causes a dimensional change at the time of driving. Therefore, if all of the piezoelectric bodies are closely driven with the metal layer in between, the piezoelectric element will be integrally drivingly deformed, so that the stress due to the deformation of the element is concentrated at the outer peripheral portion of the center of the element which expands at the time of compression and necks at the time of spreading. When this multilayer piezoelectric element is subjected to a long-term continuous driving under high voltage and high pressure, for the above reason, delamination might arise on the interface (the stacking interface) between the piezoelectric layer and the metal layer. Especially, stress concentrates on the interface between an active layer causing piezoelectric displacement and the inactive layer causing no piezoelectric displacement, and this interface becomes the starting point of delamination.

In some cases, resonance phenomenon that the displacement behaviors of the respective piezoelectric layers match with each other is generated which may cause beat sound, and harmonic signals of integral multiples of driving frequency are generated which may cause noise composition. When the multilayer piezoelectric element causing continuous dimensional changes are driven for a long period of time, the element temperature rises. When the energy of the temperature rise of the element exceeds heat release, there arises so-called hermorunaway phenomenon that the element temperature is raised acceleratedly. This leads to the problem that the piezoelectric body displacement is lowered as the temperature is raised, and the piezoelectric body displacement is sharply lowered by the fact that the piezoelectric layer has a higher temperature than the Curie point of the piezoelectric body. Hence, a metal layer having a small specific resistance is needed for suppressing the element temperature rise.

Further, there is the feature that the piezoelectric body displacement changes by environmental temperatures. Therefore, when the conventional multilayer piezoelectric element is used as an actuator for use in a driving element such as a fuel injector, the piezoelectric body displacement might vary by the element temperature rise. That is, due to the problem that the desired displacement varies gradually, the suppression of displacement variations during the long-term continuous operation and the improvement of durability have been demanded.

As a method of solving the above problem, the methods as described in the above Patent Document No. 4 and Patent Document No. 5 have been employed, however, it cannot be said that the improvements are sufficient under severe conditions of a long-term continuous driving at high voltage and high pressure. That is, stress may concentrate at the outer periphery of the center of the element, and the displacement may vary by the occurrence of cracks and flaking.

Patent Document No. 1: Japanese Unexamined Patent Publication No. 61-133715
Patent Document No. 2: Japanese Unexamined utility model Publication No. 01-130568
Patent Document No. 3: Japanese Unexamined Patent Publication No. 10-199750
Patent Document No. 4: Japanese Unexamined Patent Publication No. 60-86880
Patent Document No. 5: Japanese Unexamined Patent Publication No. 06-326370

DISCLOSURE OF THE INVENTION

Problems to be Solved by the Invention

It is an advantage of the present invention to provide a multilayer piezoelectric element having a large displacement under high voltage and high pressure, and having excellent durability enabling the displacement to be suppressed even in a long-term continuous driving, and provide an injector using the multilayer piezoelectric element.

Means for Solving the Problems

The present inventors have made tremendous research effort to solve the abovementioned problems and have completed the present invention based on the following new fact. That is, when a plurality of metal layers in a multilayer piezoelectric element include a plurality of metal layers having a different specific metal filling rate from oppositely disposed metal layers adjacent to each other in the stacking direction, the stress exerted on the element can be dispersed, so that a large displacement can be obtained and resonance phenomena can also be suppressed. Hence, even in a long-term continuous driving under high voltage and high pressure, the variations in displacement and the delamination of the stacked portions can be suppressed, thereby obtaining a multilayer piezoelectric element having excellent durability.

Specifically, in a multilayer piezoelectric element of the present invention in which a plurality of piezoelectric layers and a plurality of metal layers are stacked alternately, a plurality of the metal layers include a plurality of low-filled metal layers having a lower filling rate of metal composing the metal layers than oppositely disposed metal layers adjacent to each other in a stacking direction.

In a multilayer piezoelectric element of the present invention in which a plurality of piezoelectric layers and a plurality of metal layers are stacked alternately, a plurality of the metal layers include a plurality of high-filled metal layers having a higher filling rate of metal composing the metal layers than oppositely disposed metal layers adjacent to each other in the stacking direction.

In a multilayer piezoelectric element of the present invention in which a plurality of piezoelectric layers and a plurality of metal layers are stacked alternately, an inactive layer composed of a piezoelectric body is formed at both sides in a stacking direction, and a metal layer adjacent to the inactive layer is a low-filled metal layer having a lower metal filling rate than a metal filling rate in metal layers adjacent to each other in the stacking direction.

In a multilayer piezoelectric element of the present invention in which a plurality of piezoelectric layers and a plurality of metal layers are stacked alternately, an inactive layer composed of a piezoelectric body is formed at both sides in a stacking direction, and a metal layer adjacent to the inactive layer is a high-filled metal layer having a higher metal filling rate than a metal filling rate in metal layers adjacent to each other in the stacking direction.

The present inventors also have made tremendous research effort to solve the abovementioned problems and have completed the present invention based on the following new fact.

That is, when a plurality of metal layers in a multilayer piezoelectric element include a plurality of metal layers having a different thickness from oppositely disposed metal layers adjacent to each other in the stacking direction, the stress exerted on the element can be dispersed. This enables attainment of a large displacement and also suppression of resonance phenomena. Hence, even in a long-term continuous driving under high voltage and high pressure, the variations in displacement and the delamination of the stacked portions can be suppressed, thereby obtaining a multilayer piezoelectric element having excellent durability.

Specifically, in other multilayer piezoelectric element of the present invention in which a plurality of piezoelectric layers and a plurality of metal layers are stacked alternately, a plurality of the metal layers include a plurality of thin metal layers having a smaller thickness than oppositely disposed metal layers adjacent to each other in a stacking direction.

In other multilayer piezoelectric element of the present invention in which a plurality of piezoelectric layers and a plurality of metal layers are stacked alternately, a plurality of the metal layers include a plurality of thick metal layers having a larger thickness than oppositely disposed metal layers adjacent to each other in a stacking direction.

In other multilayer piezoelectric element of the present invention in which a plurality of piezoelectric layers and a plurality of metal layers are stacked alternately, an inactive layer composed of a piezoelectric body is formed at both sides in a stacking direction, and a metal layer adjacent to the inactive layer is a thin metal layer having a smaller thickness than metal layers adjacent to each other in the stacking direction.

In other multilayer piezoelectric element of the present invention in which a plurality of piezoelectric layers and a plurality of metal layers are stacked alternately, an inactive layer composed of a piezoelectric body is formed at both sides in a stacking direction, and a metal layer adjacent to the inactive layer is a thick metal layer having a larger thickness than metal layers adjacent to each other in the stacking direction.

The present inventors also have made tremendous research effort to solve the abovementioned problems and have completed the present invention based on the following new fact. That is, instead of being uniform composition of all of a plurality of metal layers composing mainly of an alloy, as has been conventional, by containing a plurality of high-ratio metal layers having a higher ratio of a component constituting an alloy than oppositely disposed metal layers adjacent to each other, a large displacement can be obtained, and resonance phenomena can be suppressed. Hence, even in a long-term continuous driving under high voltage and high pressure, the variations in displacement and the delamination of the stacked portions can be suppressed, thereby obtaining a multilayer piezoelectric element having excellent durability.

Specifically, in still other multilayer piezoelectric element of the present invention in which a plurality of piezoelectric layers and a plurality of metal layers composed mainly of an alloy are stacked alternately, a plurality of the metal layers include a plurality of high-ratio metal layers having a higher ratio of a component constituting the alloy than oppositely disposed metal layers adjacent to each other in a stacking direction.

In the present invention, a plurality of metal layers may consist only of an alloy, or alternatively, a part of the alloy may be single-component metal.

In still other multilayer piezoelectric element of the present invention in which a plurality of piezoelectric layers and a plurality of metal layers are stacked alternately, a plurality of the metal layers include a plurality of high-ratio metal layers having a higher ratio of at least a component constituting the metal layer than oppositely disposed metal layers adjacent to each other in a stacking direction.

In still other multilayer piezoelectric element of the present invention in which a plurality of piezoelectric layers and a plurality of metal layers are stacked alternately, a plurality of the metal layers include at least two types of metal layers having different main components, a plurality of one type of which are disposed with a plurality of different metal layers in between.

An injector of the present invention includes a container having an injection hole, and the abovementioned multilayer piezoelectric element housed in the container. The injector is configured so that a liquid filled in the container is discharged from the injection hole by the driving of the multilayer piezoelectric element.

Effects of the Invention

In accordance with the multilayer piezoelectric element of the present invention, the plurality of metal layers include a plurality of predetermined metal layers having a different metal filling rate from the oppositely disposed metal layers adjacent to each other in the stacking direction, so that the metal layers having different displacement behaviors can be disposed in the element. That is, the piezoelectric layer around the low-filled metal layer has a small displacement, and the piezoelectric layer around the high-filled metal layer has a large displacement, so that locations having different displacements can be arranged separately in the element. Thus, when the metal layers having different displacement behaviors are arranged separately in the element, the suppression of the element displacement due to stress concentration can be relaxed, thereby increasing the entire displacement of the piezoelectric element. Additionally, because the stress concentration due to the piezoelectric element displacement can be suppressed, the delamination of the stacked portions can be suppressed even in a long-term continuous driving under high voltage and high pressure. Further, the arrangement of a plurality of predetermined metal layers can suppress resonance phenomena to be generated when the displacements (dimensional changes) of the piezoelectric elements become identical. This enables prevention of beat sound generation and also prevention of harmonic signal generation, thereby suppressing the noise of control signals.

In accordance with other multilayer piezoelectric element of the present invention, the plurality of metal layers include a plurality of predetermined metal layers having a different thickness from the oppositely disposed metal layers adjacent to each other in the stacking direction, so that the metal layers having different displacement behaviors can be disposed in the element. That is, because the thin metal layer can be easily deformed to absorb the local stress of the piezoelectric body displacement, the piezoelectric layer around the thin metal layer has a small displacement, so that locations having different displacements can be arranged separately in the element. In addition, because the thick metal layer repels the local stress of the piezoelectric body displacement without any deformation of the thick metal layer, the piezoelectric layer around the thick metal layer has a large displacement, so that locations having different displacements can be arranged separately in the element. Thus, when the metal layers having different displacements are arranged separately in the element, the suppression of the element deformation due to stress concentration can be relaxed, thereby increasing the entire displacement of the piezoelectric element. Additionally, because the stress concentration due to the piezoelectric element displacement can be suppressed, the delamination of the stacked portions can be suppressed even in a long-term continuous driving under high voltage and high pressure. Further, the arrangement of a plurality of predetermined metal layers can suppress resonance phenomena to be generated when the displacements (dimensional changes) of the piezoelectric elements become identical. This enables preventions of beat sound generation and harmonic signal generation, thereby suppressing the noise of control signals.

In accordance with still other multilayer piezoelectric element of the present invention, the plurality of metal layers include a plurality of the high-ratio metal layers having a higher ratio of a component constituting an alloy than the oppositely disposed metal layers adjacent to each other, so that the metal layers having different hardnesses can be arranged partially, thereby dispersing the stress exerted on the piezoelectric element. This enables relaxation of the suppression of the element deformation due to stress concentration, thereby increasing the entire displacement of the piezoelectric element. Additionally, because the stress concentration due to the piezoelectric element deformation can be suppressed, the delamination of the stacked portions can be suppressed even in a long-term continuous driving under high voltage and high pressure. Further, the arrangement of a plurality of the high-ratio metal layers can suppress resonance phenomena to be generated when the displacements of the piezoelectric elements (dimensional changes) become identical. This enables preventions of beat sound generation and harmonic signal generation, thereby suppressing the noise of control signals.

Even if the multilayer piezoelectric element of the present invention is continuously driven, the desired displacement will not be effectively changed, enabling to provide the injector having excellent durability and high reliability.

BRIEF DESCRIPTION OF THE DRAWINGS

FIG. 1(a) is a perspective view showing a multilayer piezoelectric element according to an embodiment of the present invention; FIG. 1(b) is a partial perspective view showing a stacked state of piezoelectric layers and metal layers in FIG. 1(a);

FIG. 21(a) is a perspective view showing a conventional multilayer piezoelectric element; and FIG. 21(b) is a partial perspective view showing the stacked state of piezoelectric layers and metal layers in FIG. 21(a)

PREFERRED EMBODIMENTS FOR CARRYING OUT THE INVENTION

Multilayer Piezoelectric Element

First Preferred Embodiment

Figure 2:
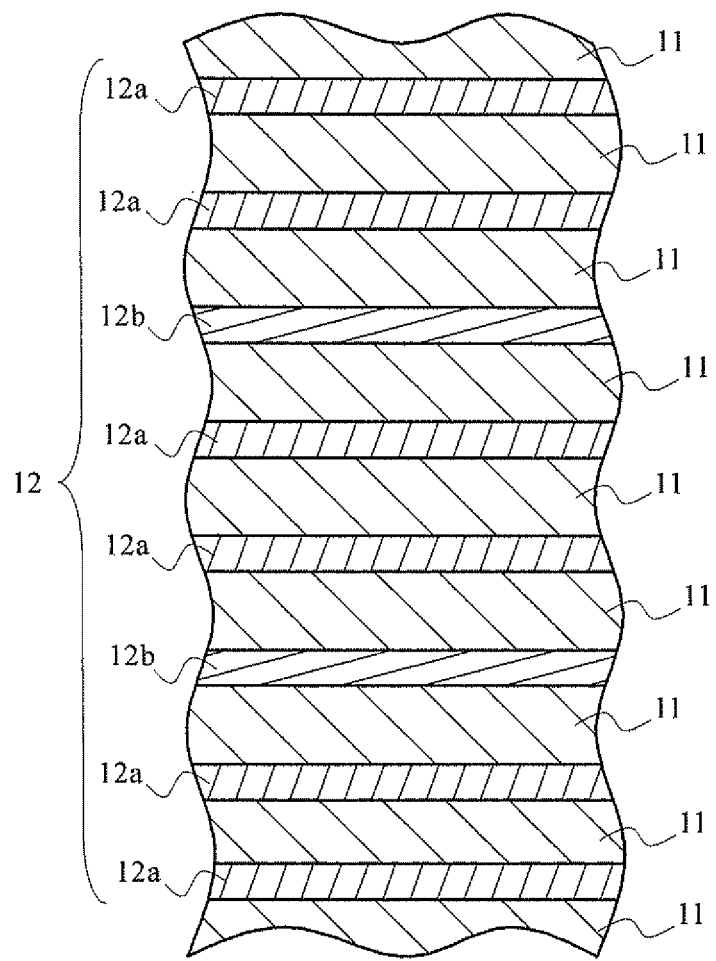
FIG. 2 is a partially enlarged cross section showing a stacked structure of the piezoelectric element according to a first preferred embodiment.
Figure 3:
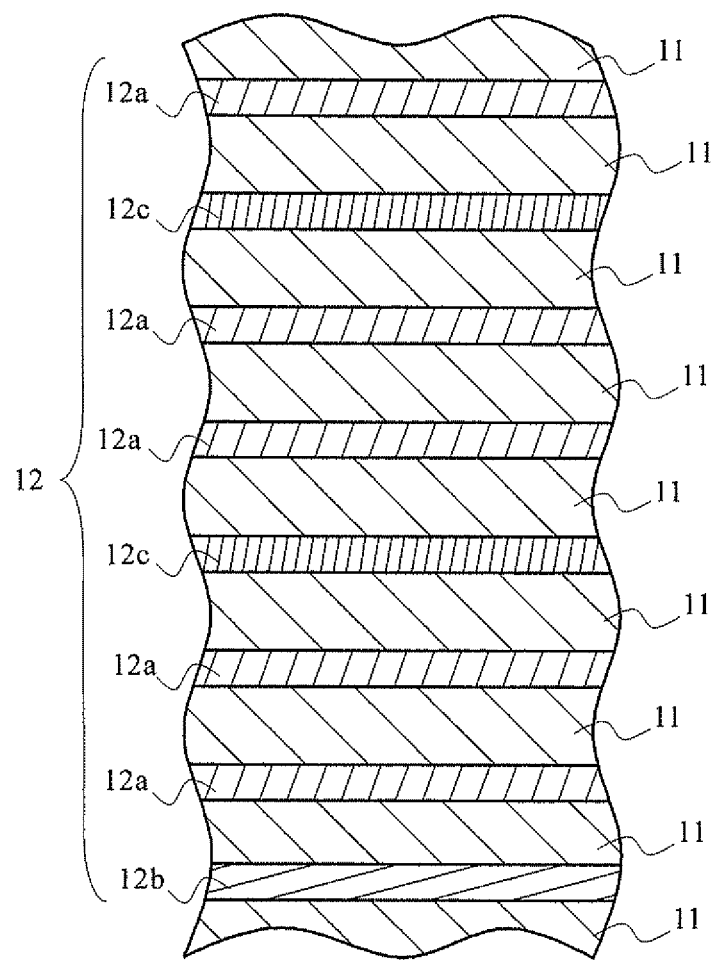
FIG. 3 is a partially enlarged cross section showing a high-filled metal layer in the first preferred embodiment.
Figure 4:
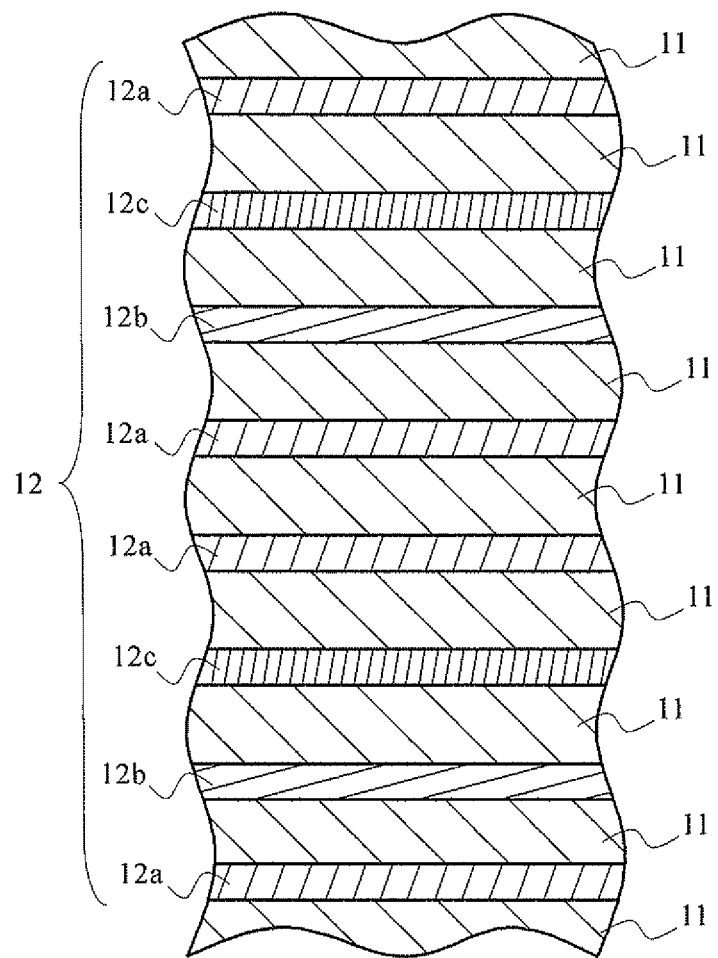
FIG. 4 is a partially enlarged cross section showing other stacked structure in the first preferred embodiment.
Figure 5:
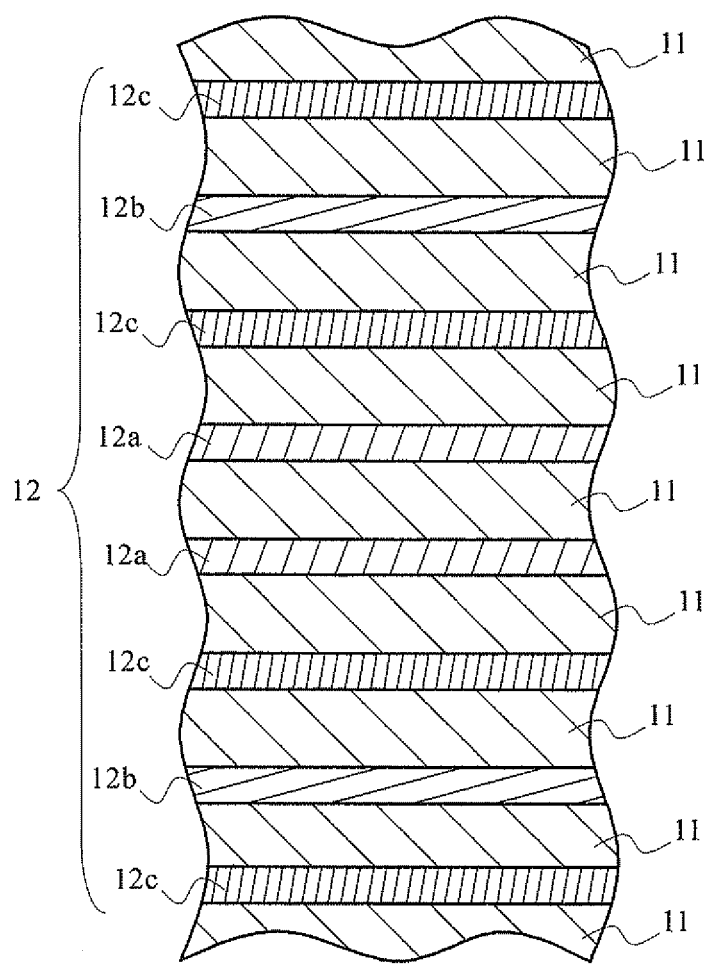
FIG. 5 is a partially enlarged cross section showing other stacked structure in the first preferred embodiment.
Figure 6:
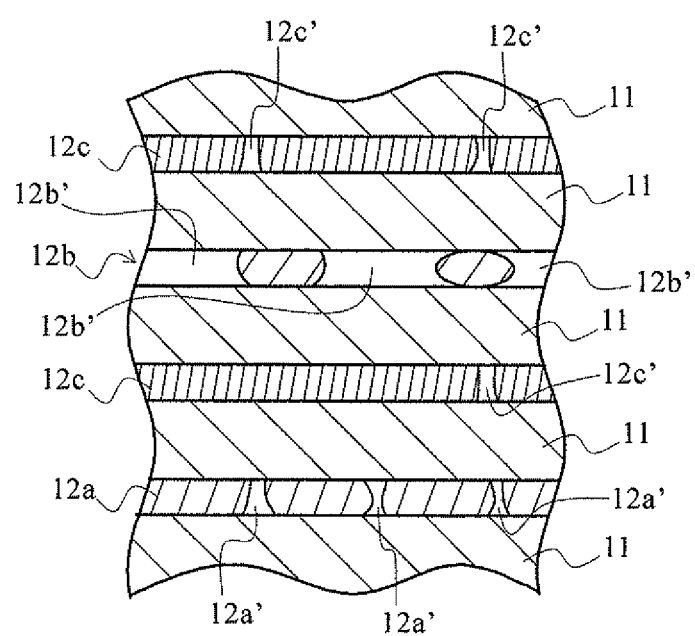
FIG. 6 is a schematic explanatory drawing for explaining voids of the piezoelectric layer in the first preferred embodiment.

A first preferred embodiment of the multilayer piezoelectric element of the present invention will be described in detail with reference to the accompanying drawings. FIG. 1(a) is a perspective view showing a multilayer piezoelectric element according to the present embodiment, and FIG. 1(b) is a partial perspective view showing a stacked state of piezoelectric layers and metal layers in FIG. 1(a). FIG. 2 is a partially enlarged cross section showing a stacked structure of the piezoelectric element according to the present embodiment. FIG. 3 is a partially enlarged cross section showing a high-filled metal layer in the present embodiment. FIG. 4 is a partially enlarged cross section showing other stacked structure in the present embodiment. FIG. 5 is a partially enlarged cross section showing other stacked structure in the present embodiment. FIG. 6 is a schematic explanatory drawing for explaining voids of the piezoelectric layer in the present embodiment.

As shown in FIG. 1, the multilayer piezoelectric element of the present embodiment has a stacked body 13 configured by alternately stacking a plurality of piezoelectric layers 11 and a plurality of metal layers 12. A pair of external electrodes 15 are disposed on the opposed side surfaces of the stacked body 13 (one of the external electrodes is not shown).

As shown in FIG. 1(b), the metal layers 12 are not formed on the entire main surfaces of the piezoelectric layers 11, and thus being a so-called partial electrode structure. A plurality of the metal layers 12 of the partial electrode structure are arranged to be exposed every other layer to the opposed side surfaces of the stacked body 13, respectively. This enables the metal layers 12 to be electrically connected by every other layer to the pair of external electrodes 15. The pair of external electrodes 15 may be formed on the adjacent side surfaces, respectively.

As shown in FIG. 1(a), inactive layers 14 formed by a piezoelectric layer are stacked on both sides in the stacking direction of the stacked body 13, respectively. When the multilayer piezoelectric element is used as a piezoelectric actuator, lead wires may be connected and secured by soldering to the pair of external electrodes 15, respectively, and the lead wires may be connected to an external voltage supply part, respectively. By applying a predetermined voltage from the external voltage supply part to between the metal layers 12 adjacent to each other through the lead wires, each of the piezoelectric layers 11 is displaced by inverse piezoelectric effect. Specifically, because the metal layers 12 are formed by a metal material such as silver-palladium alloy, etc. to be described later, the application of a predetermined voltage to each of the piezoelectric bodies 11 though the metal layers 12 produces the action causing the piezoelectric bodies 11 to be displaced by inverse piezoelectric effect.

On the other hand, the inactive layers 14 causes no displacement when the voltage is applied, because one main surface thereof is provided with the metal layer 12, and the other main surface is not provided with the metal layer 12.

As shown in FIG. 2, a plurality of the metal layers 12 according to the present embodiment include a plurality of low-filled metal layers 12b having a lower filling rate of metal composing the metal layers 12 than oppositely disposed metal layers (metal layers 12a) adjacent to each other in the stacking direction. Consequently, the piezoelectric layers around the low-filled metal layers 12b have a small displacement, and the piezoelectric layers around the metal layers 12a having a higher metal filling rate than the low-filled metal layers 12b have a large displacement. Thus, the metal layers having different displacements can be arranged separately in the element, thereby increasing the displacement of the entire piezoelectric element. Additionally, the delamination to be generated at the stacked portions can be suppressed even in a long-term continuous driving under high voltage and high pressure. Further, resonance phenomena can be suppressed, enabling suppression of beat sound generation. Furthermore, harmonic signal generation can also be suppressed, enabling suppression of the noise of control signals.

The drivingly deformed locations in the piezoelectric layers 11 correspond to the portions sandwiched between the metal layers 12. It is therefore preferable to form the low-filled metal layers 12b at the portions of the metal layers 12 which are overlapped with each other with the piezoelectric layer 11 in between. This surely suppresses resonance phenomena to be generated when the displacements (the dimensional changes) of the piezoelectric elements become identical.

Preferably, each of the low-filled metal layers 12b may be disposed interposing in between a plurality of different metal layers other than the low-filled metal layers 12b. The different metal layers of the present embodiment are the metal layers 12a as shown in FIG. 2, and high-filled metal layers 12c as described later with reference to FIG. 3. The low-filled metal layers 12b have a lower metal filling rate than the different metal layers (the metal layers 12a and the high-filled metal layers 12c). Consequently, the low-filled metal layers 12b have greater flexibility than the different metal layers, and therefore, when stress is exerted thereon during driving, the layers 12b can be deformed for relaxing the stress (stress relaxing effect). That is, the low-filled metal layers 12b function as a stress relaxing layer.

Particularly, it is preferable in the present embodiment that the plurality of the low-filled metal layers 12b be arranged regularly in the stacking direction. This is because the regular arrangement of the stress relaxing layers is effective for dispersing the stress exerted on the entire element. Preferably, the stacked body 13 is configured by stacking at least three layers of the piezoelectric layers 11, and includes a part where the low-filled metal layers 12b are repeatedly arranged in a predetermined order.

The above expression that "the plurality of the low-filled metal layers 12b are regularly arranged in the stacking direction" includes the case where the layer number of the different metal layers (the metal layers 12a or the high-filled metal layers 12c), which are present between the low-filled metal layers 12b, is identical for each area between the low-filled metal layers 12b, as well as the case where the layer number of the different metal layers 12 existing between the low-filled metal layers 12b approaches such a degree that the stress can be dispersed substantially uniformly in the stacking direction. Specifically, the layer number of the different metal layers 12 existing between the low-filled metal layers 12b is within ±20% with respect to the average value of the respective layer numbers, preferably within ±10% with respect to the average value of the respective layer numbers, and more preferably all be identical number.

The metal layers 12a as the different metal layers are those having a higher metal filling rate than the low-filled metal layer 12b. These metal layers 12a are the main metal layers. The term "the main metal layers" means metal layers composed of a plurality of metal layers having the identical metal filling rate in the metal layers 12, and also having a larger layer number than the low-filled metal layers 12b and the high-filled metal layers 12c. Preferably, the layer number of the metal layers 12a as the main metal layer is not less than one third of the total metal layer number in the order of proximity to the average metal filling rate of all of the metal layers. The reason for this is as follows. That is, the function required for the main metal layers 12a is to stably function as electrodes for driving the multilayer piezoelectric element. It is therefore required that the voltage applied to the element is uniformly supplied so as to uniformly perform piezoelectric displacement. When the main metal layers 12a constitute not less than one third of the total metal layer number in the order of proximity to the average metal filling rate of all of the metal layers, the voltage applied to the element can be supplied uniformly to each of the piezoelectric layers 11. Hence, without excessive non-uniform driving deformation of the piezoelectric layers 11, the element can be approximately uniformly drivingly deformed as a whole, resulting in the element with durability. Additionally, the piezoelectric layers 11 connected to the main metal layers 12a are free from stress concentration, permitting a large displacement. The piezoelectric layers 11 connected to the low-filled metal layers 12b become the stress relaxing layers, thereby maintaining the driving displacement of the element, and avoiding stress concentration at a point of the element. This provides a large displacement and excellent durability.

In order to equalize the phases of displacements and raise response speed, the main metal layers 12a, in the order of proximity to the average metal filling rate of all of the metal layers, constitute 70% and above, preferably 80% and above, more preferably 90% and above, and still more preferably 90 to 99% of the total metal layer number. When the main metal layers 12a constitute 90% and above of the entire metal layer number, the phases of displacements can be equalized thereby to achieve higher response speed. Above 99%, the phases are completely equalized, and undesirably the element may cause beat sound. The total layer number of the metal layers 12 may be arbitrarily determined depending on the purpose, and no special limitation is imposed thereon. However, it is usually 2 to 10000 layers, and preferably 5 to 1000 layers.

Preferably, the layer number of the main metal layers 12a is the largest in the plurality of the metal layers 12. This enables the voltage applied to the element to be uniformly supplied to the respective piezoelectric layers 11, thereby eliminating the non-uniform driving deformation of the piezoelectric layers 11. In addition, owing to the equalized phases of displacements, the elements have substantially a uniform driving deformation, resulting in the multilayer piezoelectric element having high response speed as well as durability.

Preferably, the main metal layers 12a are the metal layers except for those having the highest metal filling rate, and ones having the lowest metal filling rate in the metal layers 12. The reason for this is as follows. That is, the stress exerted on the multilayer piezoelectric element during driving tends to be applied to the piezoelectric layers 11 in the vicinity of the metal layers 12 having the highest metal filling rate. Hence, if the main metal layers 12a are metal layers other than those having the highest metal filling rate, it is possible to obtain the multilayer piezoelectric element with high durability, in which the metal layers 12a and the piezoelectric layers 11 connected to the metal layers 12a are firmly adhered to each other. Further, owing to a small displacement of the piezoelectric layers 11 connected to the metal layers 12 having a low metal filling rate, if the main metal layers 12a are metal layers other than those having the lowest metal filling rate, there is no possibility that the displacement of the multilayer piezoelectric element becomes excessively small. That is, by using, as the main metal layers 12a, the metal layers other than those having the highest metal filling rate and those having the lowest metal filling rate, the multilayer piezoelectric element having a large driving displacement and durability can be attained. Additionally, by changing the metal filling rate of the metal layers 12, the magnitude of displacements of the piezoelectric layers 11 can be controlled. This eliminates the necessity to change the thickness of the piezoelectric layers 11, and provides excellent mass production. Preferably, the main metal layers 12a (a plurality of the metal layers 12a) have substantially the same metal filling rate. This leads to a larger displacement, higher response speed and improved durability.

Preferably, a plurality of the metal layers 12 include a plurality of high-filled metal layers 12c having a higher filling rate of the metal composing the metal layers 12 than oppositely disposed metal layers adjacent to each other in the stacking direction, as shown in FIG. 3. The reason for this is as follows. That is, since the high-filled metal layers 12c having a high metal filling rate have less defected portions where no metal is filled in the metal layers, such as voids 12c', as shown in FIG. 6, the piezoelectric layers 11 connected to the metal layers 12c become locations having a large displacement when a voltage is applied to the element. Therefore, when the element is driven, these locations cause a large displacement, so that stress concentrates in the vicinity of the high-filled metal layers 12c (stress concentration effect). By separately arranging such electrode layers in the element, the stress can be dispersed without any stress concentration at a point in the element. This results in the multilayer piezoelectric element having excellent durability and high reliability.

The high-filled metal layers 12c have a high metal filling rate than the low-filled metal layers 12b and the main metal layers 12a. That is, the metal filling rates of the main metal layers 12a, the low-filled metal layers 12b and the high-filled metal layers 12c have the following relationship: the high-filled metal layers 12c>the main metal layers 12a>the low-filled metal layers 12b. Among all of the metal layers 12, the main metal layers 12a correspond to the metal layers other than the metal layers having the highest metal filling rate and those having the lowest metal filling rate. This provides the multilayer piezoelectric element having a large driving displacement and durability. This also ensures that the metal layers 12 having different displacements are arranged in the element. As a result, the piezoelectric layers 11 around the low-filled metal layers 12b causes a small displacement, and the piezoelectric layers 11 around the high-filled metal layers 12c causes a large displacement. This permits more efficient achievement of the effect resulting from the arrangement of the metal layers having different displacements in the element.

Specifically, a filling rate ratio (Y1/X1) is in the range of 0.1 to 0.9, preferably 0.3 to 0.9, and more preferably 0.5 to 0.8, where X1 is a metal filling rate in other metal layers except for the low-filled metal layers 12b and the high-filled metal layers 12c (namely, the main metal layers 12a), and Y1 is a metal filling rate in the low-filled metal layers 12b. This enables the stress relaxing effect of the low-filled metal layers 12b to be obtained more surely, and also enables the element shape to be retained (preventing an excessive drop in the mechanical strength of the element). Especially, when the above ratio (Y1/X1) is 0.3 to 0.9, the piezoelectric layers 11 adjacent to the low-filled metal layers 12b are also drivingly displaced, permitting the multilayer piezoelectric element having a large displacement of the element and having high durability. Further, when the above ratio (Y1/X1) is 0.5 to 0.8, it is possible to obtain the multilayer piezoelectric element having a larger displacement of the element and having higher durability. The specific values of X1 and Y1 may be determined arbitrarily depending on the composition of the metal layers 12, etc. Although no special limitation is imposed thereon, in general, X1 is 45 to 90%, preferably 55 to 85%, and more preferably 60 to 80%, and Y1 is 3 to 60%, preferably 20 to 60%, and more preferably 30 to 50%. It is preferable that X1 and Y1 be within the above range and satisfy the above ratio (Y1/X1).

On the other hand, when the above ratio (Y1/X1) is smaller than 0.1, the piezoelectric layers 11 and the metal layers are hard to adhere to each other, so that delamination might occur in the stacked body. Above 0.9, the stress relaxing effect of the low-filled metal layers 12b might be lowered, and there might appear a stress concentration point in the element, and the durability of the element might be lowered.

Alternatively, a filling rate ratio (Z1/X1) is in the range of 1.05 to 2, preferably 1.05 to 1.5, and more preferably 1.1 to 1.2, where X1 is a metal filling rate in different metal layers other than the low-filled metal layers 12b and the high-filled metal layers 12c (namely, the main metal layers 12a), and Z1 is a metal filling rate in the high-filled metal layers 12c. This produces the stress relaxing effect of the high-filled metal layers 12c, and also retains the element shape. Especially, when the above ratio (Z1/X1) is 1.05 to 1.5, the piezoelectric layers 11 adjacent to the high-filled metal layers 12c, and the piezoelectric layers 11 adjacent to the main metal layers 12a are also drivingly displaced almost similarly, thereby obtaining the multilayer piezoelectric element having high durability. Alternatively, when the above ratio (Z1/X1) is 1.1 to 1.2, the multilayer piezoelectric element can have a larger displacement and high durability. Like X1 and Y1 in the above-mentioned ratio (Y1/X1), the specific values of X1 and Z1 may be determined arbitrarily depending on the composition of the metal layers 12, etc. Although no special limitation is imposed thereon, in general, X1 is 45 to 90%, preferably 55 to 85%, and more preferably 60 to 80%, and Z1 is 60 to 100%, preferably 70 to 100%, and more preferably 72 to 95%.

On the other hand, when the above ratio (Z1/X1) is larger than 2, stress may concentrate on the high-filled metal layers 12c, and the interface between the high-filled metal layer 12c and the piezoelectric layer 11 may flake off, so that delamination might occur in the stacked body. Below 1.05, the stress concentration effect of the high-filled metal layers 12c might be lowered, and there might appear a stress concentration point in the element, so that the durability of the element might be lowered.

The filling rate of metal composing the metal layers 12 is a measured value of a surface obtained by cutting the multilayer piezoelectric element in the stacking direction. Specifically, when the metal layers 12 on the cut surface is observed with a scanning electron microscope (SEM) and a metal microscope, it can be seen that the metal layers 12 are composed not only metal components but also elements other than metal, such as voids and ceramic composition, etc. Therefore, in the cross section of an arbitrary metal layer, the area of portions consisting only of metal is measured. A metal filling rate is obtained by dividing the total area of the portions consisting only of the metal by the total area of this metal layer. By making similar measurements of the metal filling rates of the metal layers 12a, the low-filled metal layers 12b and the high-filled metal layers 12c, the individual layers can be discriminated.

It is preferable that the high-filled metal layer 12c having a higher metal filling rate than the main metal layer 12a, and the low-filled metal layer 12b having a lower metal filling rate than the main metal layer 12a be oppositely disposed with the piezoelectric layer 11 in between, as shown in FIG. 4. Thus, the stress exerted on the element during driving can be concentrated on the plurality of the high-filled metal layers 12c having a high metal filling rate, respectively, thereby dispersing the stress exerted on the element. Further, the low-filled metal layers 12b having a low metal filling rate, serving as the stress relaxing layer, are disposed adjacent to the high-filled metal layers 12c, enabling the stress exerted on the element to be dispersedly relaxed more efficiently.

Especially, the oppositely disposed metal layers adjacent to each other in the stacking direction with respect to the low-filled metal layer 12b are preferably the high-filled metal layers 12c, as shown in FIG. 5. Thus, the stress exerted on the element during driving can be concentrated on the plurality of the high-filled metal layers 12c having a high metal filling rate, respectively, enabling the stress exerted on the element to be dispersedly relaxed. Further, the low-filled metal layers 12b having a low metal filling rate, serving as the stress relaxing layer, are disposed adjacent to the both sides of the high-filled metal layer 12c, thereby more surely dispersedly relaxing the stress exerted on the element. When the low-filled metal layers 12b as the stress relaxing layer are sandwiched by the high-filled metal layers 12c as the stress collecting layers, the stress can be confined within the low-filled metal layers 12b, enabling the stress of the entire element to be dispersedly relaxed. As a result, when the element is applied to a piezoelectric actuator, it is possible to provide the piezoelectric actuator having excellent durability and high reliability. The layer number of the low-filled metal layers 12b to be sandwiched is preferably one because a smaller layer number produces more stress confining effect.

Alternatively, it is preferable that the low-filled metal layers 12b, the high-filled metal layers 12c and the main metal layer 12a be arranged in the order named and in the stacking direction of the stacked body 13, with the piezoelectric layer in between, and the main metal layers 12a be stacked in descending order of the metal filling rate. Thus, the stress in the element during driving can be concentrated on the high-filled metal layers 12c, enabling the stress exerted on the element to be dispersed. Further, the low-filled metal layers 12b serving as the stress relaxing layers are disposed adjacent to the metal layers which collect stress, enabling the stress exerted on the element to be dispersedly relaxed. The main metal layers 12a are also arranged in descending order of the metal filling rate, enabling the stress collected on the high-filed metal layers 12c to be dispersed gradually. In addition, by increasing the metal filling rate, the displacement of the adjacent piezoelectric layers 11 can be increased, thereby achieving the multilayer piezoelectric element having a large displacement, excellent durability and high reliability.

Preferably, the high-filled metal layers 12c have a peak metal filling rate, and there is a tilted region where the metal filling rate is gradually lowered from the high-filled metal layers 12c, throughout over two layers, preferably 2 to 5 layers and more in the stacking direction. Thus, the stress in the element during driving concentrates on the high-filled metal layers 12c. However, the presence of a predetermined tilted region enables the stress collected at the high-filled metal layers 12c to be dispersed gradually.

Preferably, the metal layers 12 have predetermined voids 12a', 12b' and 12c', as shown in FIG. 6. The reason for this is as follows. That is, if any insulating material other than the metal composition is contained in the metal layers 12, when the element is driven, the portions to which no voltage can be applied may appear in the piezoelectric layers 11. Therefore, piezoelectric displacement cannot be increased, and the stress during driving concentrates at these metal layers 12, which might become the starting points of breakdown. If the metal layers 12 have the predetermined voids, when stress is exerted on the metal portions, the presence of the areas of voids facilitates the metal deformation, enabling the stress to be effectively dispersedly relaxed. When the piezoelectric layers 11 connected to the metal layers 12 cause piezoelectric displacement, the piezoelectric layers 11 can be partially cramped by the presence of the void portions. Therefore, the force constraining the piezoelectric layers 11 can be decreased than the case of cramping by the entire surface, so that they are easy to displace, thereby increasing their displacements. This provides the multilayer piezoelectric element having a larger displacement of the element and having high durability.

Particularly, the main metal layers 12a is provided with voids 12a', and the area ratio (the void ratio) of the voids 12a' to the entire cross-sectional area in the cross section of the metal layers 12a is 5 to 70%, preferably 7 to 70%, and more preferably 10 to 60%. This permits a large displacement, thereby obtaining the multilayer piezoelectric element having excellent displacement. Especially, when the void ratio is 7 to 70%, or 10 to 60%, the piezoelectric layers 11 can be more smoothly deformed, and the displacement of the multilayer piezoelectric element can be increased by the sufficient electric conductivity of the metal layers 12.

On the other hand, if the void ratio is smaller than 5%, the piezoelectric layers 11 is constrained by the metal layers 12 when the piezoelectric layers 11 are deformed by the applied voltage, thereby suppressing the deformation of the piezoelectric layers 11. This reduces the amount of deformation of the multilayer piezoelectric element, and increases the internal stress to be generated, so that durability might be affected. On the other hand, when the void ratio is larger than 70%, extremely narrow portions may occur at the electrode portions. Undesirably, the strength of the metal layers 12 themselves may be lowered, and cracks are liable to occur in the metal layers 12, so that disconnection might occur.

The void ratio to the area of the metal layers 12 is a measured value of a cross section obtained by cutting the multilayer piezoelectric element by a plane parallel to the stacking direction, or a plane perpendicular to the stacking direction. Specifically, the measured value is obtained by measuring the areas of voids existing in the metal layers 12 in the cut surface, and dividing the total of the void areas by the area of the metal layers 12, and then multiplying the result by 100.

More specific methods of measuring a void ratio are as follows. That is, the void ratio measuring method can be roughly classified into the following two methods. A first method is the observation of the cross section when the stacked body 13 is cut by a plane parallel to the stacking direction. A second method is the observation of the cross section when the stacked body 13 is cut by a plane perpendicular to the stacking direction.

The void ratio measurement by the first method may be carried out as follows. Firstly, by known polishing means, the stacked body 13 is polished so that the cross section parallel to the stacking direction is exposed. For example, the stacked body 13 can be polished with diamond paste by using, as a polisher, a bench polisher KEMET-V-300, manufactured by Kemet Japan Co., Ltd. The cross section exposed by this polishing process is observed by, for example, a scanning electron microscope (SEM), an optical microscope, a metal microscope, etc, thereby obtaining a cross section image. The void ratio of the metal layers can be determined by performing image processing of the cross section image. As a specific example, on the image of the metal layers taken by the optical microscope, void portions are colored in black, and the portions other than the voids are colored in white. Then, the ratio of the black portions, namely, (the area of the black portions)/(the area of the black portions plus the area of the white portions), is found, and the void ration can be calculated by expressing the result as a percentage. For example, when the cross section image is a color image, it may be converted to gray scales and divided into black portions and white portions. At this time, if required to set the threshold value of a boundary for converting into black portions and white portions, binarization may be carried out, setting the threshold value of the boundary by image processing software and visual observation.

The void ratio measurement by the second method may be carried out as follows. Firstly, using a known polisher, the stacked body 13 is polished until a cross section of the metal layer whose void ratio measurement is desired (a cross section perpendicular to the stacking direction) is, exposed. For example, the stacked body 13 can be polished with diamond paste by using, as a polisher, the bench polisher KEMET-V-300, manufactured by Kemet Japan Co., Ltd. The cross section exposed by this polishing process is observed by, for example, a scanning electron microscope (SEM), an optical microscope, a metal microscope, etc, thereby obtaining a cross section image. The void ratio of the metal layers can be determined by performing image processing of the cross section image. As a specific example, on the image of the metal layers taken by the optical microscope, void portions are colored in black, and the portions other than the voids are colored in white. Then, the ratio of the black portions, namely, (the area of the black portions)/(the area of the black portions plus the area of the white portions), is found, and the void ration can be calculated by expressing the result as a percentage. For example, when the cross section image is a color image, it may be converted to gray scales and divided into black portions and white portions. At this time, if required to set the threshold value of a boundary for converting into black portions and white portions, binarization may be carried out, setting the threshold value of the boundary by image processing software and visual observation. When observing the cross sections of the metal layers, it is preferable to perform the polishing so as to reduce their thicknesses to substantially a half, and observe the cross section so exposed. However, if the metal layer has a small thickness and relatively large thickness variations, the entire cross section of the metal layer may not be exposed by polishing process. In such a case, at the point that the polishing process is performed until part of the metal layer is exposed, the exposed portion is observed to obtain a cross section image. Thereafter, the polishing is advanced, and the portions except for the observed portions may be observed. This operation may be repeated a plurality of times. Thus, the observed images obtained by a plurality of the above operation may be combined together so as to attain the entire cross section of the metal layer.

The metal layers 12 having the abovementioned voids are composed mainly of metal and voids. In the metal layers 12 so composed, both of the metal and the voids are deformable against stress, resulting in the multilayer piezoelectric element with higher durability.

Especially, when the low-filled metal layers 12*b* are composed mainly of metal and voids, the multilayer piezoelectric element can have still higher durability. That is, as shown in FIG. 6, the low-filled metal layer 12*b* is preferably composed of a plurality of metal parts spaced apart with voids 12*b*' in between. Thus, when the piezoelectric layers 11 connected to the low-filled metal layer 12*b* are connected to the portions not filled with metal, such as the voids 12*b*', in the metal layers, the piezoelectric body located at that portions causes no displacement even if a voltage is applied to the element, and causes deformation when stress is exerted during driving, thereby relaxing the stress (stress relaxing effect). That is, the low-filled metal layer 12*b* composed of the metal parts functions as a stress relaxing layer. Accordingly, the piezoelectric layers 11 connected to these metal layers have a small driving displacement, thereby avoiding that the stress exerted on the element concentrates at a point. This results in the multilayer piezoelectric element having excellent durability and high reliability.

Specifically, the area ratio (the void ratio) of the voids 12*b*' to the entire cross-section area in the cross section of the low-filled metal layer 12*b* is preferably 20 to 90%. This further increases displacement, achieving the multilayer piezoelectric element having excellent displacement.

Preferably, the metal layers 12 are composed mainly of metal selected from elements in groups 8 to 11 of the periodic table. This is because the above metal composition having high heat resistance enables simultaneous sintering of the piezoelectric layers 11 having a high sintering temperature and the metal layers 12. Hence, the external electrodes 15 can be manufactured at a sintering temperature lower than the sintering temperature of the piezoelectric layers 11, thereby suppressing severe mutual diffusion between the piezoelectric layers 11 and the external electrodes 15.

It is further preferable to compose mainly of metal satisfying the following relationship of: $0 < M1 \le 15$, $85 \le M2 < 100$, $M1+M2=100$, where M1 (% by mass) is a content of an element in the groups 8 to 10 of the periodic table in the metal layers 12, and M2 (% by mass) is a content of an element in the group 11 of the periodic table. The reason for this is as follows. When the M1 as the content of an element in the groups 8 to 10 of the periodic table exceeds 15% by mass, specific resistance is increased, and when the multilayer piezoelectric element is continuously driven, the metal layers 12 generate heat. The heat generation acts on the piezoelectric layers 11 having temperature dependency thereby to reduce the displacement characteristic thereof, and in some cases, the element displacement may become small. Further, when the external electrodes 15 are formed, the external electrodes 15 and the metal layers 12 are mutually diffused and connected to each other. However, if the M1 exceeds 15% by mass, this increases the hardness of locations where the metal layer composition is diffused into the external electrodes 15. Therefore, durability might be lowered in the multilayer piezoelectric element causing dimensional changes during driving.

Particularly, for the purpose of suppressing ion migration of the element of the group 11 in the metal layers 12 into the piezoelectric layers 11, the M1 is preferably not less than 0.001% by mass nor more than 15% by mass. For the purpose of improving the durability of the multilayer piezoelectric element, the M1 is preferably not less than 0.1% by mass nor more than 10% by mass. When excellent thermal conduction and higher durability are required, the M1 is preferably not less than 0.5% by mass nor more than 9.5% by mass. When still higher durability is required, the M1 is preferably not less than 2% by mass nor more than 8% by mass.

On the other hand, when the M2 as the content of an element in the group 11 is less than 85% by mass, the specific resistance of the metal layers 12 is increased, and when the multilayer piezoelectric element is continuously driven, undesirably the metal layers 12 might generate heat. Particularly, for the purpose of suppressing the ion migration of the element of the group 11 in the metal layers 12 into the piezoelectric layers 11, the M2 is preferably not less than 85% by mass nor more than 99.999% by mass. For the purpose of improving the durability of the multilayer piezoelectric element, the M2 is preferably not less than 90% by mass nor more than 99.9% by mass. When higher durability is required, the M2 is preferably not less than 90.5% by mass nor more than 99.5% by mass. When still higher durability is required, the M2 is preferably not less than 92% by mass nor more than 98% by mass.

Particularly when the low-filled metal layers 12b relax stress, relaxing the applied stress means to release the stress by converting the applied kinetic energy to thermal energy, and the stress releasing portion retains heat. As the temperature of the piezoelectric body is raised, the force of piezoelectric displacement is reduced. Once the temperature is raised to Curie point, polarization effect will be vanished even if cooled, and the force of piezoelectric displacement is greatly impaired. Consequently, if the low-filled metal layers 12b can play the role of a heat sink, it will become possible to dissipate the heat from the stress relaxing portions to the outside of the element.

Here, the use of metal having the composition of the present embodiment increases heat dissipation effect, enabling the stress relaxing effect to be retained with high durability for a long period of time. Particularly, the composition containing a high concentration of silver having high thermal conduction can produce the highest thermal dissipation effect. Further, even if oxidized, the thermal conductivity will not be deteriorated, and electric conductivity will not also be deteriorated, resulting in the stress relaxing layer with extremely high durability.

The M1 as the element in the groups 8 to 10, and the M2 as an element in the group 11, which express the % by mass of the metal composition in the metal layers 12, can be specified by analysis method such as EPMA (Electron Probe Micro Analysis) method or the like, respectively.

In the metal composition in the metal layers 12, the element in the groups 8 to 10 is preferably at least one selected from Ni, Pt, Pd, Rh, Ir, Ru and Os, and the element in the group 11 is preferably at least one selected from Cu, Ag and Au. These illustrated metals are metal compositions having excellent mass production in the recent alloy powder synthesizing techniques.

Among the above illustrated metal compositions in the metal layers 12, it is preferable that the metal of an element in the groups 8 to 10 is at least one selected from Pt and Pd, and the metal of an element in the group 11 is at least one selected from Ag and Au. This makes it possible to form the metal layers 12 having excellent heat resistance and small specific resistance.

Especially, in the metal composition in the metal layers 12, the metal of an element in the groups 8 to 10 is preferably Ni. This makes it possible to form the metal layers 12 having excellent heat resistance. The metal of an element in the group 11 is preferably Cu. This makes it possible to form the metal layers 12 having low hardness and excellent heat conductivity.

Particularly, Cu has high thermal conductivity, as well as the characteristic feature that when stress is exerted from a certain direction, crystal orientation is oriented in the certain direction in which the stress is applied, thereby producing strong stress relaxing effect, by which no breakage may occur. Further, when the element is manufactured by simultaneous sintering, a coating layer of CuO having strong corrosion resistance can be formed on the Cu surface, resulting in the element having high durability (with normal Cu metal, a $Cu_2O$ coating is gradually formed on the surface and then bound with the moisture in the air, which forms patina, leading to corrosion).

Alternatively, the metal layers 12 are preferably alloys composed mainly of the above metal. As an example of the alloys, a completely solid-dissolved alloy, such as a silver-palladium alloy (70 to 99.999 by mass of silver and 0.001 to 30% by mass of palladium), is suitable because the sintering temperature can be controlled at an arbitrary composition ratio. It is also preferable to add oxide, nitride or carbide together with the above metal composition into the metal layers 12. This increases the strength of the metal layers 12, and improves the durability of the multilayer piezoelectric element. Particularly, oxide is preferred because the mutual diffusion between the oxide and the piezoelectric layers 11 can increase the adhesion strength between the metal layers 12 and the piezoelectric layers 11.

The oxide is preferably composed mainly of peroviskite-type oxide consisting of $PbZrO_3$—$PbTiO_3$, because of its high adhesion strength with the piezoelectric layers 11. The content of the added oxide and the like can be calculated from the area ratio of the composition in the metal layers on a cross section SEM image of the multilayer piezoelectric element.

Preferably, the abovementioned inorganic composition (namely, oxide, nitride or carbide to be added together with the metal composition) is not more than 50 volume % to the metal. This can reduce the connection strength between the metal layers 12 and the piezoelectric layers 11 than the strength of the piezoelectric layers 11. More preferably, it is 30 volume %, thereby improving the durability of the multilayer piezoelectric element.

The respective thicknesses of the metal layer 12a, the low-filled metal layer 12b and the high-filled metal layer 12c, each constituting the metal layers 12, may be determined arbitrarily depending on the composition of the metal layers 12, etc, and no special limitation is imposed thereon. In general, the thickness of the metal layer 12a is 0.1 to 100 µm, preferably 0.5 to 10 µm, and more preferably about 1 to 5 µm. The thickness of the low-filled metal layer 12b is 0.05 to 100 µm, preferably about 0.1 to 10 µm, and more preferably about 0.5 to 5 µm. The thickness of the high-filled metal layer 12c is 0.1 to 200 µm, preferably about 0.5 to 15 µm, and more preferably about 1 to 10 µm.

Preferably, the piezoelectric layers 11 are composed mainly of peroviskite-type oxide. The reason for this is as follows. When the piezoelectric layers 11 are formed by peroviskite-type piezoelectric ceramics material represented by, for example, barium titanate ($BaTiO_3$) or the like, owing to a high piezoelectric distortion constant $d_{33}$ indicating its piezoelectric characteristic, it is possible to increase displacement and sinter the piezoelectric layers 11 and the metal layers 12 at the same time. The abovementioned piezoelectric layers 11 are preferably composed mainly of peroviskite-type oxide consisting of $PbZrO_3$—$PbTiO_3$ having a relatively high piezoelectric distortion constant $d_{33}$.

Preferably, the metal layers 12 are exposed to the side surfaces of the stacked body 13. The reason for this is as follows. The locations where the metal layers 12 are not exposed to the element side surfaces cannot be displaced during driving, and therefore the region causing displacements during driving will be confined in the inside of the element. As a result, the stress at the time of displacement is liable to concentrate on the abovementioned interface. Undesirably, this may cause the problem of durability.

The stacked body 13 is preferably a polygon cylindrical body. The reason for this is as follows. That is, if the stacked body 13 has a cylindrical shape, the central axis may dislocate unless it is completely rounded. It is therefore necessary to prepare high precision circles and stack them one upon another, making it difficult to use a mass production type manufacturing method using simultaneous sintering. Alternatively, if the outer periphery is polished to a cylindrical shape after stacking substantially circular stacked bodies or after sintering, it becomes difficult to align the central axes of the metal layers 12 with high precision. On the contrary, if the stacked body 13 is the polygon cylindrical body, the metal layers 12 can be formed on the piezoelectric layers 11 whose reference line is determined. Additionally, these can be stacked one upon another along the reference line, enabling the central axis as the driving axis to be formed with a mass production type manufacturing method. This achieves the element having high durability.

As described above, the metal layer 12 whose end is exposed, and the metal layer 12 whose end is not exposed to the side surfaces of the multilayer piezoelectric element of the present embodiment are disposed alternately. It is preferable that a groove is formed in the piezoelectric layer 11 between the metal layer 12 whose end is not exposed, and the external electrode 15, and that an insulator having a lower Young's modulus than the piezoelectric layer 11 is formed in the groove. Thus, the stress generated by the displacement during driving can be relaxed, thereby suppressing the heat generation of the metal layers 12 even if the multilayer piezoelectric element is continuously driven.

Second Preferred Embodiment

Figure 7:
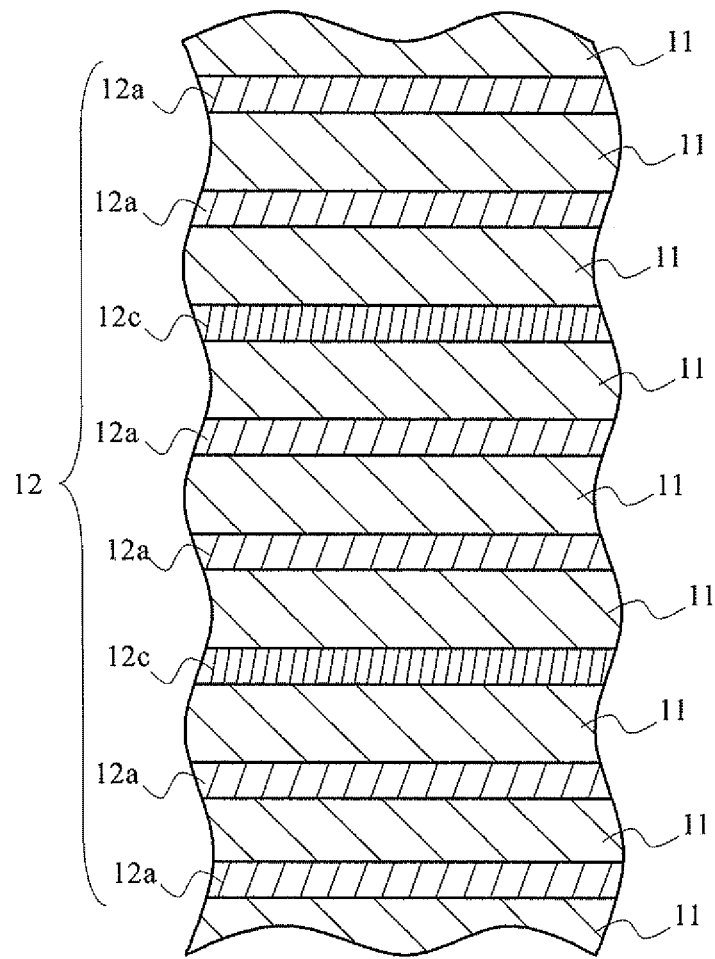
FIG. 7 is a partially enlarged cross section showing the stacked structure of a multilayer piezoelectric element according to a second preferred embodiment.

A second preferred embodiment related to a multilayer piezoelectric element of the present invention will next be described with reference to the drawing. FIG. 7 is a partially enlarged cross section showing the stacked structure of a multilayer piezoelectric element according to the present embodiment. In FIG. 7, similar or equivalent parts to the configurations of FIGS. 1 to 6 as described above have similar reference numbers, and the description thereof is omitted. As shown in FIG. 7, like the above-mentioned first preferred embodiment, the multilayer piezoelectric element of the second preferred embodiment is the multilayer piezoelectric element in which a plurality of piezoelectric layers 11 and a plurality of metal layers 12 are stacked alternately.

A plurality of the metal layers 12 include a plurality of high-filled metal layers 12c having a higher filling rate of metal composing the metal layers 12 than oppositely disposed metal layers (metal layers 12a) adjacent to each other in the stacking direction. This configuration also produces the same effect as the abovementioned first preferred embodiment, because the piezoelectric layers 11 around the high-filled metal layers 12c have a large displacement, and the piezoelectric layers 11 around the main metal layers 12a, having a smaller metal filling rate than the high-filled metal layers 12c, have a small displacement. This results in the configuration where the metal layers having different displacements are arranged in the element.

Like the first preferred embodiment as described above, a plurality of the high-filled metal layers 12c of the present embodiment are preferably disposed interposing in between a plurality of different metal layers other than the high-filled metal layers 12c (namely, the main metal layers 12a and the low-filled metal layers 12b). Preferably, these high-filled metal layers 12c are regularly arranged in the stacking direction. Preferably, a plurality of the metal layers 12 include a plurality of low-filled metal layers 12b having a lower filling rate of metal composing the metal layers 12 than oppositely disposed metal layers adjacent to each other in the stacking direction.

The configuration is otherwise similar to that described in the first preferred embodiment, and therefore the description thereof is omitted.

Third Preferred Embodiment

A third preferred embodiment related to a multilayer piezoelectric element of the present invention will next be described. The multilayer piezoelectric element of the present embodiment is one in which a plurality of piezoelectric layers 11 and a plurality of metal layers 12 are stacked alternately. Inactive layers 14 composed of a piezoelectric body are formed at both sides in the stacking direction, respectively. Metal layers 12 adjacent to the inactive layers 14 are low-filled metal layers (low-filled metal layers 12b) having a lower filling rate of the metal in the metal layers 12 than the metal layers 12 adjacent to each other in the stacking direction. This avoids that the stress exerted on the element concentrates at a point. The reason for this seems to be as follows.

That is, the inactive layers not sandwiched with electrodes will not be drivingly deformed even if a voltage is applied. Therefore, a drivingly deformed portion and a non-drivingly deformed portion are bounded by the metal layer 12 adjacent to the inactive layer 14. The stress therefore may concentrate at this boundary portion. At this time, if all of the metal layers 12 have the same metal filling rate, the stress is liable to concentrate at a point in the above boundary portion. Hence, delamination might occur when the multilayer piezoelectric element is continuously driven under high voltage and high pressure for a long period of time.

When the metal filling rate of the metal layers 12 (the low-filled metal layers 12*b*) adjacent to the inactive layers 14 is lower than the metal filling rate of the metal layers 12 adjacent to each other in the stacking direction, the low-filled metal layers 12*b* have greater flexibility than other metal layers. Thus, when the element is driven and the piezoelectric layers 11 are deformed, the low-filled metal layers 12*b* themselves can be deformed thereby to relax the stress (stress relaxing effect). Further, because the inactive layers 14 connected to the low-filled metal layers 12*b* are formed by a piezoelectric material, the inactive layers 14 are deformable under stress application, thereby relaxing the stress. That is, the low-filled metal layers 12*b* and the inactive layers 14 produce synergism of the stress relaxing effect. Additionally, since the low-filled metal layers 12*b* will deform themselves, the piezoelectric layer 11 sandwiched between the low-filled metal layer 12*b* and the metal layer 12 adjacent thereto is subjected to both of the driving deformation due to voltage application, and the deformation due to stress application. Since the low-filled metal layers 12*b* will deform themselves for relaxing stress, the deformation due to stress application is dominant and hence the piezoelectric layer 11 will deform for relaxing the stress. Consequently, the driving displacement becomes small, thereby avoiding that the stress exerted on the element concentrates at a point.

Preferably, the metal layer adjacent to the low-filled metal layer 12*b* in the stacking direction is the high-filled metal layer 12*c*. This enables that the stress during the time the element is driven can be concentrated on the high-filled metal layer 12*c*, and the stress exerted on the element can be dispersed into the ends. Further, by arranging the low-filled metal layer 12*b* serving as a stress relaxing layer so as to be adjacent to the metal layer that collects stress, the stress exerted on the element can be dispersedly relaxed into the ends. When the high-filled metal layer 12*c* as a stress collecting layer, and the inactive layer 14 sandwich in between the low-filled metal layer 12*b* as a stress relaxing layer, stress can be confined within the low-filled metal layer 12*b*, further improving the effect of dispersedly relaxing the stress exerted on the entire element. As a result, when the element is applied to a piezoelectric actuator, it is possible to provide the piezoelectric actuator having excellent durability and high reliability.

Conventionally, especially when forming a multilayer piezoelectric element having a stacking number of less than 50, for example, the metal content of the piezoelectric layer 11 in the vicinity of the inactive layer 14 is increased as it approaches the inactive layer 14, in order that displacement can be suppressed to suppress the stress from concentrating at the boundary portion. For this, in order to form the piezoelectric layers 11, piezoelectric sheets having several kinds of metal contents have to be prepared and stacked one upon another, resulting in a high cost product. On the other hand, in the present invention, the multilayer piezoelectric element having high durability can be manufactured at a low lost, only by changing the metal layers 12 adjacent to the inactive layers 14 into the low-filled metal layer 12*b* having a lower metal filling rate than the metal layers 12 adjacent to each other in the stacking direction. Further, a multilayer piezoelectric element having high durability can be manufactured at a lower cost by changing the metal layers 12 adjacent to the inactive layers 14 at both sides, into the low-filled metal layer 12*b* having a lower metal filling rate than the metal layers 12 adjacent to each other in the stacking direction.

On the other hand, in a multilayer piezoelectric element having a large stacking number, by including a plurality of low-filled metal layers 12*b* having a lower metal filling rate than oppositely disposed metal layers (the metal layers 12*a*) adjacent to each other in the stacking direction, the piezoelectric layers around the low-filled metal layer 12*b* can reduce their displacement because the low-filled metal layers are easily deformed to absorb the local stress of piezoelectric displacement. This enables the metal layers having different displacements to be separately arranged in the element. Thus, even if the element is continuously driven under high voltage and high pressure for a long period of time, the suppression of the element deformation due to stress concentration can be relaxed, suppressing delamination to be generated at the stacking portions. In addition, because resonance phenomena can be suppressed, beat sound generation can be prevented. Furthermore, harmonic signal generation can be prevented, suppressing the noise of control signal. The configuration is otherwise similar to those described in the first and second preferred embodiments, and therefore the description thereof is omitted.

Fourth Preferred Embodiment

A fourth preferred embodiment related to a multilayer piezoelectric element of the present invention will be described below. The multilayer piezoelectric element of the present embodiment is one in which a plurality of piezoelectric layers 11 and a plurality of metal layers 12 are stacked alternately, and inactive layers 14 composed of a piezoelectric body are formed on both sides in the stacking direction, respectively, and the metal layers 12 adjacent to the inactive layers 14 are metal layers (high-filled metal layers 12*c*) having a higher metal filling rate than the metal layers 12 adjacent to each other in the stacking direction. This realizes a multilayer piezoelectric element having excellent durability and high reliability. The reason for this seems to be as follows.

That is, since the inactive layers not sandwiched with electrodes will not be drivingly deformed even if a voltage is applied, a drivingly deformed portion and a non-drivingly deformed portion are bounded by the metal layers 12 adjacent to the inactive layers 14. The stress therefore concentrates at the boundary portion. At this time, if all of the metal layers 12 have the same metal filling rate, the stress is liable to concentrate at a point in the above boundary portion. Therefore, delamination might occur when the multilayer piezoelectric element is continuously driven under high voltage and high pressure for a long period of time.

In a state where the metal filling rate in the metal layers 12 adjacent to the inactive layers 14 becomes higher than the metal filling rate in the metal layers 12 adjacent to each other in the stacking direction, when the element is driven and the piezoelectric layers 11 are deformed, the high-filled metal layers 12*c* repel any local stress of piezoelectric displacement without their deformation, because they exhibit strong force constraining not only the inactive layers 14 connected to the high-filled metal layers 12*c*, but also the piezoelectric layers 11 connected to the high-filled metal layers 12*c*. Therefore, the piezoelectric layers 11 connected to the high-filled metal layers 12*c* cause a larger displacement. This permits an increase in the piezoelectric displacement of the element.

Further, when the element is driven, the high-filled metal layers 12*c* are not deformed themselves for the above reason, and therefore the stress exerted on the entire element concentrates in the vicinity of the high-filled metal layers 12c (stress concentration effect). Thus, by arranging these high-filled metal layers 12c at the ends of the driving portion of the element, the stress can be dispersed into the ends of the element, without any stress concentration into the driving portion of the element, permitting the multilayer piezoelectric element having excellent durability and high reliability.

Conventionally, especially when forming a multilayer piezoelectric element having a stacking number of less than 50, for example, the metal content of the piezoelectric layer 11 in the vicinity of the inactive layer 14 is increased as it approaches the inactive layer 14, in order that displacement can be suppressed to suppress the stress from concentrating at the boundary portion. For this, in order to form the piezoelectric layers 11, piezoelectric sheets having several kinds of metal contents have to be prepared and stacked one upon another, resulting in a high cost product. On the other hand, in the present invention, the multilayer piezoelectric element having high driving force and high durability can be manufactured at a low lost, only by changing the metal layers 12 into the metal layers (the high-filled metal layers 12c) having a higher metal filling rate than the metal layers 12 adjacent to each other in the stacking direction. Further, a multilayer piezoelectric element having high durability can be manufactured at a lower cost by changing the metal layers 12 adjacent to the inactive layers 14 at both sides into the low-filled metal layers (the low-filled metal layers 12b) having a lower metal filling rate than the metal layers 12 adjacent to each other in the stacking direction. The configuration is otherwise similar to those described in the first to third preferred embodiments, and therefore the description thereof is omitted.

A description will next be made of a method of manufacturing the multilayer piezoelectric elements according to the first to fourth preferred embodiments as described above.

Firstly, slurry is prepared by mixing the calcinated powder of peroviskite-type oxide composed of $PbZrO_3$—$PbTiO_3$ or the like, binder composed of organic high polymer of acrylic, butyral or the like, and plasticizer such as DBP (dibutyl phthalate), DOP (dioctyl phthalate) or the like. The slurry is then subjected to a known tape forming method such as doctor blade method, calendar roll, thereby obtaining a plurality of ceramic green sheets serving as the piezoelectric layers 11.

Subsequently, a conductive paste is prepared by containing an organic matter such as acryl beads, which are bindingly fixed during drying, and volatized during sintering, in metal powder composing the metal layers 12, such as silver-palladium alloy, and by adding and mixing binder and plasticizer. The conductive paste is then printed in a thickness of 1 to 40 μm on the upper surfaces of the respective green sheets by screen printing or the like.

Here, the metal filling rate of the metal layer 12 is changeable by changing the ratio of the organic matter and the metal powder. That is, the organic matter may vaporize during sintering, so that voids can be formed in the metal layers 12. Accordingly, a low content of the organic matter increases the metal filling rate, and a high content of the organic matter decreases the metal filling rate. Specific organic contents of the metal layers 12a to 12c are as follows. The metal layer 12a is 0.1 to 10 parts by mass, and preferably 1 to 5 parts by mass with respect to 100 parts by mass of metal powder. The low-filled metal layer 12b is 0.1 to 50 parts by mass, and preferably 2 to 10 parts by mass with respect to 100 parts by mass of metal powder. The high-filled metal layer 12c is 0 to 5 parts by mass, and preferably 0 to 2 parts by mass with respect to 100 parts by mass of metal powder.

Although no special limitation is imposed on the organic matter, as long as it exhibits good thermally dissolving behavior during sintering, the abovementioned acryl beads and resin beads of acryl or α-methyl styrene resin are preferred. The acryl beads and the resin beads may have a hollow structure. Preferably, the acryl beads and the resin beads have a mean particle size of approximately 0.01 to 3 μm.

Alternatively, acryl beads paste may be prepared by adding while mixing binder and plasticizer to an organic matter such as acryl beads. A conductive paste is prepared by adding while mixing binder and plasticizer to metal powder composing the metal layers 12, such as silver-palladium. The acryl beads paste and the conductive paste are stackingly printed on the upper surfaces of the respective green sheets by screen printing or the like. This enables printing having more excellent mass production.

Subsequently, a plurality of the green sheets with the conductive paste printed thereon are stacked one upon another. The stacked body with a heavy stone mounted thereon is debindered at a predetermined temperature. Thereafter, this is sintered without mounting any heavy stone thereon so that voids can be formed in the metal layers, thereby obtaining the stacked body 13. The sintering temperature is 900 to 1200° C., and preferably 900 to 1000° C. The reason for this is as follows. When the sintering temperature is below 900° C., the sintering temperature is low and the sintering is insufficient, making it difficult to manufacture a dense piezoelectric body. When the sintering temperature is above 1200° C., the connecting strength between the metal layer and the piezoelectric body becomes large.

At this time, by adding metal powder composing the metal layer 12, such as silver-palladium, into the green sheets composing the inactive layers 14, or alternatively by printing, on the green sheets, slurry consisting of metal powder composing the meta layers 12, such as silver-palladium, and an inorganic compound and binder, the shrinkage behavior and shrinkage during sintering of the inactive layers 14 and other portions can approach each other, thereby forming a dense stacked body 13.

The stacked body 13 should not be limited to that manufactured by the above manufacturing method, and it may be formed by any manufacturing method capable of forming the stacked body 13, in which a plurality of the piezoelectric layers 11 and a plurality of the metal layers 12 are stacked alternately.

Thereafter, the metal layer 12 whose end is exposed to the side surface of the multilayer piezoelectric element, and the metal layer 12 whose end is not exposed thereto are alternately formed. Then, a groove is formed in a piezoelectric portion between the metal layer 12 whose end is not exposed, and the external electrodes 15. An insulator of resin or rubber, having a lower Young's modulus than the piezoelectric layers 11, is formed in the groove. Here, the groove is formed of the side surface of the stacked body 13 by using an internal dicing device or the like.

Next, a conductive silver glass paste is prepared by adding binder to glass powder. This is formed in a sheet, and the raw density of the sheet after drying (causing the solvent to splash) is controlled to 6 to 9 $g/cm^3$. This sheet is then transferred onto an external electrode forming surface of a columnar stacked body 13, followed by baking at a temperature that is higher than the softening point of glass, and below the melting point (965° C.) of silver, and below fourth five of the sintering temperature of the stacked body 13. This enables splash and elimination of the binder composition in the sheets manufactured by using the silver glass conductive paste, thereby forming the external electrodes 15 composed of porous conductive material having a three-dimensional mesh structure.

Here, the paste composing the external electrodes 15 may be stacked on a multilayer sheet and then baked, or stacked alternately per layer and then baked. It is however excellent in mass production to perform baking at a time after stacking on the multilayer sheet. In the case of changing the glass composition layer by layer, the amount of the glass composition may be changed sheet by sheet. If desired to form an extremely thin glass rich layer on the surface most adjacent to the piezoelectric layer 11, a glass rich paste may be printed on the stacked body 13 by screen printing or the like, and a multilayer sheet may be stacked thereon. Instead of the printing, a sheet of below 5 μm may be used.

The baking temperature of the above silver glass conductive paste is desirably 500 to 800° C., from the point that a neck portion (the portion where crystal grains are collected) is effectively formed, the silver in the silver glass conductive paste and the metal layer 12 are diffusedly connected to each other, the voids in the external electrodes 15 are effectively retained, and the external electrodes 15 and the side surfaces of the columnar stacked body 13 are partially connected to each other. The softening point of the glass composition in the silver glass conductive paste is desirably 500 to 800° C.

On the other hand, when the baking temperature is higher than 800° C., the silver powder of the silver glass conductive paste is too advanced, and the porous conductive material having a three-dimensional mesh structure cannot be formed, so that the external electrodes 15 are too dense. As a result, the Young's modulus of the external electrodes 15 is too high, and the stress during driving cannot be absorbed sufficiently, so that the external electrodes 15 might be disconnected. Preferably, the baking is performed at temperatures within 1.2 times of the glass softening point. When the baking temperature is lower than 500° C., a sufficient diffused connection between the ends of the metal layer 12 and the external electrodes 15 cannot be made, and no neck portion can be formed, which might cause spark between the metal layer 12 and the external electrodes 15 during driving.

Next, silicone rubber is filled into the groove of the stacked body 13 by immersing the stacked body 13 provided with the external electrodes 15 in a silicone rubber solution, and then deaerating the silicone rubber solution in the vacuum. The stacked body 13 is then lifted from the silicone rubber solution, and the silicone rubber is coated on the side surfaces of the stacked body 13. The silicone rubber, which is filled into the groove and also coated on the side surfaces of the stacked body 13, is then cured, thereby obtaining the multilayer piezoelectric element.

When this multilayer piezoelectric element is used in a piezoelectric actuator, the polarization processing of the stacked body 13 is performed by connecting lead wires to the external electrodes 15, respectively, and by applying through the lead wires a dc voltage of 0.1 to 3 kV/mm to a pair of the external electrodes 15, respectively. This achieves a piezoelectric actuator using the multilayer piezoelectric element of the present invention.

By connecting the lead wires of this piezoelectric actuator to an external voltage supply part, respectively, and applying a voltage to the metal layers 12 through the lead wires and the external electrodes 15, the respective piezoelectric layers 11 are greatly displaced by the reverse piezoelectric effect, thereby functioning as, for example, an automobile fuel injection valve for performing fuel injection supply to an engine. Additionally, as this piezoelectric actuator is provided with the multilayer piezoelectric element of the present invention, it has a large displacement under high voltage and high pressure, and variations of the displacement can be suppressed even under a long-term continuous driving. In the present invention, the term "high voltage and high pressure" means to apply an alternating voltage of 0 to +300V to the piezoelectric actuator (the multilayer piezoelectric element) at room temperature and at a frequency of 1 to 300 Hz.

Alternatively, a conductive auxiliary member composed of conductive adhesive, in which a metal mesh or a mesh-shaped metal plate is buried, may be formed on the outer surfaces of the external electrodes 15. In this case, when a large current is inputted into the actuator so as to be driven at high speed by disposing the conductive auxiliary member on the outer surfaces of the external electrodes 15, the large current can be admitted in the conductive auxiliary member, reducing the current passing through the external electrodes 15. For this reason, it is possible to prevent that the external electrodes 15 will locally generate heat and cause disconnection, enabling significant improvement of durability. Additionally, as the metal mesh or the mesh-shaped metal plate is buried in the conductive adhesive, it is possible to prevent the occurrence of cracks in the conductive adhesive. The metal mesh means one in which a metal line is knitted. The mesh-shaped metal plate means one in which holes are formed in a metal plate so as to have the shape of a mesh.

The conductive adhesive constituting the conductive auxiliary member is preferably composed of polyimide resin where silver powder is dispersed. That is, by dispersing silver powder having a low specific resistance into polyimide resin having high thermal resistance, it is possible to form a conductive auxiliary member having a low resistance value and maintaining high adhesive strength if used at high temperature.

The conductive particles are preferably aspherical particles such as flake shape and needle shape. The reason for this is as follows. That is, by changing the shape of the conductive particles into particles of aspherical shape such as flake shape and needle shape, the entanglement between the conductive particles can be made strong, further increasing the shear strength of the conductive adhesive.

The multilayer piezoelectric elements of the present invention are not be limited to these but are susceptible of various changes without departing from the gist of the present invention. For example, although the foregoing preferred embodiments have described the cases where the external electrodes 15 are formed on the opposed side surfaces of the stacked body 13, in the present invention, the external electrodes 15 may be formed, for example, on the adjacent side surfaces.

Fifth Preferred Embodiment

Figure 8:
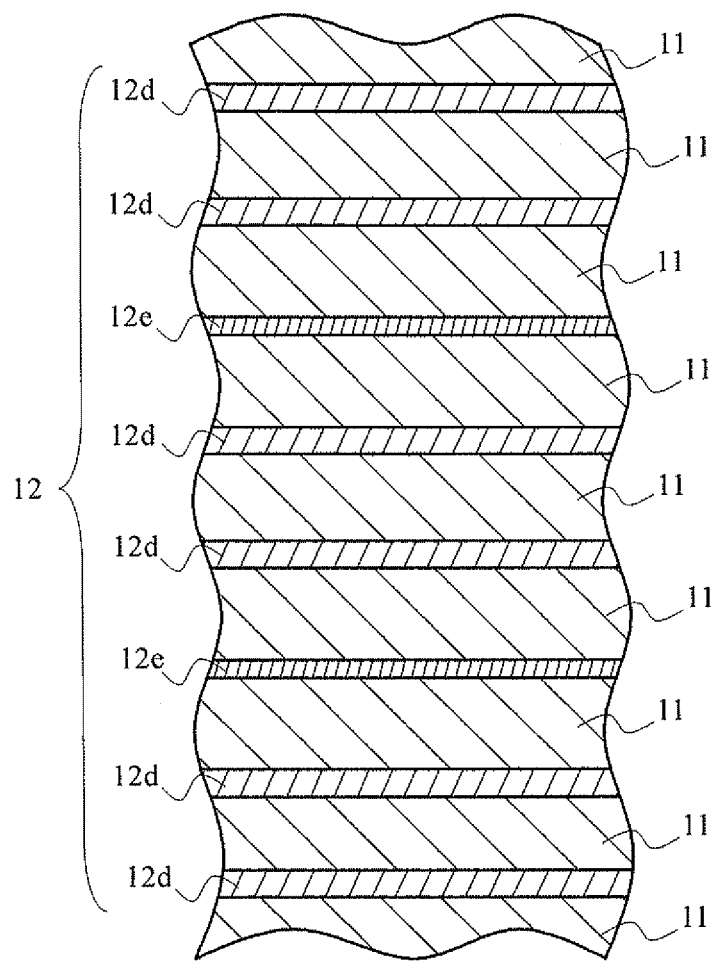
FIG. 8 is a partially enlarged cross section showing the stacked structure of a multilayer piezoelectric element according to a fifth preferred embodiment.
Figure 9:
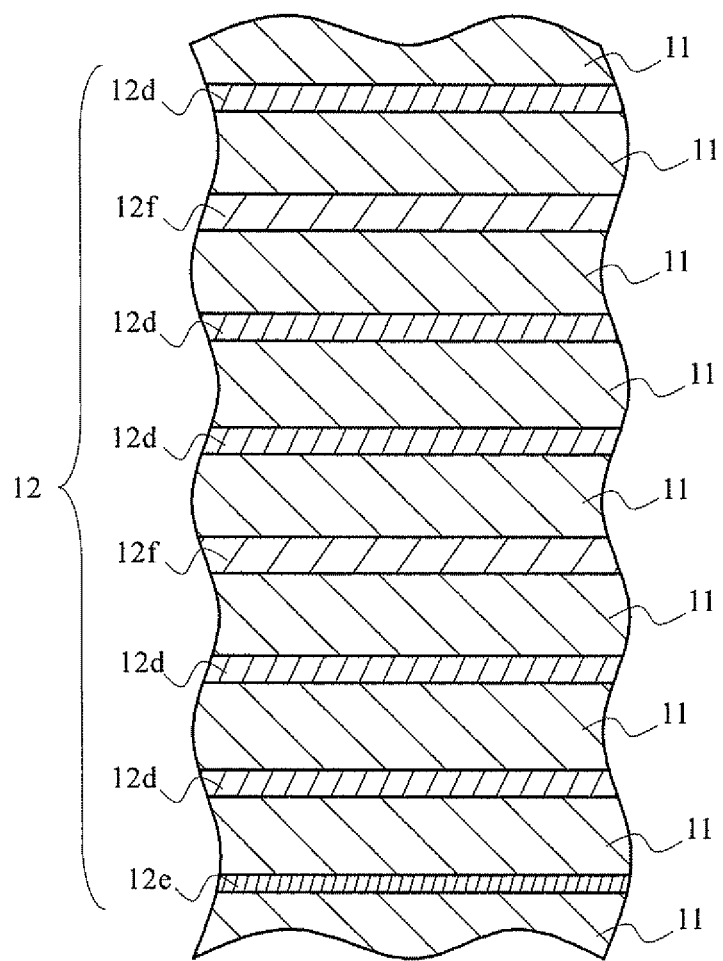
FIG. 9 is a partially enlarged cross section showing a thick metal layer in the fifth preferred embodiment.
Figure 10:
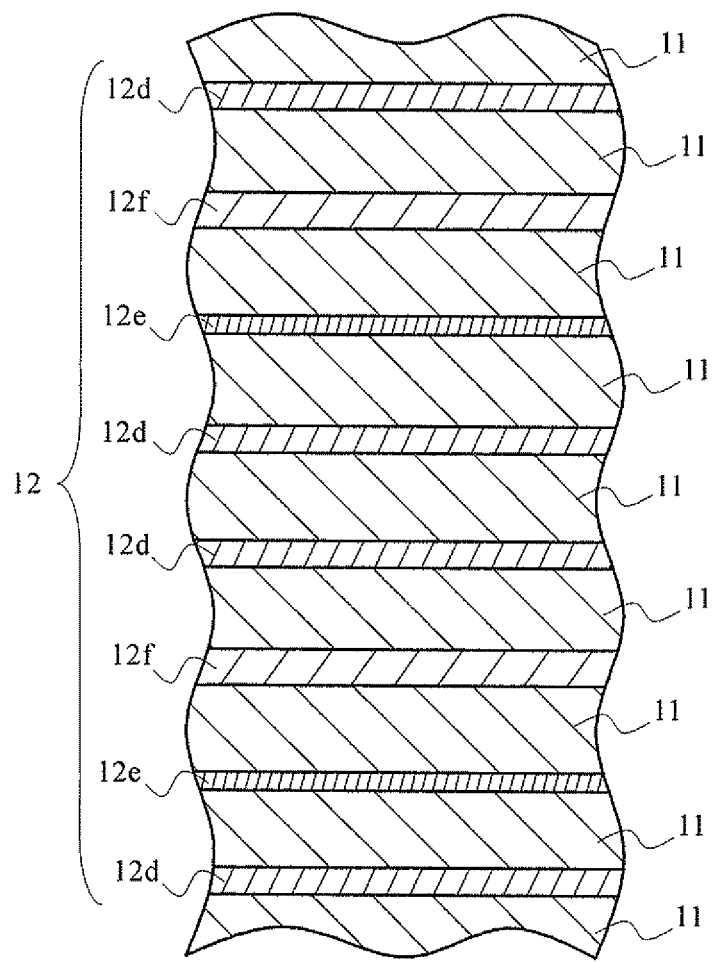
FIG. 10 is a partially enlarged cross section showing other stacked structures in the fifth preferred embodiment.
Figure 11:
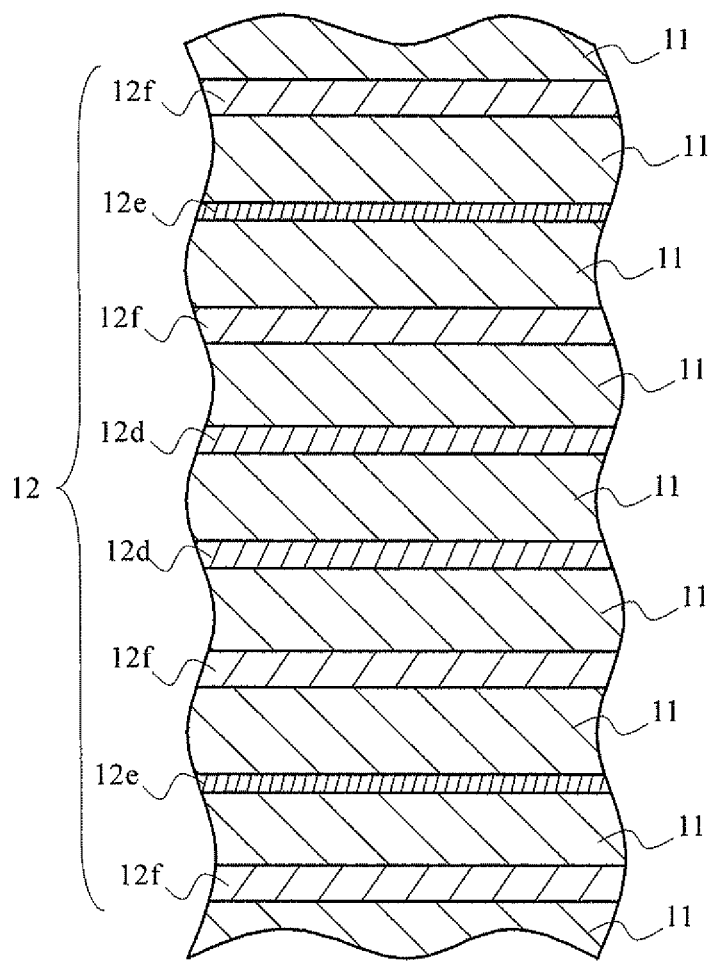
FIG. 11 is a partially enlarged cross section showing other stacked structure in the fifth preferred embodiment.
Figure 12:
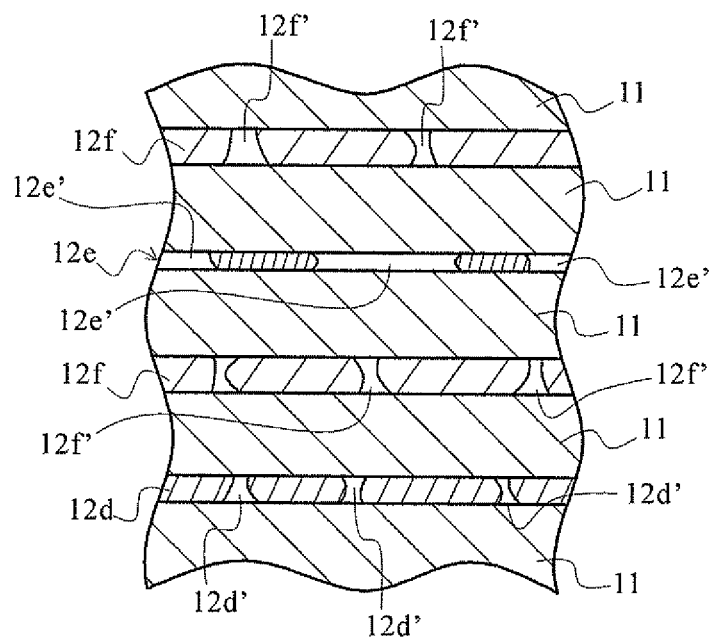
FIG. 12 is a schematic explanatory drawing for explaining voids of a piezoelectric layer in the fifth preferred embodiment.

A fifth preferred embodiment related to a multilayer piezoelectric element of the present invention will next be described in detail with reference to the accompanying drawings. FIG. 8 is a partially enlarged cross section showing the stacked structure of a multilayer piezoelectric element according to the present embodiment. FIG. 9 is a partially enlarged cross section showing a thick metal layer in the present embodiment. FIG. 10 is a partially enlarged cross section showing other stacked structures in the present embodiment. FIG. 11 is a partially enlarged cross section showing other stacked structure in the present embodiment. FIG. 12 is a schematic explanatory drawing for explaining voids of a piezoelectric layer in the present embodiment. In FIGS. 8 to 12, similar or equivalent parts to the configurations of FIGS. 1 to 7 as described above have similar reference numbers, and the description thereof is omitted.

A plurality of metal layers 12 according to the present embodiment include a plurality of thin metal layers 12e having a smaller thickness than oppositely disposed metal layers (metal layers 12d) adjacent to each other in the stacking direction, as shown in FIG. 8. The thin metal layers 12e can be easily deformed to absorb the local stress of the piezoelectric body displacement. Hence, the piezoelectric layers 11 around the thin metal layer 12e have a small displacement. In addition, the piezoelectric layers 11 around thick metal layers 12f described later (refer to FIG. 9) having a larger thickness than the thin metal layers 12e have a large displacement because the hard-to-deform thick metal layer repels the local stress of the piezoelectric body displacement. Therefore, metal layers having different displacements can be arranged separately in the element. This increases the displacement of the entire piezoelectric element, and also relaxes the suppression of the element deformation due to stress concentration even in a long-period continuous driving under high voltage and high pressure, thereby suppressing delamination to be generated at the stacking portions. Further, resonance phenomena can also be suppressed, thereby preventing beat sound generation. Further, harmonic signal generation can be prevented, thereby suppressing the noise of control signals. Furthermore, by changing the thicknesses of the metal layers 12 with a manufacturing method such as printing, the element having stress relaxing effect can be manufactured without changing the thicknesses of the piezoelectric layers 11. This realizes the structure having excellent mass production.

Drivingly deformed portions of a plurality of the piezoelectric layers 11 are the portions sandwiched with the metal layers 12. It is therefore preferable to form the thin metal layers 12e at the portions of a plurality of the metal layers 12 which are overlapped with each other with the piezoelectric layer 11 in between. This surely suppresses resonance phenomena to be generated when the displacements (dimensional changes) of the piezoelectric elements become identical.

Preferably, a plurality of the thin metal layers 12e are respectively disposed interposing in between a plurality of different metal layers having a larger thickness than the thin metal layers 12e. The different metal layers of the present embodiment are the metal layers 12d as shown in FIG. 8, and the thick metal layers 12f described later as shown in FIG. 9. Here, the thin metal layers 12e have a smaller thickness than the different metal layers (the metal layers 12d and the thick metal layers 12f). Hence, the thin metal layers 12e have greater flexibility than the different metal layers, and therefore, when the element is driven and the piezoelectric layers 11 are deformed, the thin metal layers 12b can be deformed themselves for relaxing the stress (stress relaxing effect). That is, the thin metal layers 12e function as a stress relaxing layer. In the piezoelectric layers 11 connected to the thin metal layers 12e, the driving deformation due to voltage application, and the deformation due to stress application coexist. The thin metal layers 12e will deform themselves for relaxing stress. Therefore, the deformation due to stress application is dominant, thereby permitting deformation for relaxing the stress. Consequently, the driving displacement becomes small, thereby avoiding that the stress exerted on the element concentrates at a point. This achieves the multilayer piezoelectric element having excellent durability and high reliability.

Particularly, if a plurality of the thick metal layers 12f are interposed, the thick metal layers 12f have strong force constraining the piezoelectric layers 11 connected to the thick metal layers 12f, and repel the local stress of the piezoelectric displacement without any large deformation of the thick metal layers 12f. Consequently, the piezoelectric layers 11 connected to the thick metal layers 12f cause a stronger displacement. This permits an increase in the piezoelectric displacement of the element. In addition, when the element is driven, the thick metal layers 12f are hard to deform themselves for the above reason, so that the stress exerted on the entire element concentrates in the vicinity of the thick metal layers 12f (stress concentration effect). Thus, the stress concentrating portions are disposed locally in the element, and the stress concentrating portions are surrounded by the thin metal layers 12e having the stress relaxing effect. This enables the element to have extremely large stress relaxing effect as a whole.

Particularly, in the present embodiment, it is preferable that the plurality of the thin metal layers 12e be regularly arranged in the stacking direction. This is because the regular arrangement of the stress relaxing layers is effective for dispersing the stress exerted on the entire element. It is also preferable that the stacked body 13 be configured by stacking at least three layers of the piezoelectric layers 11, and the thin metal layers 12e be repetitively arranged in a predetermined order.

The above expression that the plurality of the thin metal layers 12e are regularly arranged in the stacking direction includes the case where the layer number of the different metal layers (the metal layers 12d and the thick metal layers 12f), which are present between the thin metal layers 12e, is identical for each area between the thin metal layers 12e, as well as the case where the layer number of the different metal layers 12 existing between the thin metal layers 12e approaches such a degree that the stress can be dispersed substantially uniformly in the stacking direction. Specifically, the layer number of the different metal layers 12 existing between the thin metal layers 12e is within ±20% with respect to the average value of the respective layer numbers, preferably within ±10% with respect to the average value of the respective layer numbers, and more preferably all be identical number.

The metal layers 12d as the different metal layers are the metal layer whose thickness is larger than the thin metal layers 12e. The metal layers 12d are main metal layers. The term "the main meta layers" means metal layers which are composed of a plurality of metal layers having the identical thickness in the metal layers 12, and which have a larger layer number than the thin metal layers 12e and the thick metal layers 12f. Preferably, the layer number of the metal layers 12d as the main metal layers is not less than one third of the total metal layer number in the order of proximity to the average thickness of all of the metal layers. The reason for this is as follows. The function required for the main metal layers 12d is to stably function as electrodes for driving the multilayer piezoelectric element. It is therefore required that the voltage applied to the element is uniformly supplied so as to uniformly cause piezoelectric displacements. When the main metal layers 12d constitute not less than one third of the total metal layer number in the order of proximity to the average thickness of all of the metal layers, the voltage applied to the element can be supplied uniformly to each of the piezoelectric layers 11. Therefore, without excessive non-uniform driving deformation of the piezoelectric layers 11, the element can be approximately uniformly drivingly deformed as a whole, resulting in the element with durability. Additionally, the piezoelectric layers 11 connected to the thin metal layers 12e are free from stress concentration, permitting a large displacement. The piezoelectric layers 11 connected to the thin metal layers 12e become stress relaxing layers, thereby maintaining the driving displacement of the element, and avoiding stress concentration at a point of the element. This provides a large displacement and excellent durability.

In order to equalize the phases of displacements and raise response speed, the main metal layers 12d, in the order of proximity to the average thickness of all of the metal layers, constitute 70% and above, preferably 80% and above, more preferably 90% and above, and still more preferably 90 to 99% of the total metal layer number. When the main metal layers $12d$ constitute 90% and above of the entire metal layer number, the phases of displacements can be equalized thereby to achieve higher response speed. Above 99%, the phases are completely equalized, and undesirably the element may cause beat sound.

Preferably, the layer number of the main metal layers $12d$ is the largest in the plurality of the metal layers $12$. This enables the voltage applied to the element to be uniformly supplied to the respective piezoelectric layers $11$, thereby eliminating the non-uniform driving deformation of the piezoelectric layers $11$. In addition, owing to the equalized phases of displacements, the element can have substantially uniform driving deformation, thus achieving the multilayer piezoelectric element having high response speed along with durability.

Preferably, the main metal layers $12d$ are metal layers except for those having the largest thickness and those having the smallest thickness in the metal layers $12$. The reason for this is as follows. That is, the stress exerted on the multilayer piezoelectric element during driving tends to be applied to the piezoelectric layers $11$ in the vicinity of the metal layers $12$ having the largest thickness. Hence, if the main metal layers $12d$ are metal layers other than those having the largest thickness, it is possible to obtain the multilayer piezoelectric element with high durability in which the metal layers $12d$ and the piezoelectric layers $11$ connected to the metal layers $12d$ are firmly adhered to each other. Further, owing to a small displacement of the piezoelectric layers $11$ connected to the metal layers $12$ having a small thickness, if the main metal layers $12d$ are metal layers other than those layers having the smallest thickness, there is no possibility that the displacement of the multilayer piezoelectric element becomes excessively small. That is, by using, as the main metal layers $12d$, the metal layers other than those having the largest thickness and those having the smallest thickness, it is capable of obtaining the multilayer piezoelectric element having a large driving displacement and durability. Additionally, by changing the thicknesses of the metal layers $12$, the magnitude of displacements of the piezoelectric layers $11$ can be controlled, thereby eliminating the necessity to change the thicknesses of the piezoelectric layers $11$. This permits excellent mass production.

Preferably, a plurality of the metal layers $12$ includes a plurality of thick metal layers $12f$ having a larger thickness than oppositely disposed metal layers (metal layers $12d$) adjacent to each other in the stacking direction, as shown in FIG. 9. Thus, when the element is driven and the piezoelectric layers $11$ are deformed, the thick metal layers $12f$ have strong force constraining the piezoelectric layers $11$ connected to the thick metal layers $12f$, and repel the local stress of the piezoelectric displacement without any large deformation of the thick metal layers $12f$. Consequently, the piezoelectric layers $11$ connected to the thick metal layers $12f$ cause a stronger displacement. This permits an increase in the piezoelectric displacement of the element. In addition, when the element is driven, the thick metal layers $12f$ are hard to deform themselves for the above reason, so that the stress exerted on the entire element concentrates in the vicinity of the thick metal layers $12f$ (stress concentration effect). Accordingly, the arrangement of the thick metal layers $12f$ in the element can avoid stress concentrating at a point in the element, and disperse the stress, achieving the multilayer piezoelectric element having excellent durability and high reliability.

Drivingly deformed portions of a plurality of the piezoelectric layers $11$ are the portions sandwiched with the metal layers $12$. It is therefore preferable to form the thick metal layers $12f$ at the portions of a plurality of the metal layers $12$ which are overlapped with each other with the piezoelectric layers $11$ in between. This further increases the effect that the stress exerted on the entire element concentrates in the vicinity of the thick metal layers $12f$.

Particularly, if a plurality of the thin metal layers $12e$ are interposed, the thin metal layers $12e$ have greater flexibility than the different metal layers, and therefore, when the element is driven and the piezoelectric layers are deformed, the thin metal layers $12e$ deform themselves for relaxing the stress (stress relaxing effect). That is, the thin metal layers $12e$ function as a stress-relaxing layer. Although the piezoelectric layers $11$ connected to the thin metal layers $12e$ are subjected to both of the driving deformation due to voltage application, and the deformation due to stress application, the thin metal layers $12e$ will deform themselves for relaxing stress, so that the deformation due to stress application is dominant. Hence, under the deformation for relaxing the stress, the driving displacement becomes small, thereby avoiding that the stress exerted on the element concentrates at a point. Thus, the portions at which the stress concentrates are disposed locally in the element, and the stress concentrating portions are surrounded by the thin metal layers $12e$ having the stress relaxing effect. This enables the element to have extremely large stress relaxing effect and a large driving torque as a whole.

Particularly, in the present embodiment, it is preferable that the plurality of the thick metal layers $12f$ be regularly arranged in the stacking direction. This is because the regular arrangement of the stress relaxing layers is effective for dispersing the stress exerted on the entire element. It is also preferable that the stacked body $13$ be configured by stacking at least three layers of the piezoelectric layers $11$, and there be a part where the thick metal layers $12f$ are repetitively arranged in a predetermined order.

The above expression that the plurality of the thick metal layers $12f$ are regularly arranged in the stacking direction includes the case where the layer number of the different metal layers (the metal layers $12d$ and the thin metal layers $12e$), which are present between the thick metal layers $12f$, is identical for each area between the thick metal layers $12f$, as well as the case where the layer number of the different metal layers $12$ existing between the thick metal layers $12f$ approaches such a degree that the stress can be dispersed substantially uniformly in the stacking direction. Specifically, the layer number of the different metal layers $12$ existing between the thick metal layers $12f$ is within ±20% with respect to the average value of the respective layer numbers, preferably within ±10% with respect to the average value of the respective layer numbers, and more preferably all be identical number.

The thick metal layers $12f$ are metal layers having a larger thickness than the thin metal layers $12e$ and the main metal layers $12d$. That is, the respective thicknesses of the main metal layers $12d$, the thin metal layers $12e$ and the thick metal layers $12f$ have the following relationship: the thick metal layers $12f$>the main metal layers $12d$>the thin metal layers $12e$. Among all of the metal layers $12$, the main metal layers $12d$ are the metal layers other than those having the largest thickness and those having the smallest thickness. This provides the multilayer piezoelectric element having a large driving displacement and durability. This also ensures that the metal layers $12$ having different displacements are arranged in the element. As a result, the piezoelectric layers $11$ around the thin metal layers $12e$ have a small displacement, and the piezoelectric layers 11 around the thick metal layers 12f have a large displacement. This permits more efficient achievement of the effect resulting from the arrangement of the metal layers having different displacements in the element.

Specifically, a thickness ratio (Y2/X2) is in the range of 0.1 to 0.9, preferably 0.3 to 0.9, and more preferably 0.5 to 0.8, where X2 is a thickness of other metal layer except for the thick metal layer 12e and the thick metal layer 12f (namely, the main metal layer 12d), and Y2 is a thickness of the thin metal layer 12e. This enables the stress relaxing effect of the thin metal layers 12e to be obtained more surely, and also enables the element shape to be retained (preventing an excessive drop in the mechanical strength of the element). Especially, when the above ratio (Y2/X2) is 0.3 to 0.9, the piezoelectric layers 11 adjacent to the thin metal layers 12e are also drivingly displaced, thereby obtaining the multilayer piezoelectric element having a large displacement of the element and having high durability. Further, when the above ratio (Y2/X2) is 0.5 to 0.8, it is possible to obtain the multilayer piezoelectric element having a larger displacement of the element and having higher durability. The specific values of X2 and Y2 may be determined arbitrarily depending on the composition of the metal layers 12, etc. Although no special limitation is imposed thereon, in general, X2 is 0.1 to 100 µm, preferably 0.5 to 10 µm, and more preferably 1 to 5 µm, and Y2 is 0.05 to 100 µm, preferably 0.1 to 10 µm, and more preferably 0.5 to 5 µm. It is preferable that X2 and Y2 be within the above range and satisfy the above ratio (Y2/X2).

On the other hand, when the above ratio (Y2/X2) is smaller than 0.1, the stress relaxing effect of the thin metal layers 12e is too large, and the thin metal layers 12e cause a large deformation every time the element is driven. As a result, there may arise breakage due to metal fatigue, and cracks may occur in the interface with the external electrodes 15, so that durability might be deteriorated. Above 0.9, the stress relaxing effect of the thin metal layers 12e might be lowered, and there might appear a stress concentration point in the element, thus lowering the durability of the element.

Alternatively, a thickness ratio (Z2/X2) is in the range of 1.05 to 2, preferably 1.05 to 1.5, and more preferably 1.1 to 1.2, where X2 is a thickness of other metal layer except for the thin metal layer 12e and the thick metal layer 12f (namely, the main metal layer 12d), and Z2 is a thickness of the thick metal layer 12f. This enables the stress relaxing effect of the thick metal layers 12f to be produced more surely, and also enables the element shape to be retained. Especially, when the above ratio (Z2/X2) is 1.05 to 1.5, the piezoelectric layers 11 adjacent to the thick metal layers 12f, and the piezoelectric layers 11 adjacent to the main metal layers 12d are also drivingly displaced almost similarly, thereby obtaining the multilayer piezoelectric element having high durability. Alternatively, when the above ratio (Z2/X2) is 1.1 to 1.2, this achieves the multilayer piezoelectric element having a larger displacement and high durability. Like X2 and Y2 in the abovementioned ratio (Y2/X2), the specific values of X2 and Z2 may be determined arbitrarily depending on the composition of the metal layers 12, etc. Although no special limitation is imposed thereon, in general, X2 is 0.1 to 10 µm, preferably 0.5 to 10 µm, and more preferably 1 to 5 µm, and Z2 is 0.1 to 200 µm, preferably 0.5 to 15 µm, and more preferably 1 to 10 µm.

On the other hand, when the above ratio (Z2/X2) is larger than 2, stress may concentrate on the thick metal layer 12f, and the interface between the thick metal layer 12f and the piezoelectric layer 11 may flake off, so that delamination might occur in the stacked body. Below 1.05, the stress concentration effect of the thick metal layers 12f might be lowered, and there might appear a stress concentration point in the element, thus lowering the durability of the element.

Preferably, the main metal layers 12d have substantially the same thickness. This enables a larger displacement, high responsibility and improved durability. Preferably, the thickness within a layer of the thin metal layers 12e and the thick metal layers 12f is substantially the same. The reason for this is as follows. That is, if in the metal layers to which voltages of different polarity are applied, their respective thicknesses per layer are substantially the same in the area of the metal layers overlapped with each other through the piezoelectric layer 11, it is possible to suppress the resonance phenomena to be generated when the displacements as the dimensional changes of the elements become identical.

On the other hand, if there is a locally thin portion in the thin metal layers 12e, stress may concentrate at the locally thin portion when thin metal layers 12e deform for relaxing the stress during the time the element is drivingly deformed. Undesirably, abnormal heat generation may occur in continuous use. Similarly, if there are a locally thick portion and a locally thin portion in the thick metal layers 12f, stress may concentrate at the locally thick portion and the locally thin portion during the time the element is drivingly deformed. Undesirably, abnormal heat generation may occur in continuous use.

Here, the thickness of each of the metal layers 12 (the metal layers 12d to 12f) is a measured value of a surface obtained by cutting the multilayer piezoelectric element in the stacking direction. Specifically, when the metal layers 12 on the cut surface are observed with a scanning electron microscope (SEM) and a metal microscope, it can be seen that the metal layers 12 are composed not only metal components but also elements other than metal, such as voids and ceramic composition, etc. Therefore, in the cross section of an arbitrary metal layer, arbitrary five locations in a layer composed mainly of metal are selected, and the respective thicknesses capable of being sandwiched between arbitrary two parallel lines are measured. The average value of these measured values is taken as a metal layer thickness. In this manner, the thicknesses of the metal layers 12d, the thick metal layers 12e and the thick metal layers 12f are measured, thereby obtaining the thickness of each of the metal layers 12d to 12f.

In the present embodiment, it is preferable that the thick metal layer 12f having a larger thickness than the main metal layer 12d and the thin metal layer 12e having a smaller thickness than the main metal layer 12d be oppositely disposed with the piezoelectric layer 11 in between, as shown in FIG. 10. Thus, the stress during the time the element is driven can be concentrated on the thick metal layer 12f so as to disperse the stress exerted on the element. Further, with the arrangement that the thin metal layer 12e as the stress relaxing layer is adjacent to the metal layer that collects stress, the stress exerted on the element can be dispersedly relaxed.

Especially, the oppositely disposed metal layers adjacent to each other in the stacking direction with respect to the thin metal layer 12e are preferably the thick metal layers 12f, as shown in FIG. 11. Thus, the stress during the time the element is driven can be concentrated on the thick metal layer 12f so as to disperse the stress exerted on the element. Further, with the arrangement that the thin metal layer 12e as the stress relaxing layer is adjacent to the metal layer that collects stress, the stress exerted on the element can be dispersedly relaxed. By sandwiching the thin metal layer 12e as the stress relaxing layer between the thick metal layers 12f as the stress collecting layer, stress can be confined within the thin metal layer 12e, and the stress exerted on the entire element can be dispersedly relaxed. Hence, the application of the element to a piezoelectric actuator can provide the piezoelectric actuator having excellent durability and high reliability. Since a smaller layer number of the sandwiched thin metal layers 12e can increase stress confining effect, the optimum layer number is one.

Preferably, the thin metal layer 12e, the thick metal layer 12f and the main metal layer 12d are arranged in this order with the piezoelectric layer 11 in between, and in the stacking direction of the stacked body 13, and the main metal layers 12d are stacked in the descending order of the thickness thereof. With this arrangement, the stress during the time the element is driven can be concentrated on the thick metal layer 12f, thereby dispersing the stress exerted on the element. Further, with the arrangement that the thin metal layer 12e as the stress relaxing layer is adjacent to the metal layer that collects stress, the stress exerted on the element can be dispersedly relaxed. Furthermore, with the arrangement that the main metal layers 12d are disposed in the descending order of the thickness thereof, the stress collected at the thick metal layer 12f can be dispersed gradually, and the increased thickness provides a larger displacement of the adjacent piezoelectric layer 11. These achieve the multilayer piezoelectric element having a large displacement, excellent durability and high reliability.

If the thicknesses of a plurality of the metal layers 12 are compared, the thick metal layer 12f preferably has a peak thickness, and there is preferably a tilted region where the thickness is gradually lowered from the thick metal layer 12f, throughout over two layers, preferably 2 to 5 layers in the stacking direction. Thus, the stress during the time the element is driven concentrates on the thick metal layers 12f. However, the presence of a predetermined tilted region enables the stress collected at the thick metal layer 12f to be dispersed gradually.

Preferably, the metal layers 12 have predetermined voids 12d', 12e' and 12f', as shown in FIG. 12. Particularly, the main metal layer 12d is provided with voids 12d', and the area ratio (the void ratio) of the voids 12d' to the entire cross-sectional area in the cross section of the metal layer 12d is 5 to 70%, preferably 7 to 70%, and more preferably 10 to 60%. This permits a large displacement, thereby obtaining the multilayer piezoelectric element having excellent displacement. Especially, when the void ratio is 7 to 70%, or 10 to 60%, the piezoelectric layers 11 can be more smoothly deformed, and the displacement of the multilayer piezoelectric element can be increased by the sufficient electric conductivity of the metal layers 12.

On the other hand, if the void ratio is smaller than 5%, the piezoelectric layers 11 are constrained by the metal layers 12 when the piezoelectric layers 11 are deformed by the applied voltage, thereby suppressing the deformation of the piezoelectric layers 11. This reduces the amount of deformation of the multilayer piezoelectric element, and increases the internal stress to be generated. As a result, durability might be affected. On the other hand, when the void ratio is larger than 70%, extremely narrow portions may occur at the electrode portions. Therefore, the strength of the metal layers 12 themselves may be lowered, and cracks are liable to occur in the metal layers 12. Undesirably, disconnection might occur.

Especially, when the thin metal layers 12e are composed mainly of metal and voids, the multilayer piezoelectric element can have still higher durability. That is, as shown in FIG. 12, the thin metal, layer 12e is preferably composed of a plurality of metal parts spaced apart with voids 12e' in between. Thus, when the piezoelectric layers 11 connected to the thin metal layer 12e are connected to the portions not filled with metal, such as the voids 12e', in the metal layers, the piezoelectric body located at that portions causes no displacement even if a voltage is applied to the element, and causes deformation when stress is exerted during driving, thereby relaxing the stress (stress relaxing effect). That the thin metal layer 12e composed of the metal parts functions as a stress relaxing layer. Accordingly, the piezoelectric layers 11 connected to these metal layers have a small driving displacement, thereby avoiding that the stress exerted on the element concentrates at a point. This achieves the multilayer piezoelectric element having excellent durability and high reliability.

Specifically, the area ratio (the void ratio) of the voids 12e' to the entire cross-section area in the cross section of the thin metal layer 12e is preferably 20 to 90%. This further increases displacement, achieving the multilayer piezoelectric element having excellent displacement.

Also in the present embodiment, the metal layers 12 are preferably composed mainly of metal selected from elements in groups 8 to 11 of the periodic table. It is further preferable to compose mainly of metal satisfying the following relationship of: $0<M1\leq15, 85\leq M2<100, M1+M2=100$, where M1 (% by mass) is a content of an element in the groups 8 to 10 of the periodic table, and M2 (% by mass) is a content of an element in the group 11 of the periodic table in the metal layer 12.

Particularly when the thin metal layers 12e relax stress, relaxing the applied stress means to release the stress by converting the applied kinetic energy to thermal energy, and the stress releasing portion retains heat. As the temperature of the piezoelectric body is raised, the force of piezoelectric displacement is reduced. Once the temperature is raised to Curie point, polarization effect will be vanished even if cooled, and the force of piezoelectric displacement is greatly impaired. Consequently, if the thin metal layers 12e can play the role of a heat sink, it will become possible to dissipate heat from the stress relaxing portions to the outside of the element.

Here, the use of metal having the composition of the present embodiment increases the heat dissipation effect, enabling the stress relaxing effect to be retained with high durability for a long period of time. Particularly, the composition containing a high concentration of silver having high thermal conduction can produce the highest thermal dissipation effect. Further, even if oxidized, the thermal conductivity will not be deteriorated, and electric conductivity will not also be deteriorated, permitting the stress relaxing layer with extremely high durability.

The configuration is otherwise similar to those described in the first to fourth preferred embodiments, and therefore the description thereof is omitted.

Sixth Preferred Embodiment

Figure 13:
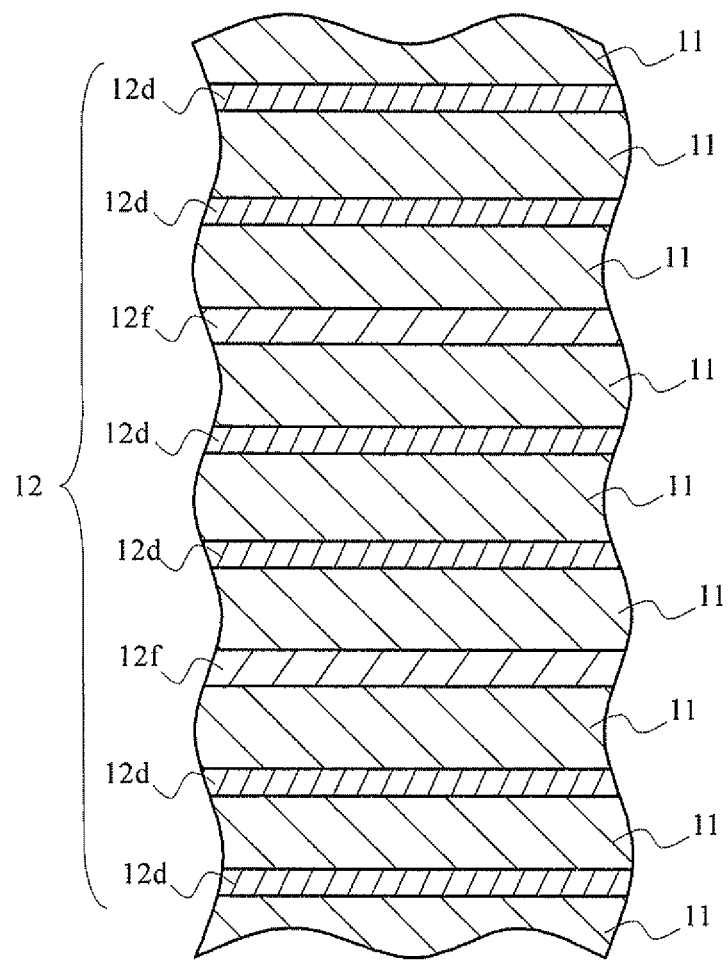
FIG. 13 is a partially enlarged cross section showing the stacked structure of a multilayer piezoelectric element according to a sixth preferred embodiment.

A sixth preferred embodiment related to a multilayer piezoelectric element of the present invention will next be described with reference to the drawing. FIG. 13 is a partially enlarged cross section showing the stacked structure of a multilayer piezoelectric element according to the present embodiment. In FIG. 13, similar or equivalent parts to the configurations of FIGS. 1 to 12 as described above have similar reference numbers, and the description thereof is omitted. As shown in FIG. 13, like the above-mentioned first preferred embodiments, the multilayer piezoelectric element of the sixth preferred embodiment is the multilayer piezoelectric element in which a plurality of piezoelectric layers 11 and a plurality of metal layers 12 are stacked alternately.

A plurality of the metal layers 12 includes a plurality of thick metal layers 12f having a larger thickness than oppositely disposed metal layers (metal layers 12d) adjacent to each other in the stacking direction. This configuration also produces the same effect as the abovementioned preferred embodiments, because the piezoelectric layers 11 around the thick metal layers 12f have a large displacement, and the piezoelectric layers 11 around the main metal layers 12d, having a smaller thickness than the thick metal layers 12f, have a small displacement. This provides the configuration where the metal layers having different displacements are arranged in the element.

Like the fifth preferred embodiment as described above, a plurality of the thick metal layers 12f of the present embodiment are preferably disposed interposing in between a plurality of different metal layers other than the thick metal layers 12f (namely, the main metal layers 12a and the thin metal layers 12e). Preferably, a plurality of the thick metal layers 12f are regularly arranged in the stacking direction. Preferably, a plurality of the metal layers 12 include a plurality of thin metal layers 12e having a smaller thickness than oppositely disposed metal layers adjacent to each other in the stacking direction.

The configuration is otherwise similar to those described in the first to fifth preferred embodiments, and therefore the description thereof is omitted.

Seventh Preferred Embodiment

A seventh preferred embodiment related to a multilayer piezoelectric element of the present invention will next be described. The multilayer piezoelectric element of the present embodiment is one in which a plurality of piezoelectric layers 11 and a plurality of metal layers 12 are stacked alternately, inactive layers 14 composed of a piezoelectric body are formed at both sides in the stacking direction, respectively, and the metal layers 11 adjacent to the inactive layers 14 are thin metal layers (thin metal layers 12e) having a smaller thickness than the metal layers 11 adjacent to each other in the stacking direction. This avoids that the stress exerted on the element concentrates at a point. The reason for this seems to be as follows.

That is, the inactive layers not sandwiched with electrodes will not be drivingly deformed even if a voltage is applied. Therefore, a drivingly deformed portion and a non-drivingly deformed portion are bounded by the metal layer 12 adjacent to the inactive layer 14. At this time, if all of the metal layers 12 have the same thickness, stress may concentrate at a point in the above boundary portion. Therefore, delamination might occur when the multilayer piezoelectric element is continuously driven under high voltage and high pressure for a long period of time.

When the metal layers 11 adjacent to the inactive layer 14 are the thin metal layers (the thin metal layers 12e) having a smaller thickness than the metal layers 11 adjacent to each other in the stacking direction, the thin metal layers 12e have greater flexibility than other metal layers. Thus, when the element is driven and the piezoelectric layers 11 are deformed, the thin metal layers 12e themselves can be deformed thereby to relax the stress (stress relaxing effect). Further, because the inactive layers 14 connected to the thin metal layers 12e are formed by a piezoelectric material, the inactive layers 14 are deformed under stress application, thereby relaxing the stress. That is, the thin metal layers 12e and the inactive layers 14 produce synergism of the stress relaxing effect. Additionally, because the thin metal layers 12e deform themselves, the piezoelectric layer 11 sandwiched between the thin metal layer 12e and the metal layer 12 adjacent thereto are subjected to both of the driving deformation due to voltage application, and the deformation due to stress application. Since the thin metal layers 12e deform themselves for relaxing stress, the deformation due to stress application is dominant, thereby permitting deformation for relaxing the stress. Consequently, the driving displacement becomes small, thereby avoiding that the stress exerted on the element concentrates at a point.

Preferably, the metal layer adjacent to the thin metal layer 12e in the stacking direction is the thick metal layer 12f. Thereby, the stress during the time the element is driven can be concentrated on the thick metal layer 12f, and the stress exerted on the element can be dispersed into the ends. Further, by arranging the thin metal layer 12e serving as a stress relaxing layer so as to be adjacent to the metal layer that collects stress, the stress exerted on the element can be dispersedly relaxed into the ends. When the thick metal layer 12f as a stress collecting layer, and the inactive layer 14 sandwich in between the thin metal layer 12e as a stress relaxing later, the stress can be confined within the thin metal layer 12e, thereby dispersedly relaxing the stress exerted on the entire element. As a result, when the element is applied to a piezoelectric actuator, it is possible to provide the piezoelectric actuator having excellent durability and high reliability.

Conventionally, especially when forming a multilayer piezoelectric element having a stacking number of less than 50, for example, the metal content of the piezoelectric layer 11 in the vicinity of the inactive layer 14 is increased as it approaches the inactive layer 14, in order that displacement can be suppressed so as to suppress the stress from concentrating at the boundary portion. For this, in order to form the piezoelectric layer 11, piezoelectric sheets having several kinds of thickness have to be prepared and stacked one upon another, resulting in a high cost product. On the other hand, in the present invention, the multilayer piezoelectric element having high durability can be manufactured at a low lost, only by changing the metal layers 12 into the thin metal layers (the thin metal layers 12e) having a smaller thickness than the metal layers 12 adjacent to each other in the stacking direction. Further, a multilayer piezoelectric element having high durability can be manufactured at a lower cost by changing the metal layers 12 adjacent to the inactive layers 14 at both sides into the thin metal layer (the thin metal layer 12e) having a smaller thickness than the metal layers 12 adjacent to each other in the stacking direction.

On the other hand, in a multilayer piezoelectric element having a large stacking number, by including a plurality of thin metal layers 12e having a smaller thickness than oppositely disposed metal layers (the metal layers 12d) adjacent to each other in the stacking direction, the piezoelectric layers around the thin metal layers 12e have a small displacement because thin metal layers can be easily deformed to absorb the local stress of piezoelectric displacement. Hence, the metal layers having different displacements can be separately arranged in the element. Thus, even if continuously driven under high voltage and high pressure for a long period of time, the suppression of the element deformation due to stress concentration can be relaxed, suppressing delamination to be generated at the stacking portions. In addition, because resonance phenomena can be suppressed, beat sound generation can be prevented. Furthermore, harmonic signal generation can be prevented, suppressing the noise of control signal.

The configuration is otherwise similar to those described in the first to sixth preferred embodiments, and therefore the description thereof is omitted.

Eighth Preferred Embodiment

An eighth preferred embodiment related to a multilayer piezoelectric element of the present invention will be described below. The multilayer piezoelectric element of the present embodiment is one in which a plurality of piezoelectric layers 11 and a plurality of metal layers 12 are stacked alternately, and inactive layers 14 composed of a piezoelectric body are formed on both sides in the stacking direction, respectively, and the metal layers 11 adjacent to the inactive layers 14 are metal layers (thick metal layers 12f) having a larger thickness than the metal layers 11 adjacent to each other in the stacking direction. This realizes the multilayer piezoelectric element having excellent durability and high reliability. The reason for this seems to be as follows.

That is, because the inactive layers not sandwiched with electrodes will not be drivingly deformed even if a voltage is applied, a drivingly deformed portion and a non-drivingly deformed portion are bounded by the metal layers 12 adjacent to the inactive layers 14, and therefore stress may concentrate at the boundary portion. At this time, if all of the metal layers 12 have the same thickness, stress may concentrate at a point in the above boundary portion. Therefore, delamination might occur when the multilayer piezoelectric element is continuously driven under high voltage and high pressure for a long period of time.

In a state where the thickness of the metal layer 12 adjacent to the inactive layer 14 becomes higher than the thickness of each of the metal layers 12 adjacent to each other in the stacking direction (thick metal layer 12f), when the element is driven and the piezoelectric layers 11 are deformed, the thick metal layers 12f repel any local stress of piezoelectric displacement without their deformation, because they exhibit strong force constraining not only the inactive layers 14 connected to the thick metal layers 12f, but also the piezoelectric layers 11 connected to the thick metal layers 12f. Therefore, the piezoelectric layers 11 connected to the thick metal layers 12f cause a larger displacement. This permits an increase in the piezoelectric displacement of the element.

Further, when the element is driven, the thick metal layers 12f are not deformed themselves for the above reason, and therefore the stress exerted on the entire element concentrates in the vicinity of the thick metal layers 12f (stress concentration effect). Thus, by arranging these thick metal layers 12f at the ends of the driving portion of the element, the stress can be dispersed into the ends of the element, without stress concentration into the driving portion of the element, thus achieving the multilayer piezoelectric element having excellent durability and high reliability.

Conventionally, especially when forming a multilayer piezoelectric element having a stacking number of less than 50, for example, the layer thickness of the piezoelectric layer 11 in the vicinity of the inactive layer 14 is increased as it approaches the inactive layer 14, in order that displacement can be suppressed so as to suppress the stress from concentrating at the boundary portion. For this, in order to form the piezoelectric layer 11, several types of piezoelectric sheets have to be prepared and stacked one upon another, resulting in a high cost product. On the other hand, in the present invention, the multilayer piezoelectric element having high driving force and high durability can be manufactured at a low lost, only by changing the metal layer 12 into the thick metal layer (the thick metal layer 12f) having a larger thickness than each of the metal layers 12 adjacent to each other in the stacking direction. Further, a multilayer piezoelectric element having high durability can be manufactured at a lower cost by changing the metal layers 12 adjacent to the inactive layers 14 at both sides into the thin metal layer (the thin metal layer 12e) having a smaller thickness than each of the metal layers 12 adjacent to each other in the stacking direction.

The configuration is otherwise similar to those described in the first to seventh preferred embodiments, and therefore the description thereof is omitted.

A description will next be made of a method of manufacturing the multilayer piezoelectric elements according to the fifth to eighth preferred embodiments as described above.

Firstly, in the same manner as in the first to fourth preferred embodiments, a plurality of ceramic green sheets serving as the piezoelectric layers 11 are manufactured.

Subsequently, a conductive paste is prepared by adding while mixing binder and plasticizer, etc. in metal powder composing the metal layers 12, such as silver-palladium alloy. The conductive paste is then printed in a thickness of 1 to 40 μm on the upper surfaces of the respective green sheets by screen printing or the like.

Here, the thickness of the metal layer 12 can be changed by changing the ratio of the binder and the plasticizer to the metal powder, or alternatively by changing the degree of the mesh of a screen used for the screen printing, or alternatively by changing the thickness of a resist for forming the pattern of the screen. Among others, by changing the thickness of a resist, the metal layers 12 having different thicknesses can be formed if a single conductive paste is used. Alternatively, if a single process, a single conductive paste is used, thick metal layer 12 can be formed by stackingly printing at the same location.

In order to form voids in the metal layers 12, a conductive paste may be prepared by containing in the above metal powder an organic matter, such as acryl beads, which are bindingly fixed during drying, and volatized during sintering. In order to set the void ratio of the metal layers 12 to a predetermined value, there is, for example, a method of changing the ratio of the above organic matter and the metal powder. That is, the organic matter may vaporize during sintering, so that voids can be formed in the metal layers 12. Accordingly, a low content of the organic matter decreases the void ratio, and a high content of the organic matter increases the void ratio. Specific organic contents of the metal layers 12d to 12f are as follows. The metal layer 12d is 0.1 to 10 parts by mass, and preferably 1 to 5 parts by mass with respect to 100 parts by mass of metal powder. The thin metal layer 12e is 0.1 to 50 parts by mass, and preferably 2 to 10 parts by mass with respect to 100 parts by mass of metal powder. The thick metal layer 12f is 0.01 to 5 parts by mass, and preferably 0.1 to 2 parts by mass with respect to 100 parts by mass of metal powder. As the above organic matter, there are the same organic matters as exemplified in the first to fourth preferred embodiments.

Subsequently, a plurality of the green sheets with the conductive paste printed thereon are stacked one upon another. The stacked body with a heavy stone mounted thereon is debindered at a predetermined temperature. Thereafter, this is sintered without mounting any heavy stone thereon so that the metal layer 12 has a predetermined thickness, thereby obtaining the stacked body 13. The sintering temperature is 900 to 1200° C., and preferably 900 to 1000° C. The reason for this is as follows. That is, when the sintering temperature is below 900° C., the sintering temperature is low and the sintering is insufficient, making it difficult to manufacture a dense piezoelectric body. When the sintering temperature is above 1200° C., there are the following problems. That is, the interlayer stress may be increased, which may be generated in a state in which the piezoelectric layers 11 and the metal layers 12 having different coefficients of thermal expansion are connected to each other at 1200° C. and above, and then cooled. The crystal grains of the piezoelectric body may have abnormal grain growth. The electrode material temperature may be raised over the melting point thereof, and then melted.

Thereafter, the metal layer 12 whose end is exposed to the side surface of the multilayer piezoelectric element, and the metal layer 12 whose end is not exposed thereto are alternately formed. Then, a groove is formed in a piezoelectric portion between the metal layer 12 whose end is not exposed, and the external electrode 15. An insulator of resin or rubber, having a lower Young's modulus than the piezoelectric layer 11, is formed in the groove. Here, the groove is formed of the side surface of the stacked body 13 by using an internal dicing device or the like.

Next, external electrodes 15 are formed in the same manner as in the first to fourth preferred embodiments. Silicone rubber is filled into the groove of the stacked body 13, and silicone rubber is coated on the side surfaces of the stacked body 13 in the same manner as in the first to fourth preferred embodiments. The silicone rubber, which is filled into the groove and also coated on the side surfaces of the stacked body 13, is then cured, thereby obtaining the multilayer piezoelectric element.

When this multilayer piezoelectric element is used in a piezoelectric actuator, the polarization processing of the stacked body 13 is performed by connecting lead wires to the external electrodes 15, respectively, and by applying through the lead wires a dc voltage of 0.1 to 3 kV/mm to a pair of the external electrodes 15, respectively. This achieves a piezoelectric actuator using the multilayer piezoelectric element of the present invention. The configuration is otherwise similar to those described in the first to fourth preferred embodiments, and therefore the description thereof is omitted.

Ninth Preferred Embodiment

Figure 14:
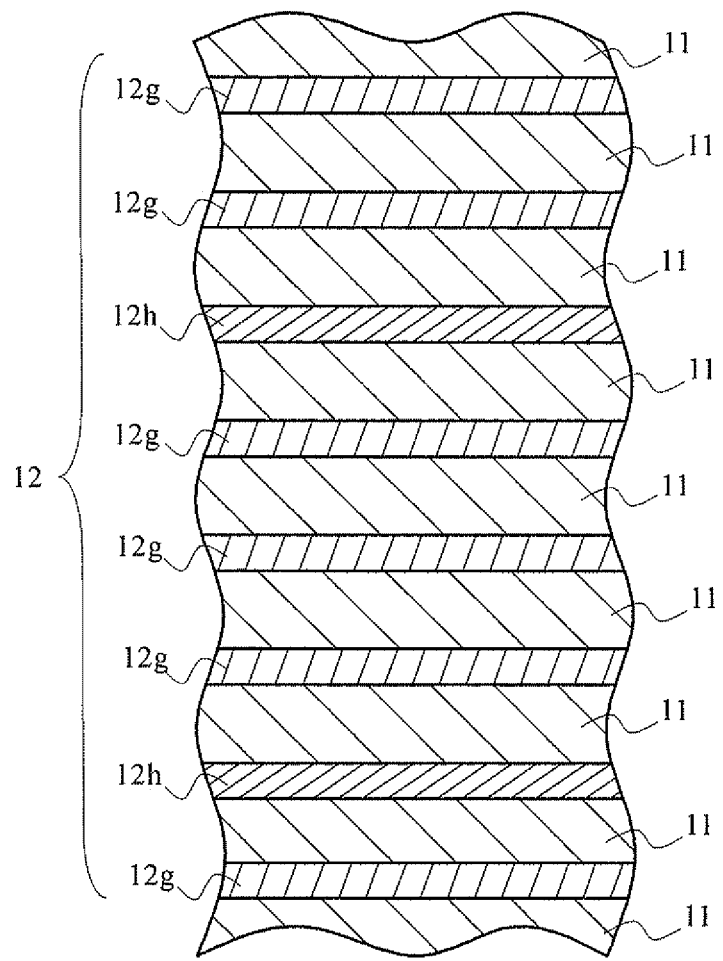
FIG. 14 is a partially enlarged cross section showing the stacked structure of a multilayer piezoelectric element according to a ninth preferred embodiment.

A ninth preferred embodiment related to a multilayer piezoelectric element of the present invention will next be described in detail with reference to the accompanying drawings. FIG. 14 is a partially enlarged cross section showing the stacked structure of a multilayer piezoelectric element according to the present embodiment. In FIG. 14, similar or equivalent parts to the configurations of FIGS. 1 to 13 as described above have similar reference numbers, and the description thereof is omitted.

As shown in FIG. 14, in the multilayer piezoelectric element of the present embodiment, a plurality of metal layers 12 are composed mainly of an alloy, and include a plurality of high-ratio metal layers 12h having a higher ratio of a component constituting the alloy than oppositely disposed metal layers 12g adjacent to each other in the stacking direction. That is, because the alloy can change its softness (hardness) freely by its composition, metal layers having partially different softenesses can be arranged by changing a part of a plurality of the metal layers 12 into a high-ratio metal layer 12h. Since the stress exerted on the piezoelectric element can be dispersed, the suppression of the element deformation due to stress concentration can be relaxed, thereby increasing the entire displacement of the piezoelectric element. Additionally, the stress concentration due to the element deformation can also be suppressed, and it is therefore possible to suppress the occurrence of delamination in the stacking interface, which can cause breakage, even in a long-term continuous driving under high voltage and high pressure.

As described above, the "high-ratio metal layer 12h" in the present embodiment is a metal layer having a higher ratio of one component constituting the alloy (for example, the ratio of silver constituting silver-palladium alloy) than oppositely disposed metal layers 12g adjacent to each other. A ratio B of one component in the high-ratio metal layer 12h may be set higher than a ratio A of one component in the oppositely disposed metal layer 12g adjacent thereto (B>A). The ratio B is set higher than the ratio A, preferably higher 0.1 and above % by mass, more preferably 0.5 to 10% by mass, and still more preferably 1 to 3% by mass. When the ratio B is set higher 0.1% by mass and above than the ratio A, it is capable of obtaining the effect of dispersing the stress exerted on the element. Particularly, when the ratio B is set higher 0.5% by mass and above than the ratio A, this effect is high. On the other hand, when the ratio B is set higher in the range exceeding 10% by mass, the coefficient of thermal expansion of the high-ratio metal layer 12h is different from the coefficient of thermal expansion of the adjacent and oppositely disposed metal layers 12g. Consequently, the difference in the coefficient of thermal expansion between the piezoelectric layer and the metal layer contributes to the occurrence of stress distribution, and a stress concentration point might occur in the multilayer piezoelectric element.

In the multilayer piezoelectric element of the present embodiment, the drivingly deformed regions correspond to the regions of the piezoelectric layer 11 where the metal layers 12 disposed on the opposed main surfaces of the piezoelectric layer 11 are overlapped in the stacking direction with the piezoelectric layer 11 in between. Therefore, in order to obtain the effect of the present embodiment, the ratio B of one component in the high-ratio metal layer 12h and the ratio A of one component in the metal layer 12g may satisfy the above relationship in the regions overlapping in the stacking direction with the piezoelectric layer 11 in between. Thus, the suppression of the element deformation due to stress concentration can be relaxed, thereby increasing the entire displacement of the piezoelectric element. Additionally, the stress concentration due to the element deformation can also be suppressed, and it is therefore possible to suppress the delamination at the stacking portions even in a long-term continuous driving under high voltage and high pressure. It is also possible to suppress resonance phenomena to be generated when the displacements (the dimensional changes) of the piezoelectric elements become identical. This enables prevention of beat sound generation and also prevention of harmonic signal generation, thereby suppressing the noise of control signals. In addition, by arranging a plurality of the high-ratio metal layers 12h, the magnitude of displacements of the multilayer piezoelectric element 13 can be controlled, thus eliminating the necessity to change the thicknesses of the piezoelectric layers 11. This provides the structure that is effective for mass production.

The alloy composition of the metal layers 12 can be measured as follows. That is, a part of the metal layer 12 is taken by, for example, cutting the stacked body 13 by the interface between the metal layer 12 and the piezoelectric layer 11 so as to expose the metal layer 12, followed by a chemical analysis, such as ICP (induction coupling plasma) light emission analysis. Alternatively, the cross-section obtained by cutting the multilayer piezoelectric element in the stacking direction may be analyzed by using SPMA (Electron Probe Micro Analysis) method or the like. When the metal layer on the cut surface of the multilayer piezoelectric element is observed with a SEM (scanning electron microscope) and a metal microscope, in some cases, not only metal components but also elements other than metal, such as voids and ceramic composition, are also contained. In this case, the part consisting only of the metal may be analyzed by SPMA method or the like. Thus, the alloy ratio of the high-ratio metal layer 12h and other metal layer 12g can be specified.

A plurality of the high-ratio metal layers 12h are arranged respectively, interposing in between one or a plurality of different metal layers 12g other than the high-ratio metal layer 12h. For example, when the alloy constituting the metal layer 12 is silver-palladium and the abovementioned one component is silver, for the following reason, the plurality of the high-ratio metal layers 12h are preferably arranged, respectively, interposing in between a plurality of the different metal layers 12g other than the high-ratio metal layers 12h. That is, when the high-ratio metal layers 12h and the different metal layer 12g are alternately and continuously stacked one by one, there is the merit that the stress in the inside of the multilayer piezoelectric element 13 is uniformly dispersed to all of the metal layers 12. On the other hand, the high-ratio metal layer 12h has a higher silver ratio than the different metal layer 12g, and hence the high-ratio metal layer 12h itself is soft. Therefore, if the layer number of the existing high-ratio metal layers 12h is substantially the same as the metal layers 12g, the driving displacement relaxation action is also enhanced, and driving displacement tends to decrease. Accordingly, by arranging a plurality of the high-ratio metal layers 12h so as to interpose in between a plurality of the different metal layers 12g, piezoelectric displacement can be increased at the locations in which a plurality of the different metal layers 12g are interposed. Further, the stress relaxing effect can be obtained at the locations of the plurality of the high-ratio metal layers 12h. This increases the entire element displacement and also suppresses the stress concentration due to the element deformation, thereby eliminating the possibility of flaking of the stacked portions even in a long-term continuous driving under high voltage and high pressure.

The alloy constituting the metal layers 12 is composed mainly of metal in groups 8 to 10 and/or metal in group 11 of the periodic table. This permits simultaneous sintering of the piezoelectric body and the metal layers, so that the connecting interfaces can be bound firmly. In addition, if the element is deformed thereby to apply stress onto the metal layers, because the metal layers can stretch themselves, the stress cannot concentrate at a point, thereby providing a piezoelectric actuator having excellent durability and high reliability.

It is particularly preferable that the alloy constituting the metal layers 12 is silver-palladium alloy, and the abovementioned one component is silver. The reason for this is as follows. That is, the multilayer piezoelectric element 13 can be obtained by sintering in an oxidation atmosphere. Further, because silver and palladium are completely solid-dissolved metals, a soft high-ratio metal layer 12h having stress relaxing effect can be formed throughout the metal layer surface, without forming any unstable inter-metal compound. Particularly, by using silver as the metal of the high-ratio composition, silver can be solid-dissolved in the liquid phase composition of ceramics when sintering the multilayer piezoelectric element, and the liquid phase forming temperature can be lowered to advance the sintering. This achieves strong mutually binding force between the metal layer 12 and the piezoelectric layer 11. Furthermore, the alloyzation enables formation of the metal layers 12 having stronger migration resistance than a single element, achieving the multilayer piezoelectric element with durability.

Preferably, the plurality of the high-ratio metal layers 12h are regularly arranged. With the irregular arrangement, the stress exerted on the entire multilayer piezoelectric element may concentrate at a location where the spacing between the high-ratio metal layers is large, and there is a likelihood that sufficient stress dispersing effect cannot be obtained. The regular arrangement of the high-ratio metal layers 12h enables effective dispersion of the stress exerted on the multilayer piezoelectric element. In the present embodiment, the expression that "the high-ratio metal layers are regularly arranged" includes the case where the layer number of the different metal layers 12g, which are present between the high-ratio metal layers 12h, is identical for each area between the high-ratio metal layers 12h, as well as the case where the layer number of the different metal layers 12g existing between the high-ratio metal layers 12h approaches such a degree that the stress will not concentrate at a portion. Specifically, the layer number of the different metal layers 12g existing between the high-ratio metal layers 12h is preferably within ±20% with respect to the average value of the respective layer numbers, more preferably within ±10% with respect to the average value of the respective layer numbers, and still more preferably all be identical number. Setting the layer number of the different metal layers 12g existing between the high-ratio metal layers 12h to the abovementioned range, the stress exerted on the multilayer piezoelectric element can be dispersed more effectively.

The adhesion between the high-ratio metal layer 12h and the piezoelectric layer 11 is preferably set lower than the adhesion between the different metal layer 12g other than the high-ratio metal layer 12h and the piezoelectric layer 11. Thus, in a state in which the high-ratio metal layer 12h has lower adhesion than the different metal layer 12g, when stress is exerted on the multilayer piezoelectric element, the high-ratio metal layer 12h, whose adhesion is weak, is deformed to relax the stress. In the piezoelectric layer 11 connected to the high-ratio metal layer 12h of weak adhesion, the contact area with the high-ratio metal layer 12h is reduced, thereby decreasing the force constraining the piezoelectric layer 11. This also enables to relax the stress exerted on the multilayer piezoelectric element, and avoid stress concentration at a point, achieving the multilayer piezoelectric element having excellent durability.

Preferably, the Vickers hardness of the high-ratio metal layer 12h is set lower than that of the different metal layer 12g. By setting the Vickers hardness of the high-ratio metal layer 12h to be lower than that of the different metal layer 12g, namely, by setting it to be a metal layer softener than the different metal layer 12g, when the piezoelectric element is driven, the high-ratio metal layer 12h becomes weak in the force constraining the piezoelectric layer 11 connected to the high-ratio metal layer 12h, enabling the piezoelectric layer 11 to cause a large displacement. This permits the multilayer piezoelectric element having high durability and a large displacement.

In the multilayer piezoelectric element according to the present embodiment, because the metal layer 12 has a small thickness in the stacking direction, the Vickers hardness of the metal layer 12 can be measured as follows. That is, the Vickers hardness is measured by using, for example, a Micro Vickers Tester such as Model MVK-H3 manufactured by Akashi Seisakusho Co., Ltd. The Vickers hardness of the metal layer 12 can also be measured by cutting the multilayer piezoelectric element in the vicinity of the interface between the metal layer 12 and the piezoelectric layer 11, and forcing a diamond probe into the metal layer 12. In order to avoid the influence of the piezoelectric layer 11 as a base, it is preferable to force the diamond probe into the metal layer 12 from a direction perpendicular to the stacking direction. When the metal layer 12 is exposed from the side surface of the piezoelectric element, the multilayer piezoelectric element is placed so that the diamond probe and the stacking direction of the metal layer 12 are perpendicular to each other, and the hardness is measured by directly forcing the diamond probe into the metal layer 12.

On the other hand, when the metal layer 12 is not exposed from the side surface of the piezoelectric element, the element is polished until the metal layer 12 is exposed, and then the hardness is measured in the same manner as described above. In order to expose the metal layer 12, instead of polishing, it may be cut with a dicing saw machine, or alternatively a luter may be used. No limitation is imposed on the technique as long as a flat surface can be formed without causing any cracks or the like.

A plurality of the different metal layers other than the high-ratio metal layer 12h are disposed between two pieces of the high-ratio metal layers 12h, and a tilted concentration part where the concentration of one component constituting the alloy is gradually reduced from the high-ratio metal layer side is present in a group of the different metal layers. By the presence of the tilted concentration part, the stress exerted on the multilayer piezoelectric element can be concentrated on the high-ratio metal layers 12h, and the stress can also be dispersed into the metal layer 12g (the metal layer 12g in the tilted concentration part) in the vicinity of the high-ratio metal layer 12h, thereby permitting the multilayer piezoelectric element having higher durability. The presence of the tilted concentration part in every area between the high-ratio metal layers 12h is more preferable for further enhancing durability.

On the other hand, when the high-ratio metal layer 12h and the metal layer 12g adjacent thereto have extremely different ratios of one component constituting the alloy, there is a likelihood that stress is liable to concentrate on the high-ratio metal layer 12h serving as the stress relaxing layer.

Like the foregoing preferred embodiments, the metal layers 12 preferably have a large number of voids in the present embodiment. Particularly, it is preferable that the different metal layer 12g other than the high-ratio metal layer is provided with voids, and the area ratio of the voids to the entire cross-sectional area in the cross section of the metal layer 12 is 5 to 70%. This is because the multilayer piezoelectric element having a larger displacement and excellent displacement property can be obtained by the presence of the voids constituting 5 to 70% of the area of the different metal layer 12g other than the high-ratio metal layer.

On the other hand, if the void ratio of the different metal layer 12g is smaller than 5%, the piezoelectric layers 11 are subjected to a large force of constraint from the metal layer 12g when the piezoelectric layers 11 are deformed by the applied voltage, thereby suppressing the deformation of the piezoelectric layers 11. Accordingly, there is the likelihood that the amount of deformation of the multilayer piezoelectric element is reduced, and the internal stress to be generated is also increased. On the other hand, when the void ratio is larger than 70%, extremely narrow portions may occur at the electrode portions. Therefore, the strength of the metal layers themselves may be lowered, so that cracks are liable to occur in the metal layers 12g, and disconnection might occur. The void ratio is more preferably 7 to 70%, and more preferably 10 to 60%. By so doing, the piezoelectric layers 11 can be more smoothly deformed, and the displacement of the multilayer piezoelectric element can be increased by the presence of sufficient electric conductivity of the metal layers 12.

It is also preferable that the area ratio of the voids to the entire cross-section area in the cross section of the high-ratio metal layer 12h is 20 to 90%. This is because the multilayer piezoelectric element having a larger displacement and excellent displacement property can be obtained by the presence of the voids constituting 20 to 90% of the area of the high-ratio metal layer 12h.

Further, the metal layers 12 composed mainly of metal and voids enable achievement of the multilayer piezoelectric element with higher durability, because both of the metal and the voids are deformable against stress. Particularly, when the high-ratio metal layer 12h rather than the different metal layer 12g other than the high-ratio metal layer is composed mainly of metal and voids, because both of the metal and the voids are deformable against stress, the stress relaxing effect can be improved, permitting the multilayer piezoelectric element with higher durability.

Preferably, the high-ratio metal layer 12h takes the form that a plurality of alloys are scattered. That is, the high-ratio metal layer 12h is preferably formed by a plurality of conductive regions scattered in the shape of islands. By the plurality of the conductive regions scattered in the high-ratio metal layer 12h, even if the stress exerted on the multilayer piezoelectric element 13 is propagated to the metal layers 12, the stress propagation within the high-ratio metal layer 12h can be suppressed, causing no particular location where the stress is concentrated in the high-ratio metal layer 12. Consequently, stress relaxation and durability are compatible.

On the other hand, in cases where the high-ratio metal layer 12h is composed of a single continuous layer, when the stress exerted on the multilayer piezoelectric element 13 concentrates on the high-ratio metal layer 12h, the stress will propagate and concentrate at the portion of the interface with the piezoelectric layer 11 which is faced to the side surface of the piezoelectric element. Hence, there is the likelihood of occurrence of the location at which the stress particularly concentrates.

Also in the present embodiment, the main component is preferably a metal composition satisfying the following relationships of: $0<M1\leq15$, $85\leq M2<100$, $M1+M2=100$, where M1 (% by mass) is a palladium content, and M2 (% by mass) is a silver content in the metal layer 12.

A description will next be made of a method of manufacturing the multilayer piezoelectric elements according to the ninth preferred embodiment.

Firstly, in the same manner as in the first to eighth preferred embodiments, ceramic green sheets serving as the piezoelectric layers 11 are manufactured. Subsequently, a conductive paste is prepared by adding while mixing binder and plasticizer, etc. in metal powder composing the metal layers 12, such as silver-palladium alloy. The conductive paste is then printed in a thickness of 1 to 40 μm on the upper surfaces of the respective green sheets by screen printing or the like.

In the conductive paste for forming the high-ratio metal layer 12h, the amount of one component in metal powder contained in the conductive paste is set larger than the amount of one component contained in the conductive paste for forming the different metal layer 12g. Specifically, when silver-palladium as an alloy is used to increase the silver component of the high-ratio metal layer 12h, a metal paste containing much silver component in the alloy composition is used to form the high-ratio metal layer 12h, and a metal paste containing less silver component in the alloy composition is used to form the different metal layer 12g other than high-ratio metal layer. Instead of the alloy powder, a mixed powder of silver powder and palladium powder may be used to adjust the composition. Alternatively, silver powder or palladium powder may be added into the silver-palladium alloy in order to adjust the composition. It is however preferable to add initially alloy powders having different compositions, because the metal dispersion within the paste becomes uniform, and the composition distribution within the same surface of the metal layer 12 becomes uniform.

Subsequently, a plurality of the green sheets with the conductive paste printed thereon are stacked one upon another, and debindered at a predetermined temperature. Thereafter, this is sintered at 900 to 1200° C., thereby manufacturing the stacked body 13. The inactive layers 14 may be formed in the same manner as in the foregoing first to eight preferred embodiments.

Next, external electrodes 15 are formed in the same manner as in the first to eighth preferred embodiments. Silicone rubber is filled into the groove of the stacked body 13, and silicone rubber is coated on the side surfaces of the stacked body 13 in the same manner as in the first to eighth preferred embodiments. Then, in the stacked body 13 provided with the external electrodes 15, silicone rubber is filled into the groove of the stacked body 13 and also coated on the side surfaces of the stacked body 13. Thereafter, the silicone rubber, which has been filled into the groove and coated on the side surface of the stacked body 13, is then cured, thereby completing the multilayer piezoelectric element of the present embodiment.

Finally, the polarization processing of the stacked body 13 is performed by connecting lead wires to the external electrodes 15, respectively, and then applying through the lead wires a dc voltage of 0.1 to 3 kV/mm to the pair of the external electrodes 15, respectively. This results in a piezoelectric actuator using the multilayer piezoelectric element of the present invention. The configuration is otherwise similar to those described in the first to eighth preferred embodiments, and therefore the description thereof is omitted.

While the ninth preferred embodiment has been described, the multilayer piezoelectric elements of the present invention are not be limited to the ninth preferred embodiment but are susceptible of various changes without departing from the gist of the present invention. For example, although the ninth preferred embodiment has described the case where all of the metal layers are composed of the alloy, a part of the multilayers may be composed of an alloy, and the rest may be composed of a single metal, as in a tenth preferred embodiment descried later. Although the ninth preferred embodiment has described the case where the metal layers contain the same composition, the metal layers may be composed of at least two kinds of layers having different main compositions, as in an eleventh preferred embodiment to be described later.

Tenth Preferred Embodiment

Figure 15:
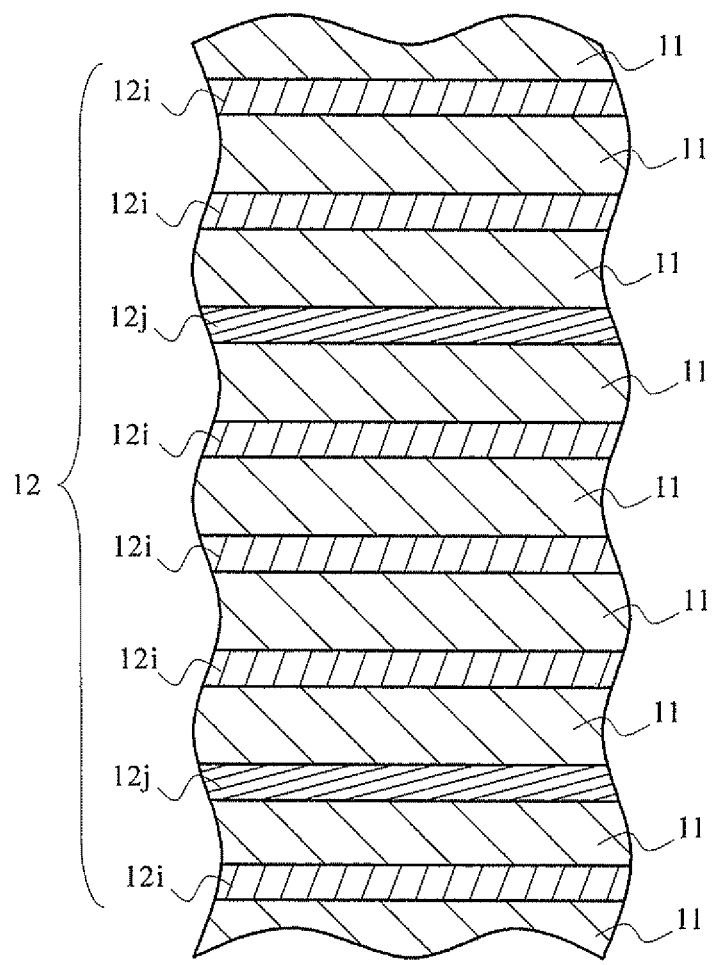
FIG. 15 is a partially enlarged cross section showing the stacked structure of a multilayer piezoelectric element according to a tenth preferred embodiment.

A tenth preferred embodiment related to a multilayer piezoelectric element of the present invention will next be described with reference to the drawing. FIG. 15 is a partially enlarged cross section showing the stacked structure of a multilayer piezoelectric element according to the present embodiment. In FIG. 15, similar or equivalent parts to the configurations of FIGS. 1 to 14 as described above have similar reference numbers, and the description thereof is omitted.

The multilayer piezoelectric element of the present embodiment has a stacked body 13 in which a plurality of piezoelectric layers 11 and a plurality of metal layers 12 (12i, 12j) are stacked alternately, and these metal layers 12 include a plurality of high-ratio metal layers 12j having a higher ratio of at least one component constituting the metal layers 12 than oppositely disposed metal layers 12i adjacent to each other in the stacking direction.

By including the plurality of the high-ratio metal layers 12j, the metal layers having partially different softenesses (hardnesses) can be arranged, thereby dispersing the stress exerted on the piezoelectric element. Since the suppression of the element deformation due to stress concentration can be relaxed, the displacement of the entire element can be increased, and the stress concentration due to the element deformation can also be suppressed. This enables suppression of flaking of the stacked portions even in a long-term continuous driving under high voltage and high pressure.

The drivingly deformed locations of the piezoelectric layers 11 correspond to the locations sandwiched between the metal layers 11. Therefore, it is preferable to form metal layers having different metal compositions at the portions of the metal layers 12 which are overlapped with the piezoelectric layer 11 in between. This can suppress resonance phenomena to be generated when the displacements (the dimensional changes) of the elements become identical. This also enables prevention of beat sound generation and prevention of harmonic signal generation, thereby suppressing the noise of control signals. In addition, by changing the metal composition of the metal layers, the magnitude of displacement of the multilayer piezoelectric element 13 can be controlled, thus eliminating the necessity to change the thicknesses of the piezoelectric layers 11. This provides the structure that is effective for mass production. The metal composition of the metal layers can be measured by the same method as described above.

Preferably, a plurality of the high-ratio metal layers 12j are arranged respectively, interposing in between a plurality of different metal layers 12i other than the high-ratio metal layers 12j. When the high-ratio metal layers 12j and the different metal layer 12i are alternately and continuously stacked one by one, the stress in the inside of the multilayer piezoelectric element 13 is uniformly dispersed to all of the metal layers 11, while the driving displacement will also be relaxed when the multilayer piezoelectric element is driven. Accordingly, by arranging a plurality of the high-ratio metal layers 12j so as to interpose in between a plurality of the different metal layers 12i, piezoelectric displacement can be increased at the locations in which a plurality of the different metal layers 12i are interposed, thereby permitting the stress relaxation at the locations of the plurality of the high-ratio metal layers 12j. This increases the entire element displacement and also suppresses the stress concentration due to the element deformation, thereby suppressing flaking of the stacked portions even in a long-term continuous driving under high voltage and high pressure.

Specifically, it is preferable that the one component constituting the metal layers 12 be silver, the different metal layers 12i be composed of silver-palladium alloy, and the high-ratio metal layers 12j be composed of silver. The reason for this is as follows. That is, the multilayer piezoelectric element 13 can be obtained by sintering in an oxidation atmosphere. Further, because silver and palladium are completely solid-dissolved metals, a soft high-ratio metal layer producing stress relaxing effect can be formed throughout the metal layer surface, without forming any unstable inter-metal compound. Particularly, by using silver as the metal of the high-ratio composition, silver can be solid-dissolved in the liquid phase composition of ceramics when sintering the multilayer piezoelectric element, and the liquid phase forming temperature can be lowered to advance the sintering. This achieves strong mutually binding force between the metal layer 12 and the piezoelectric layer 11. Furthermore, the alloyzation enables formation of the metal layers having stronger migration resistance than a single element, achieving the multilayer piezoelectric element with durability.

Thus, under the condition that high-ration metal layers 12j are composed mainly of silver, and the different metal layers 12i other than the high-ratio metal layers are composed mainly of silver-palladium alloy, the largest stress relaxing effect is attained. When the high-ratio metal layers 12*j* are adjacent to each other with the piezoelectric layer 11 in between, the migration of silver might cause insulation failure. In this case, because the metal layer adjacent to the high-ratio metal layer 12*j* composed mainly of silver is the metal layer 12*i* composed mainly of silver-palladium alloy, if silver attempts to migrate, it combines with palladium and eliminates floating silver ions, achieving stabilization. As a result, no insulation failure due to migration may occur, permitting the multilayer piezoelectric element having high durability.

For the same reason as described in the ninth preferred embodiment, it is preferable that the plurality of the high-ratio metal layers 12*j* be regularly arranged, and more preferably, the adhesion between the high-ratio metal layer 12*j* and the piezoelectric layer 11 is lower than the adhesion between the different metal layer 12*i* and the piezoelectric layer 11. It is also preferable that a plurality of the different metal layers 12*i* be disposed between the two high-ratio metal layers 12*j*, and there be a tilted concentration part where the concentration of one component is gradually reduced from the high-ratio metal layer 12*j* is present in a group of the different metal layers 12*i*. It is more preferable that the metal layers 12 have a plurality of voids, and the high-ratio metal layers 12*j* are formed by a plurality of conductive films scattered in the shape of islands.

Also in the present embodiment, the main component is preferably a metal composition satisfying the following relationships of: $0 \leq M1 \leq 15$, $85 \leq M2 \leq 100$, $M1+M2=100$, where M1 (% by mass) is a palladium content, and M2 (% by mass) is a silver content in the metal layer 12*i*.

A method of manufacturing the multilayer piezoelectric element according to the tenth preferred embodiment may be the same as that in the ninth preferred embodiment, except that silver powder is added to a conductive paste for forming the high-ration metal layers 12*j*.

The configuration is otherwise similar to those described in the first to ninth preferred embodiments, and therefore the description thereof is omitted.

Eleventh Preferred Embodiment

Figure 16:
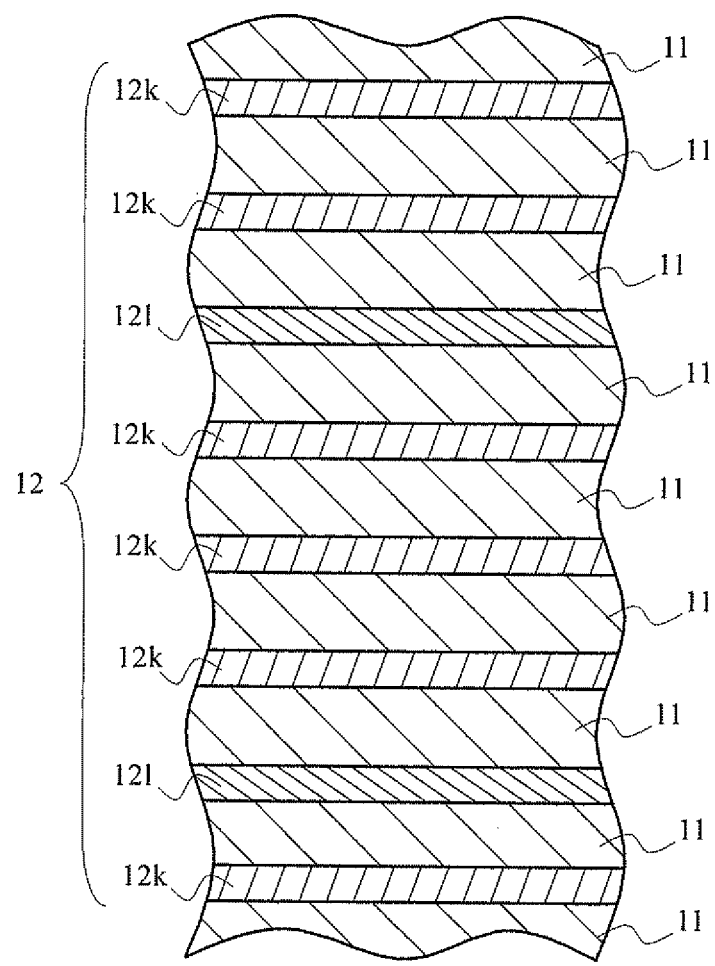
FIG. 16 is a partially enlarged cross section showing the stacked structure of a multilayer piezoelectric element according to an eleventh preferred embodiment.

An eleventh preferred embodiment related to a multilayer piezoelectric element of the present invention will next be described in detail with reference to the accompanying drawings. FIG. 16 is a partially enlarged cross section showing the stacked structure of a multilayer piezoelectric element according to the present embodiment. In FIG. 16, similar or equivalent parts to the configurations of FIGS. 1 to 15 as described above have similar reference numbers, and the description thereof is omitted.

The multilayer piezoelectric element of the present embodiment has a stacked body 13 in which a plurality of piezoelectric layers 11 and a plurality of metal layers 12 are stacked alternately. These metal layers 12 are composed of two kinds of metal layers 12*k* and 12*l* having different main components, and a plurality of the metal layers 12*l* are interposed between a plurality of different metal layers 12*k*. The softness (hardness) of the metal layers can be changed freely by the composition thereof. In the present embodiment, the above arrangement of the two kinds of the metal layers 12*k* and 12*l* having different main components enables the arrangement of the metal layers having partially different softnesses, thereby dispersing the stress exerted on the element. This relaxes the suppression of the element deformation due to stress concentration, thereby increasing the displacement of the entire piezoelectric element. Additionally, the stress concentration due to the element deformation can also be suppressed, thereby suppressing flaking of the stacked portions even in a long-term continuous driving under high voltage and high pressure.

Specifically, it is preferable that the metal layers 12*l* be composed mainly of silver-palladium alloy, and the different metal layers 12*k* be composed mainly of copper. This enables the multilayer piezoelectric element 13 to be configured by sintering in reducing atmosphere such as nitrogen atmosphere. Further, since silver and copper and palladium are solid-dissolved metals, it becomes the soft metal layers producing stress relaxing effect throughout the metal layer surfaces, without forming any unstable inter-metal compound.

Particularly, by using silver-palladium alloy as the main component of the metal layers 12*l* interposing in between a plurality of the different metal layers 12*k*, silver can be solid-dissolved in the liquid phase composition of ceramics when sintering the multilayer piezoelectric element, and the liquid phase forming temperature can be lowered to advance the sintering. This achieves strong mutually binding force between the metal layer 12 and the piezoelectric layer 11. Furthermore, the alloyzation enables formation of the metal layers having stronger migration resistance than a single element, achieving the multilayer piezoelectric element with durability.

Thus, under the condition that the metal layers 12*l* are composed mainly of silver, and the different metal layers 12*k* are composed mainly of copper, the largest stress relaxing effect is attained. When the metal layers 12*l* composed mainly of silver are adjacent to each other with the piezoelectric layer 11 in between, the migration of silver might cause insulation failure. In the present embodiment, because the metal layer adjacent to the metal layer 12*l* composed mainly of silver is the metal layer 12*k* composed mainly of copper, if silver attempts to migrate, it combines with copper and eliminates floating silver ions, achieving stabilization. As a result, no insulation failure due to migration may occur, permitting the multilayer piezoelectric element having high durability.

For the same reason as described in the ninth preferred embodiment, it is preferable that the plurality of the metal layers 12*l* be regularly arranged, and more preferably, the adhesion between the metal layer 12*l* and the piezoelectric layer 11 be lower than the adhesion between the different metal layer 12*k* and the piezoelectric layer 11. It is also preferable that a plurality of the different metal layers 12*k* be disposed between the two metal layers 12*l*, and a tilted concentration part where the concentration of one component is gradually reduced from the metal layer 12*l* be present in a group of the different metal layers 12*k*. It is more preferable that the metal layers 12 have a plurality of voids. Particularly, it is preferable that the different metal layers 12*k* have voids, and the area ratio of the voids to the entire cross-sectional area in the cross section of the metal layers 12*k* be 5 to 70%. This is because the voids constituting 5 to 70% to the area of the metal layers 12*k* can increase displacement, thereby obtaining the multilayer piezoelectric element having excellent displacement.

If the void ratio of the metal layers 12*k* is smaller than 5%, the piezoelectric layers 11 are constrained by the metal layers when the piezoelectric layers 11 are deformed by the applied electric field, thereby suppressing the deformation of the piezoelectric layers 11. This reduces the amount of deformation of the multilayer piezoelectric element, and increases the internal stress to be generated. As a result, durability might be affected. On the other hand, if the void ratio of the metal layers 12*k* is larger than 70%, extremely narrow portions may occur at the electrode portions. Therefore, the strength of the metal layers themselves may be lowered, and cracks are liable to occur in the metal layers. Undesirably, disconnection might occur. More preferred void ratio is 7 to 70%, and still more preferred is 10 to 60%. By so doing, the piezoelectric layers 11 can be more smoothly deformed, and the displacement of the multilayer piezoelectric element can be increased by the sufficient electric conductivity of the metal layers 12.

It is also preferable that the area ratio of the voids to the entire cross-sectional area in the cross section of the metal layers 12l be 24 to 90%. This is because the voids constituting 24 to 90% to the area of the metal layers 12l can further increase displacement, thereby obtaining the multilayer piezoelectric element having excellent displacement.

Further, the metal layers 12 composed mainly of metal and voids enable achievement of the multilayer piezoelectric element with higher durability, because both of the metal and the voids are deformable against stress. Particularly, when the metal layer 12l rather than the metal layer 12k is composed mainly of metal and voids, because both of the metal and the voids are deformable against stress, the stress relaxing effect can be improved, permitting the multilayer piezoelectric element with higher durability.

More preferably, the metal layer 12l takes the form that a plurality of metal are scattered. That is, the metal layer 12l is preferably formed by a plurality of conductive regions scattered in the shape of islands. By the plurality of the conductive regions scattered in the metal layer 12l, even if the stress exerted on the multilayer piezoelectric element 13 is propagated to the metal layers 12, the stress propagation within the metal layer 12l can be suppressed, causing no particular location where the stress is concentrated in the metal layer 12l. Consequently, stress relaxation and durability are compatible.

Also in the present embodiment, the main component is preferably a metal composition satisfying the following relationships of: $0 \leq M1 \leq 85 \leq M2 \leq 100$, $M1+M2=100$, where M1 (% by mass) is a palladium content, and M2 (% by mass) is a silver content in the metal layer 12l. The reason for this is as follows. That is, when the palladium exceeds 15% by mass, specific resistance is increased, and when the multilayer piezoelectric element is continuously driven, the metal layers 12 generate heat. The heat generation acts on the piezoelectric layers 11 having temperature dependency thereby to reduce the displacement characteristic thereof, and in some cases, the element displacement may become small. Further, when the external electrodes 15 are formed, the external electrodes 15 and the metal layers 12 are mutually diffused and connected to each other. However, if the palladium exceeds 15% by mass, this increases the hardness of locations where the metal layer composition is diffused into the external electrodes 15. Therefore, durability might be lowered in the multilayer piezoelectric element causing dimensional changes during driving.

A method of manufacturing the multilayer piezoelectric element according to the eleventh preferred embodiment may be the same as that in the ninth preferred embodiment, except that copper powder is added to a conductive paste for forming the different metal layers 12k. For the purpose of improving connecting strength between the external electrodes 15 and the metal layers 12, it is preferable to use a metal paste composing mainly of copper as the metal constituting the external electrodes 15. In order to configure the external electrodes 15, irrespective of silver electrodes or copper electrodes, the oxidation of the metal layers 12 can be suppressed by performing sintering in reducing atmosphere such as nitrogen atmosphere, thereby achieving the metal layers 12 having high durability.

Although the eleventh preferred embodiment has described the case where a plurality of metal layers are composed of two kinds of metal layers having different main components, the effect of the present invention is obtainable as long as there are a plurality of metal layers consisting of at least two kinds of metal layers having different main components, and a plurality of metal layers of one of the two kinds are arranged interposing in between a plurality of metal layers of the other type. That is, by configuring so that the stress exerted on the piezoelectric element is concentrated in the vicinity of the metal layers having different main metal components, and the collected stress is confined by using, as a stress relaxing layer, the piezoelectric layers around the metal layers, the collected stress can be confined between the two metal layers having high metal composition. This enables relaxation of the stress exerted on the entire piezoelectric element, thereby providing a piezoelectric actuator having excellent durability and high reliability.

Twelfth Preferred Embodiment

A twelfth preferred embodiment related to a multilayer piezoelectric element of the present invention will next be described. In the conventional multilayer piezoelectric elements, attempts have been made to form uniform metal layers so that an electric field can be applied uniformly to all of piezoelectric bodies. Particularly, for the purposes of making uniform the electric conductivity of the respective metal layers, and making uniform the surface area of the portions connected to the piezoelectric bodies, attempts have been made to make uniform the metal filling rates of the metal layers. Therefore, the stress along with displacement may concentrate at the outer periphery of the center in the stacking direction of a multilayer piezoelectric element, causing disadvantages such as cracks.

Especially, in multilayer piezoelectric elements of simultaneous sintering type, and multilayer piezoelectric elements of the type in which at least part of the outer periphery of a piezoelectric body is constrained, there is a high possibility that stress may concentrate at the outer periphery of the center of the element when the element is continuously driven for a long period of time under high voltage and high pressure. This leads to cracks and flaking, and contributes to the problem of displacement variations.

The present inventors have found the following new fact and completed the present embodiment. That is, the multilayer piezoelectric elements having excellent durability can be obtained by arranging a plurality of high-resistance metal layers having a higher electrical resistance than oppositely disposed metal layers adjacent to each other, and there is no variation in displacement when the element is continuously driven for a long period of time under high voltage and high pressure.

Specifically, the multilayer piezoelectric element according to the present embodiment can take the following configurations.

(1) A multilayer piezoelectric element in which a plurality of piezoelectric layers and a plurality of metal layers are stacked alternately, in which a plurality of the metal layers include a plurality of high-resistance metal layers having a higher resistance than oppositely disposed metal layers adjacent to each other in a stacking direction.

(2) The multilayer piezoelectric element as set forth in the above (1), in which a plurality of the high-resistance metal layers are respectively arranged interposing in between a plurality of different metal layers other than the high-resistance metal layers.

(3) The multilayer piezoelectric element as set forth in the above (1) or (2), in which the high-resistance metal layers are regularly arranged.

(4) The multilayer piezoelectric element as set forth in any one of the above (1) to (3), in which the high-resistance metal layers have a higher internal void ratio than the different metal layers.

(5) The multilayer piezoelectric element as set forth in any one of the above (1) to (3), in which the high-resistance metal layers include a high resistance component having a higher electrical resistance than the different metal layers, a content of the high resistance component is higher than a content of the different metal layers.

(6) The multilayer piezoelectric element as set forth in any one of the above (1) to (5), in which the high-resistance metal layers have a smaller thickness than the different metal layers.

(7) The multilayer piezoelectric element as set forth in any one of the above (1) to (6), in which an electrical resistance of the high-resistance metal layers is 1/10 to 1000 times greater than that of the piezoelectric layers.

(8) The multilayer piezoelectric element as set forth in any one of the above (1) to (7), in which the electrical resistance of the high-resistance metal layers is at least 1000 times greater than that of the different metal layers.

In accordance with the present embodiment, a plurality of the metal layers include a plurality of high-resistance metal layers having a higher electrical resistance than adjacent and oppositely disposed metal layers. With the arrangement of a plurality of the high-resistance metal layers, the piezoelectric layers connected to the high-resistance metal layers can have a small displacement. By the presence of a plurality of the piezoelectric layers having a small displacement in the multilayer piezoelectric, stress distribution generated by displacement can be dispersed, thereby suppressing the occurrence of cracks. If cracks occur, the progress thereof can be suppressed. Consequently, even in a long-term continuous driving under high voltage and high pressure, it is capable of suppressing the change in the desired displacement, thereby providing the multilayer piezoelectric element having excellent durability and high reliability.

By using the multilayer piezoelectric element of the present embodiment, it is capable of providing an injector having excellent durability and high reliability. That is, the injector contains the multilayer piezoelectric element as set forth in any of the above (1) to (8), in a container having an injection hole.

The multilayer piezoelectric elements according to the present embodiment will be described in detail with reference to the accompanying drawings. FIG. 18 is a schematic cross section showing the stacked structure of metal layers connected to piezoelectric layers of the multilayer piezoelectric element according to the present embodiment. In FIG. 18, similar or equivalent parts to the configurations of FIGS. 1 to 17 as described above have similar reference numbers, and the description thereof is omitted.

As shown in FIG. 18, in the multilayer piezoelectric element of the present embodiment, a plurality of metal layers 12 include a plurality of high-resistance metal layers 12*m* having a higher electrical resistance than adjacent and oppositely disposed metal layers. These high-resistance metal layers 12*m* are arranged interposing in between a plurality of different metal layers 12*n* other than the high-resistance metal layers 12*m*. That is, a plurality of the metal layers 12 are composed of a plurality of the metal layers 12*n* and a plurality of high-resistance metal layers 12*m* having a higher electrical resistance than the metal layers 12*n*.

In the conventional multilayer piezoelectric elements, substantially uniform metal layers 12 are formed so that an electric field can be applied uniformly to all of the piezoelectric layers 11. Therefore, during driving, the element itself continuously causes dimensional changes, so that all of the piezoelectric bodies 11 are closely driven with the metal layer 12 in between. The multilayer piezoelectric element will therefore cause driving deformation as a whole. Consequently, the stress due to the element deformation will concentrate at the outer periphery of the center of the element, which expands at the time of compression, and necks at the time of stretch. When the element is continuously driven for a long period of time under high voltage and high pressure, there has been the problem that the stacked portions (the interface between the piezoelectric layer and the metal layer) may be flaked, or cracks may occur.

On the other hand, as in the present embodiment, the arrangement of a plurality of the high-resistance metal layers 12*m* permits dispersion of the stress generated by displacement, thus enabling suppression of the occurrence of cracks and a reduction in displacement variations even in a long-term continuous driving under high voltage and high pressure, thereby achieving an improvement of durability. The piezoelectric layers 11 connected to the high-resistance metal layers 12*m* cause less displacement than the piezoelectric layers 11 connected to the different metal layers 12*n*. This means that there exist a plurality of the piezoelectric layers 11 having a small displacement, thereby producing a state in which the element is not drivingly deformed as a whole, but a plurality of regions divided by the high-resistance metal layers 12*m* are drivingly deformed, respectively. Hence, the element of the present embodiment enables the stress, which has conventionally been concentrated at the center of the element, to be dispersed for each of these regions, thereby exhibiting excellent durability even under high voltage and high pressure. In the event of the partial flaking of the stacked portions or the occurrence of cracks, the piezoelectric layers 11 having a small displacement can suppress the progress of the cracks. For the above reason, it is estimated that durability can be improved thereby to achieve the element having high reliability.

Although a larger number of the high-resistance metal layers 12*m* disperse more stress and achieve more improvement of durability, and too large number thereof tends to reduce displacement. Therefore, a suitable number thereof is not more than 20% of the total number of the piezoelectric layers 11.

Preferably, the high-resistance metal layers 12*m* are regularly arranged in the stacking direction of the multilayer piezoelectric element. That is, a plurality of the different metal layers 12*n* are interposed between the two high-resistance metal layer 12*m*, so that a plurality of the high-resistance metal layers 12*m* are substantially regularly arranged in the stacking direction. This arrangement enables the occurrence of stress generated by displacement to be substantially uniformly dispersed by the portions divided by the high-resistance metal layers 12, respectively. This systematic stress dispersion permits suppression of the occurrence of cracks and suppression of displacement variations during driving, thereby improving durability.

In the present embodiment, the expression that "the high-resistance metal layers are regularly arranged" includes the case where the layer number of the different metal layers 12*n*, which are present between the high-resistance metal layers 12*m*, is identical for each area between the high-resistance metal layers 12*m*, as well as the case where the layer number of the different metal layers 12*n* existing between the high-resistance metal layers 12m approaches such a degree that the stress can be dispersed substantially uniformly in the stacking direction. Specifically, the layer number of the different metal layers 12n existing between the high-resistance metal layers 12m is preferably within ±20% with respect to the average value of the respective layer numbers, more preferably within ±10% with respect to the average value of the respective layer numbers, and still more preferably all be identical number.

The void ratio in the high-resistance metal layers 12m is preferably larger than the void ratio in the different metal layers 12n. Under the condition that the high-resistance metal layers 12m have a larger void ratio than the different metal layers 12n, the piezoelectric layer 11 connected to the high-resistance metal layer 12m causes less displacement than the piezoelectric layer 11 whose both main surfaces are connected to the different metal layer 12n. Thus, the regions, each of which is divided by the piezoelectric layers 11 having a small displacement, has a smaller displacement than the displacement of the entire multilayer piezoelectric element. These regions are therefore capable of suppressing cracks generated in the outer periphery of the multilayer piezoelectric element, permitting an improvement of durability. Additionally, a large void ratio enables stress absorption, permitting a further improvement of durability.

The porosity (void ratio) of the high-resistance metal layers 12m is preferably 40% to 99%, and more preferably 50 to 90%. The reason for this is as follows. That is, when the void ratio is smaller than 40%, the electrical resistances of the metal layers are not increased, and there is the likelihood that the displacement of the piezoelectric layers 11 connected thereto cannot be sufficiently reduced. On the other hand, when the void ratio is larger than 99%, the strengths of the high-resistance metal layers 12m are lowered, and there is the likelihood that the high-resistance metal layers 12m will be broken.

As described above, the porosity (void ratio) is a measured value of a cross section obtained by cutting the multilayer piezoelectric element by a plane parallel to the stacking direction, or a plane perpendicular to the stacking direction. Specifically, the measured value is obtained by measuring the sectional areas of voids existing in the cut surface in a single high-resistance metal layer, and dividing the obtained sectional areas by the total of the sectional areas of the high-resistance metal layers 12m, and then multiplying the result by 100. Although no special limitation is imposed on the diameters of the voids, it is preferably 3 to 100 μm, and more preferably 5 to 70 μm.

It is preferable that the high-resistance metal layers 12m contain a high-resistance component having a high electrical resistance than the different metal layers 12n, and the content of the high-resistance component be higher than the content of a high-resistance component in the different metal layers 12n. A large content of the high-resistance component in the high-resistance metal layers 12m enables formation of the metal layers having a high electrical resistance even if the amount of voids is substantially reduced. Even with the arrangement of a plurality of the high-resistance metal layers 12m thus formed, the displacement variations can be further reduced. Although no special limitation is imposed on the diameter of the high-resistance component, it is preferably 0.1 to 100 μm, and more preferably 0.1 to 50 μm.

The content of the high-resistance component is preferably 40% to 99%, and more preferably 50 to 90%. The content of the high-resistance component can be obtained by taking a SEM photograph of a surface parallel to the high-resistance metal layer 12m, measuring the area of the high-resistance component in the surface, dividing the obtained area by the entire area, and then multiplying the result by 100. Examples of the high-resistance component are lead zirconate titanate (PZT), lead titanate, alumina, titania, silicon nitride and silica.

The thickness of the high-resistance metal layer 12m is preferably smaller than the thickness of the different metal layer 12n. The reason for this is that the high-resistance metal layer 12m having a smaller thickness than the different metal layer 12n facilitates its deformation than the different metal layer 12n, enabling a reduction in the resistance generated in the piezoelectric layer 11 adjacent to the high-resistance metal layer. This permits an improvement of durability. Additionally, when the high-resistance metal layer has a smaller thickness than the different metal layer, the metal layers are easy to deform and absorb stress. This makes the metal layers difficult to flake, permitting an improvement of durability.

The metal layer thickness in the present embodiment is measured on a surface obtained by cutting the multilayer piezoelectric element in the stacking direction. Firstly, arbitrary five locations in the different metal layer are selected, and the thickness of each location is measured by sandwiching each location by arbitrary two parallel lines. Specifically, one of the two parallel lines is set on the boundary between the metal layer and the piezoelectric layer, and the other line is shifted to another boundary. Then, the distance between the two parallel lines is measured. A similar measurement is made for the high-resistance metal layer 12m to determine its thickness. Although no limitation is imposed on the thickness of the high-resistance metal layer 12m, it is preferably 30 to 0.1 μm, and more preferably 20 to 1 μm. The thickness of the different metal layer 12n is preferably 103% and above, and more preferably 110% and above to that of the high-resistance metal layer.

Preferably, the ratio of the electrical resistance of the high-resistance metal layer 12m to the piezoelectric layer 11 is 1/10 (namely 0.1) to 1000 times. Within this range, the displacement of the piezoelectric layer 11 connected to the high-resistance layer 12m can be controlled suitably. When the ratio of the electrical resistance of the high-resistance metal layer 12m to the piezoelectric layer 11 is smaller than 1/10, the displacement of the piezoelectric layer 11 connected to the high-resistance metal layer 12m makes no difference from the displacement of other piezoelectric layer 11. There is the likelihood that sufficient stress dispersing effect cannot be obtained. On the other hand, when the ratio of the electrical resistance of the high-resistance metal layer 12m to the piezoelectric layer 11 is over 1000 times, the displacement of the piezoelectric layer 11 connected to the high-resistance metal layer 12m becomes too small, thereby being susceptible to stress concentration. For the same reason, the ratio of the electrical resistance of the high-resistance metal layer 12m to the piezoelectric layer 11 is preferably 1 to 1000 times.

The electrical resistance ($\Omega$) in the present embodiment can be measured as follows. That is, using a pico-ampere meter (for example, 4140B, manufactured by Hewlett-Packard Company), measurements are made in each layer by applying probes to both ends of the high-resistance metal layer 12m or the both ends of the piezoelectric layer 11, respectively. As used here, "the both ends of the high-resistance metal layer 12m" means the ends of the high-resistance metal layer 12m exposed to the two opposed side surfaces of the stacked body 13, respectively. If the ends of the high-resistance metal layer 12m are not exposed to the side surfaces of the stacked body 13, polishing may be performed with a known polishing device or the like until the ends of the high-resistance metal layer 12m are exposed. Thereafter, the electrical resistance is measured by applying the probes of the pico-ampere meter to the both ends of the high-resistance metal layer 12m, respectively. When making measurements of the electrical resistance, a suitable temperature is 25° C.

Preferably, the electrical resistance of the high-resistance metal layer 12m is 1000 times and above of the electrical resistance of the different metal layer 12n. This ensures that the displacement of the piezoelectric layer 11 connected to the high-resistance metal layer 12m is smaller than that of the piezoelectric layer 11 connected to the different metal layer 12n. Hence, the multilayer piezoelectric element can be divided by the high-resistance metal layers 12m, so that the stress can be dispersed, permitting an improvement of durability.

Next, a description will be given of a method of manufacturing the multilayer piezoelectric element according to the twelfth preferred embodiment.

Firstly, a plurality of ceramic green sheets serving as the piezoelectric layers 11 are manufactured. Subsequently, a conductive paste is prepared by containing an organic matter (for example, acryl beads), which are bindingly fixed during drying, and volatized during sintering, in metal powder composing the high-resistance metal layers 12m, such as silver-palladium, and by adding while mixing binder and plasticizer. The conductive paste is then printed in a thickness of 1 to 40 μm on the upper surfaces of a part of the above green sheets by screen printing or the like.

Here, changing the ratio of the acryl beads and the metal powder can change the void ratio of the high-resistance metal layers. That is, a high ratio of the acryl beads increases the void ratio, and a low ratio of the acryl beads decreases the void ratio. The diameter of the voids can be adjusted by changing the diameter of the beads. Alternatively, an acryl beads paste may be prepared by adding while mixing binder and plasticizer in an organic matter such as acryl beads. Separately, a conductive paste is prepared by adding while mixing binder and plasticizer in metal powder constituting the high-resistance metal layers 12m such as silver-palladium. The obtained acryl beads paste and the conductive paste are then stackingly printed on the upper surfaces of a part of the above green sheets by screen printing or the like. This permits printing with more excellent mass production.

As the above organic matter, there are the same organic matters as exemplified in the method of manufacturing the multilayer piezoelectric elements according to the first to fourth preferred embodiments. It becomes easy to control the void ratio of the high-resistance metal layers 12m by heating the above metal layers composed of silver-palladium so as to oxide their surfaces in advance. Alternatively, a high-resistance component, such as PZT, lead titanate or alumina, may be added to the metal layers of silver-palladium as needed.

In the rest of the green sheets except for the one which form high-resistance metal layers 12m, the conductive paste are printed by screen printing or the like so that the different metal layers 12n are formed. An organic matter such as acryl beads and high resistance component can be added to the conductive paste as needed.

Subsequently, a plurality of the green sheets with the conductive paste printed thereon are stacked one upon another, thereby obtaining a stacked matter. The stacked matter with a heavy stone mounted thereon is debindered at a predetermined temperature. Thereafter, this is sintered at 900 to 1200° C. without mounting any heavy stone thereon so that voids can be formed in the high-resistance metal layers 12A, thereby obtaining the stacked body 13. The inactive layers 14 may be formed in the same manner as in the foregoing first to eleventh preferred embodiments.

Next, external electrodes 15 are formed in the same manner as in the first to eleventh preferred embodiments. Then, silicone rubber is filled into the groove of the stacked body 13, and the silicone rubber is coated on the side surfaces of the stacked body 13 in the same manner as in the first to eleventh preferred embodiments. Thereafter, the silicone rubber, which has been filled into the groove and coated on the side surfaces of the stacked body 13, is then cured, thereby completing the multilayer piezoelectric element of the present embodiment.

Finally, the polarization processing of the stacked body 13 is performed by connecting lead wires to the external electrodes 15, respectively, and then applying through the lead wires a dc voltage of 0.1 to 3 kV/mm to the pair of the external electrodes 15, respectively. This results in a piezoelectric actuator using the multilayer piezoelectric element of the present invention. Further, by connecting the lead wires to an external voltage supply part, and applying a voltage to the metal layers 12 through the lead wires and the external electrodes 15, the respective piezoelectric layers 11 cause a large displacement by the reverse piezoelectric effect, thereby functioning as, for example, an automobile fuel injection valve for performing fuel injection and supply to an engine.

The configuration is otherwise similar to those described in the first to eleventh preferred embodiments, and therefore the description thereof is omitted.

Thirteenth Preferred Embodiment

A thirteenth preferred embodiment related to a multilayer piezoelectric element of the present invention will be described below. The multilayer piezoelectric element according to the present embodiment can take the following configurations.

(1) A multilayer piezoelectric element having a stacked body in which a plurality of piezoelectric layers and a plurality of metal layers are stacked alternately, in which at least one of a plurality of the metal layers is composed of a plurality of metal parts disposed between the piezoelectric layers.

(2) The multilayer piezoelectric element as set forth in the above (1), in which a pair of external electrodes to which a plurality of the metal layers are connected are formed on side surfaces of the stacked body, respectively.

(3) The multilayer piezoelectric element as set forth in the above (1) or (2), in which a part of a plurality of the metal parts is oppositely disposed piezoelectric layers adjacent to both ends in a thickness (stacking) direction of the metal parts, respectively, and the rest of the metal parts are connected through only one end thereof in the thickness direction of the metal parts to the piezoelectric layers, respectively.

(4) The multilayer piezoelectric element as set forth in any one of the above (1) to (3), in which there are a plurality of metal layers composed of the metal parts.

(5) The multilayer piezoelectric element as set forth in the above (4), in which a plurality of metal layers composed of the metal parts are arranged respectively with a plurality of piezoelectric layers in between.

(6) The multilayer piezoelectric element as set forth in the above (4) or (5), in which a plurality of metal layers composed of the metal parts are regularly arranged.

(7) The multilayer piezoelectric element as set forth in any one of the above (1) to (6), in which the metal parts gradually decrease or increase in width with decreasing distance to the piezoelectric layers adjacent to the metal parts, respectively.

(8) The multilayer piezoelectric element as set forth in any one of the above (1) to (7), in which the metal parts are composed of silver, palladium, or an alloy of these.

(9) The multilayer piezoelectric element as set forth in any one of the above (1) to (8), in which voids exist between the metal parts adjacent to each other.

In accordance with the present embodiment, at least one of a plurality of the metal layers is composed of a plurality of metal parts disposed between the piezoelectric layers. This enables the metal layers composed of the metal parts to absorb stress generated by displacements generated when the piezoelectric layers are displaced. Further, the presence of the metal layer composed of the metal parts increases the degree of freedom of the piezoelectric layers around the metal layer, permitting a large displacement of these piezoelectric layers. This relaxes suppression of the element deformation due to stress concentration, thereby increasing the displacement of the entire element. This also suppresses concentration of the stress due to the element deformation. Consequently, a large displacement is attainable, and resonance phenomena can be suppressed. Even in a long-term continuous driving under high voltage and high pressure, displacement variations can be suppressed, thereby achieving the multilayer piezoelectric element having excellent durability.

When a part of a plurality of the metal parts is oppositely disposed piezoelectric layers adjacent to both ends in a thickness direction of the metal parts, respectively, and the rest of the metal parts are connected through only one end thereof in the thickness direction of the metal parts to the piezoelectric layers, respectively, it is capable of further increasing the effect of relaxing the stress generated in the thickness direction when the piezoelectric layers are displaced. When the metal parts gradually decrease or increase in width with decreasing distance to the piezoelectric layers adjacent to the metal parts, respectively, it is capable of suppressing the contours of the metal parts from having an acute angle, thereby suppressing stress concentration along with the element deformation generated at the acute angle portions. It is therefore capable of providing the multilayer piezoelectric element having excellent durability and high reliability even in a long-term continuous driving under high voltage and high pressure. That is, an injector contains the multilayer piezoelectric element as set forth in any of the above (1) to (9), in a container having an injection hole. This injector has a container having an injection hole, and the multilayer piezoelectric element as set forth in any one of the above (1) to (9). The injector is configured so that a liquid filled in the container is discharged from the injection hole by the driving of the multilayer piezoelectric element.

Figure 18:
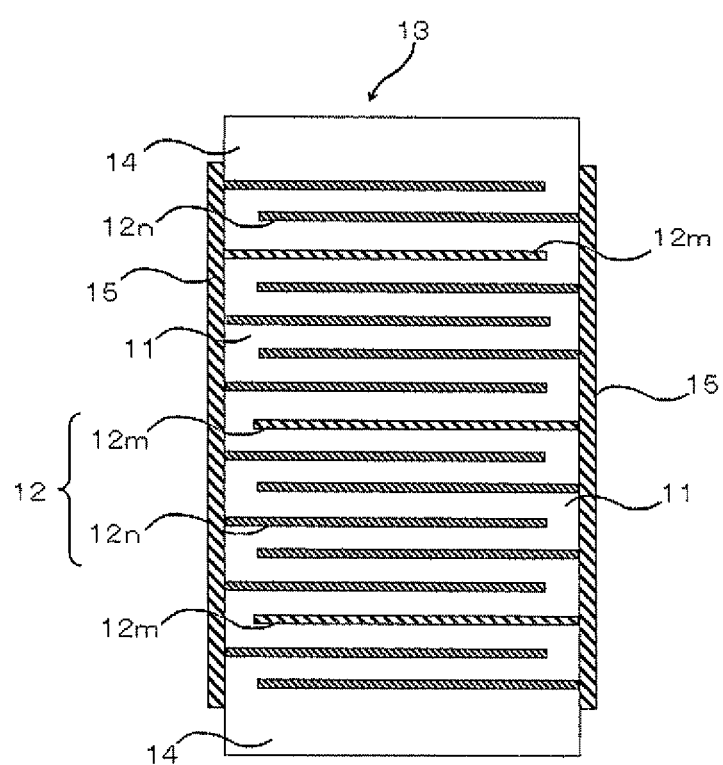
FIG. 18 is a schematic cross section showing the stacked structure of a metal layer connected to a piezoelectric layer of a multilayer piezoelectric element according to a twelfth preferred embodiment.
Figure 19:
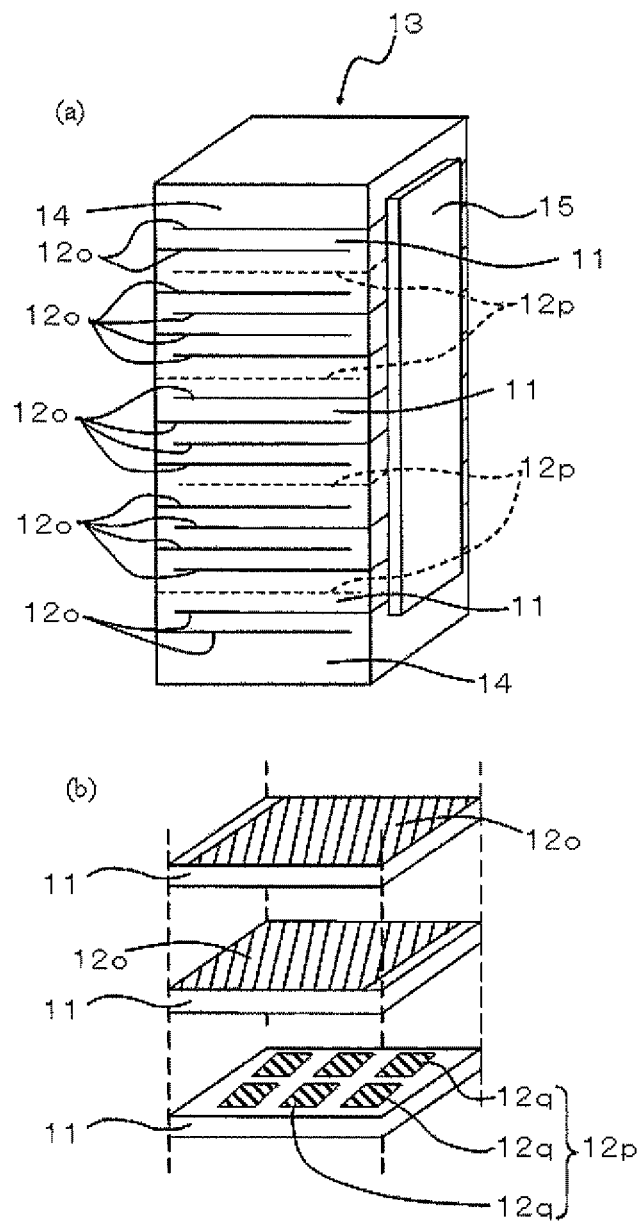
FIG. 19(a) is a perspective view showing a multilayer piezoelectric element according to a thirteenth preferred embodiment; and 19(b) is a partial perspective view showing a stacked state of a piezoelectric layer and a metal layer in FIG. 19(a)

A multilayer piezoelectric element according to the present invention will next be described in detail with reference to the accompanying drawings. FIG. 19(a) is a perspective view showing a multilayer piezoelectric element according to the present embodiment. FIG. 19(b) is a partial perspective view showing a stacked state of a piezoelectric layer and a metal layer in FIG. 19(a). In FIG. 19, similar or equivalent parts to the configurations of FIGS. 1 to 18 as described above have similar reference numbers, and the description thereof is omitted.

As shown in FIGS. 19(a) and 19(b), the multilayer piezoelectric element of the present embodiment has a stacked body 13 configured by alternately stacking a plurality of piezoelectric layers 11 and a plurality of metal layers 12 (12o, 12p). A pair of external electrodes 15 are disposed on the opposed side surfaces of the stacked body 13 (one of the external electrodes is not shown). The respective metal layers 12 are not formed entirely over the main surfaces of the piezoelectric layers 11, thereby forming the so-called partial electrode structure. The metal layers 12 in the partial electrode structure are arranged so as to expose by every other layer to the opposed side surfaces of the stacked body 13. Thus, the metal layers 12 are connected by every other layer to the pair of external electrodes 15, respectively.

Here, the multilayer piezoelectric element of the present embodiment is, as shown in FIGS. 19(a) and 19(b), at least one of a plurality of metal layers 12 is a metal layer 12p composed of a plurality of metal parts 12q disposed between the piezoelectric layers 11. The presence of at least one layer of the metal layer 12p enables an increase in the displacement of the entire multilayer piezoelectric element, and also an improvement of the durability of the multilayer piezoelectric element. That is, as in a conventional multilayer piezoelectric element, if all of metal layers are substantially equalized in order to uniformly apply an electric field to all of piezoelectric bodies, the element itself continuously causes dimensional changes during driving. Therefore, all of the piezoelectric bodies are closely driven through the metal layers, so that the multilayer piezoelectric element is drivingly deformed as a whole. As a result, the stress due to the element deformation is liable to be concentrated at the outer periphery of the center of the element which expands at the time of compression and necks at the time of spreading. Particularly, there is a tendency that the stress concentrates at the boundary between an inactive layer causing piezoelectric displacement and an active layer causing no piezoelectric displacement. In addition, there is the following problem. That is, in some cases, resonance phenomena that the displacement behaviors of the respective piezoelectric layers match with each other is generated which may cause beat sound, and harmonic signals of integral multiples of driving frequency is generated which may cause noise composition.

On the other hand, in the multilayer piezoelectric element of the present embodiment, at least one layer of the metal layers 12 is the metal layer 12p. This decreases the displacement of the piezoelectric layer 11 around the metal layer 12p, and increases the displacement of the piezoelectric layer 11 around the metal layer 12o, thereby dispersing in the element locations having a large displacement and location having a small displacement. The arrangement of these metal layers in the element enables dispersion of the stress exerted on the element. As a result, the suppression of the element deformation due to stress concentration can be relaxed, thereby increasing the displacement of the entire element. It is also capable of suppressing concentration of the stress due to the element deformation, thereby exhibiting excellent durability even in a long-term continuous driving under high voltage and high pressure.

A plurality of metal parts 12q constituting the metal layer 12p are preferably arranged substantially uniformly between the piezoelectric layers. When the metal parts 12q are arranged substantially uniformly between the piezoelectric layers, the stress along with the element deformation cannot be concentrated at a part, and the metal layer 12p functions as a stress relaxing layer of the piezoelectric layers throughout the cross section of the element.

In the present embodiment, a plurality of the metal layer 12p exist in the stacked body 13. The respective metal layers 12p are arranged interposing in between a plurality of the piezoelectric layers 11 and a plurality of the metal layers 12o, and are arranged regularly in the thickness direction of the stacked body 13. The portions of a plurality of the piezoelectric layers 11 which are drivingly deformed correspond to the layer sandwiched between the metal layers 12o. Therefore, by forming the metal layer 12p at the locations of the metal layers 12 in which a plurality of the piezoelectric layers 11 are interposed, it is capable of securing the element displacement to a certain degree, and also suppressing the occurrence of resonance phenomena to be generated when the displacement behaviors of the respective piezoelectric layers match with each other, thereby preventing beat sound generation. It is also capable of preventing harmonic signal generation, thereby suppressing the noise of control signals. Additionally, the magnitude of the displacement of the piezoelectric layers 11 can be controlled by changing the thicknesses of the metal layers 12. This eliminates the need to change the thicknesses of the piezoelectric layers, permitting the structure that is effective for mass production.

In the present embodiment, it is desirable that a part of a plurality of the metal parts 12$q$ constituting the metal layer 12$p$ be connected to the piezoelectric layers adjacent to both ends in the thickness direction of the metal parts 12$q$, respectively, and the rest of the metal parts 12$q$ constituting the metal layer 12$p$ be connected through only one end thereof in the thickness direction of the metal parts 12$q$ to the piezoelectric layers 11, respectively. One of the functions required for the metal layer 12$p$ is to increase the displacement during the time the multilayer piezoelectric element is driven. This requires that each of the metal parts 12$q$ constituting the metal layer 12$p$ is connected through both ends or one end thereof in the thickness direction thereof to the adjacent and oppositely disposed piezoelectric layers 11. When both ends in the thickness direction of the metal parts 12$q$ constituting the metal layer 12$p$ are unconnected to the adjacent and oppositely disposed piezoelectric layers 11, a sufficient spring function of connecting these piezoelectric layers 11 cannot be imparted, and in some cases, failing to obtain sufficiently the effect of increasing the displacement during the time the multilayer piezoelectric element is driven.

It is also desirable that in a region proximate to the adjacent piezoelectric layers 11, a plurality of the metal parts 12$q$ constituting the metal layer 12$p$ gradually decrease or increase in width with decreasing distance to these piezoelectric layers, respectively. Here, the other function required for the metal layer 12$p$ is to relax the stress generated when the multilayer piezoelectric element is driven and displaced. In order to attain this function, it is required to relax the stress generated on the interface between the piezoelectric layer 11 and the metal layer 12, without causing the stress to be concentrated at a point. In the present embodiment, for the purpose of further improving this stress relaxing function, particularly in a region proximate to the adjacent piezoelectric layers 11, a plurality of the metal parts 12$q$ constituting the metal layer 12$p$ gradually decrease or increase in width with decreasing distance to these piezoelectric layers, respectively, so as to suppress the stress concentrating at a point. Consequently, the piezoelectric layers 11 connected to the metal layer 12$p$ are free from stress concentration, permitting a large displacement. It is therefore capable of retaining the driving displacement of the element to be retained, and avoiding the element stress from concentrating at a point. This provides a piezoelectric actuator having a large displacement, excellent durability and high durability.

It is desirable that voids exist between a plurality of the metal parts 12$q$ adjacent to each other in the metal layer 12$p$. The reason for this is as follows. In the presence of an insulating material other than the metal component of the metal layer 12$p$, when the element is driven, a portion where no voltage can be applied to the piezoelectric layer 11 may be generated, and in some cease, piezoelectric displacement cannot be increased sufficiently. In addition, the stress during driving is liable to be concentrated.

On the other hand, in the presence of voids between a plurality of the metal parts 12$q$ constituting the metal layer 12$p$, when stress is exerted on metal portions, the void portions can cause the metal parts 12$q$ to be deformed and dispersedly relax the stress. Additionally, when the piezoelectric layers 11 connected to the metal layer 12$p$ cause piezoelectric displacement, the presence of the void portions enable partial cramping of the piezoelectric layers 11, so that the force constraining the piezoelectric layers 11 can be reduced than when cramping by the entire surface. As a result, the piezoelectric layers 11 are easy to deform, permitting a large displacement. This achieves the multilayer piezoelectric element exhibiting a larger element displacement and high durability.

Also in the present embodiment, the metal composing the metal layer 12$p$ is preferably silver, palladium, or a compound of these. Since these metals have high thermal distance, it becomes possible to perform simultaneous sintering of the piezoelectric layers 11 having a high sintering temperature, and the metal layers 12. This permits the manufacture in which the sintering temperature of the external electrodes is set to a lower temperature than the sintering temperature of the piezoelectric layers 11, thereby suppressing severe mutual dispersion between the piezoelectric layers 11 and the external electrodes 15.

Next, a description will be given of a method of manufacturing the multilayer piezoelectric element according to the thirteenth preferred embodiment.

Firstly, ceramic green sheets serving as the piezoelectric layers 11 are manufactured in the same manner as in the first to twelfth preferred embodiments. Subsequently, a conductive paste is prepared by adding while mixing binder and plasticizer in metal powder constituting the metal layers 12 of silver-palladium or the like. The conductive paste is then printed in a thickness of 1 to 40 µm on the upper surfaces of each of the green sheets by screen printing or the like.

Here, the thicknesses of the metal layers 12 and the voids in the metal layers can be changed by changing the ratio of the binder and the plasticizer to the metal powder, or changing the degree of a screen mesh, or changing the thickness of a resist for forming a screen pattern.

Subsequently, a plurality of the green sheets with the conductive paste printed thereon are stacked one upon another. With a heavy stone mounted thereon, this stacked matter is debindered at a predetermined temperature. Thereafter, this is sintered at 900 to 1200° C. without mounting any heavy stone thereon so that the metal layers have different thicknesses, thereby obtaining the stacked body 13. The inactive layers 14 may be formed in the same manner as in the foregoing first to twelfth preferred embodiments.

Thereafter, the metal layer 12 whose end is exposed to the side surface of the multilayer piezoelectric element, and the metal layer 12 (12$o$ or 12$p$), whose end is not exposed thereto, are alternately formed. Then, a groove is formed in a piezoelectric portion between the metal layer 12 whose end is not exposed, and the external electrodes 15. An insulator of resin or rubber, having a lower Young's modulus than the piezoelectric layers 11, is formed in the groove. Here, the groove is formed of the side surface of the stacked body 13 by using an internal dicing device or the like.

Next, external electrodes 15 are formed in the same manner as in the first to twelfth preferred embodiments. Silicone rubber is filled into the groove of the stacked body 13, and silicone rubber is coated on the side surfaces of the stacked body 13 in the same manner as in the first to twelfth preferred embodiments. The silicone rubber, which is filled into the groove and also coated on the side surfaces of the stacked body 13, is then cured, thereby obtaining the multilayer piezoelectric element of the present embodiment.

Finally, the polarization processing of the stacked body 13 is performed by connecting lead wires to the external electrodes 15, respectively, and then applying through the lead wires a dc voltage of 0.1 to 3 kV/mm to the pair of the external electrodes 15, respectively. This results in a piezoelectric actuator using the multilayer piezoelectric element of the present embodiment.

The configuration is otherwise similar to those described in the first to twelfth preferred embodiments, and therefore the description thereof is omitted.

<Injector>

Figure 20:
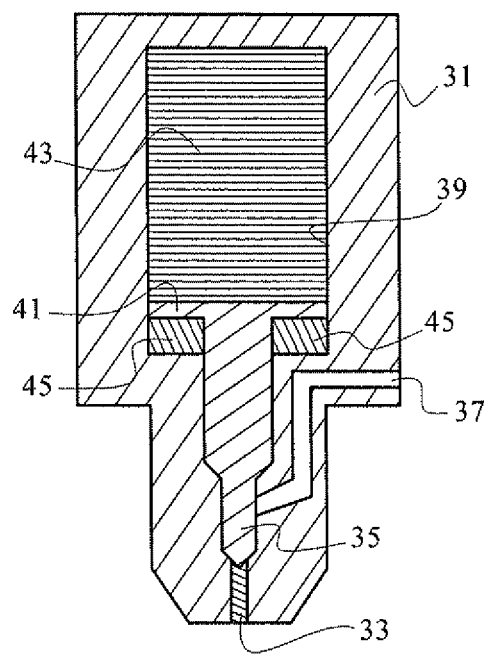
FIG. 20 is a schematic cross section showing an injector according to an embodiment of the present invention.

A preferred embodiment of an injector provided with the multilayer piezoelectric element of the present invention as described above will be described in detail below with reference to the drawing. FIG. 20 is a schematic cross section showing an injector according to the present embodiment. As shown in FIG. 20, in the injector of the present embodiment, a piezoelectric actuator 43 having the multilayer piezoelectric element of the present invention represented by the foregoing preferred embodiments is contained in the inside of a container 31 having at one end thereof an injection hole 33.

Specifically, a needle valve 35 capable of opening and closing the injection hole 33 is disposed in the container 31. A fuel passage 37 is disposed in the injection hole 33 so as to permit communication in response to movement of the needle valve 35. The fuel passage 37 is connected to an external fuel supply source, and fuel is normally supplied to the fuel passage at a constant high pressure. Therefore, it is configured so that when the needle valve 35 opens the injection 33, the fuel being supplied at a constant high pressure to the fuel passage 37 is jetted into a fuel room of an internal combustion engine (not shown).

The upper end of the needle valve 35 has a large internal diameter, and accommodates a cylinder 39 and a slidable piston 41 which are formed in the container 31.

In the above injector, when a piezoelectric actuator 43 spreads upon application of a voltage, the piston 41 is pressed, and the needle valve 35 closes the injection hole 33, thereby stopping the fuel supply. It is also configured so that when the voltage application is stopped, the piezoelectric actuator 43 contracts, and a coned disc spring 45 pushes back the piston 41, and the injection hole 33 is communicated with the fuel passage 37, thereby performing fuel jetting.

While the embodiment of the present invention has been described above, the present invention is not limited to the above preferred embodiment. For example, although the above embodiment has described the case where the multilayer piezoelectric element is applied to the injector, the present invention is not limited to this case, and applicable to, for example, drive elements mounted on precision positioners, shock prevention devices and the like in fuel injectors of automobile engines, liquid injectors such as ink jets, optical devices and the like, or alternatively, to sensor elements mounted on combustion pressure sensors, knock sensors, acceleration sensors, load sensors, ultrasonic sensors, pressure sensitive sensors, yaw rate sensors and the like, as well as circuit elements mounted on piezoelectric gyroscopes, piezoelectric switches, piezoelectric transformers, piezoelectric breakers and the like. Besides these, it is possible to practice as long as being elements using piezoelectric characteristics.

Hereinafter, the present invention will be described in further detail by illustrating examples, without limiting the present invention to the following examples.

Example I-a

Manufacturing of Piezoelectric Actuators

Piezoelectric actuators composed of a multilayer piezoelectric element were manufactured as follows.

Firstly, slurry was prepared which a mixture of a calcined powder of composed mainly of lead zirconate titanate ($PbZrO_3$—$PbTiO_3$) having a mean particle size of 0.4 μm, binder and plasticizer. Then, a plurality of ceramic green sheets constituting piezoelectric layers 11 having a thickness of 150 μm were prepared by doctor blade method. Subsequently, main metal layers 12a, low-filled metal layers 12b and high-filled metal layers 12c were printed on one surface of each of the ceramic green sheets by screen printing, respectively.

Specifically, the main metal layers 12a, the low-filled metal layers 12b and the high-filled metal layers 12c were printed in the following manner.

Main metal layers 12a: To silver-palladium alloy (95% by mass of silver and 5% by mass of palladium), 10 parts by mass of acryl beads having a mean particle diameter of 0.2 μm was added with respect to 100 parts by mass of silver-palladium alloy, and binder was also added to obtain a conductive paste. The conductive paste was printed in a thickness of 3 μm on one surface of each of the sheets.

Low filled metal layers 12b: A conductive paste obtained by adding binder to silver-palladium alloy (95% by mass of silver and 5% by mass of palladium) was printed in a thickness of 1 μm on one surface of each of the sheets. An acryl beads paste obtained by adding binder to acryl beads having a mean particle diameter of 1 μm was stackingly printed in a thickness of 10 μm on the conductive paste. The acryl beads were blended so as to constitute 5 parts by mass with respect to 100 parts by mass of silver-palladium alloy.

High filled metal layers 12c: A conductive paste obtained by adding binder to silver-palladium alloy (95% by mass of silver and 5% by mass of palladium) was printed in a thickness of 3 μm on one surface of each of the sheets.

There were prepared 300 sheets on which the respective metal layers were thus printed. Separately, green sheets constituting inactive layer 14 were prepared. These two kinds of sheets were stacked so that 30 pieces of the inactive layers, 300 pieces of stacked bodies and 30 pieces of the inactive layers were stacked in this order and from bottom to top, thereby obtaining a stacked matter.

The stacking was made in the combinations shown in Table 1. The details in Table 1 are as follows.

"Rate of layer numbers of the main metal layers 12a" means that the rete (%) of the layer numbers of the main metal layers 12a to the total metal layer numbers.

"Opposite arrangement of the low-filled metal layers 12b and the high-filled metal layers 12c" means that whether or not the low-filled metal layers 12b and the high-filled metal layers 12c are oppositely arranged with at least one layer of the piezoelectric layer 11 in between.

"The high-filled metal layers 12c as being metal layers disposed to the both sides of the low-filled metal layer 12b" means that whether or not metal layers adjacent and opposed to the low-filled metal layer 12b in the stacking direction are the high-filled metal layers 12c.

"The main metal layers 12a stacked in descending order of the metal filling rate from bottom to top" means that whether or not the low-filled metal layer 12b, the high-filled metal layer 12c and the main metal layer 12a are arranged in the order named and in the stacking direction, with the piezoelectric layer 11 in between, and also the main metal layers 12a are stacked in descending order of the metal filling rate from the high-filled metal layer 12c.

The respective numeral values in the column of "the presence and absence of low-filled metal layer 12b" in Table 1 indicates to which layer order in the stacking direction the low-filled metal layer 12b corresponds. Similarly, the respective numeral values in the column of "the presence and absence of high-filled metal layer 12c" in Table 1 indicates to which layer in the stacking direction the high-filled metal layer 12c corresponds.

The stacked matter was pressed, debindered and sintered. In the sintering process, the stacked body was retained at 800° C. for two hours, and then sintered at 1000° C. for two hours, thereby obtaining a stacked body 13. The metal filling rate of the metal layers 12a to 12c in the stacked body 13 were measured. The results are as follows.

The metal filling rate X1 in the main metal layer 12a was 70%.

The metal filling rate Y1 in the low-filled metal layer 12b was 45%.

The metal filling rate Z1 in the high-filled metal layer 12c was 85%.

Next, to a mixture of flake-shaped silver powder having a mean particle size of 2 μm, and amorphous glass powder composed mainly of silicon, having a mean particle size of 2 μm and a softening point of 640° C., 8 parts by mass of binder was added with respect to 100 parts by mass of the mixture of the silver powder and the glass powder, and this was sufficiently mixed together to obtain a silver glass conductive paste. Subsequently, the silver glass conductive paste was printed on a mold releasing film by screen printing. This was dried and then separated from the mold releasing film, thereby obtaining a silver glass conductive paste sheet. The silver glass conductive paste sheet was then transferred to and stacked on the surfaces on which external electrodes 15 should be formed. This was then baked at 700° C. for 30 minutes, thereby forming the external electrodes 15, resulting in a multilayer piezoelectric element. The mean particle size of the flake-shaped powder was measured as follows. That is, a photograph of this powder was taken by using a scanning electron microscope (SEM). A line was drawn on the photograph, and 50 pieces of lengths over which particles and the line are crossed were measured and averaged. The result was employed as a mean particle size.

Then, the polarization processing was performed by connecting lead wires to the external electrodes 15 of the obtained multilayer piezoelectric element, respectively, and by applying through the lead wires a dc electric field of 3 kV/mm for 15 minutes to the positive electrode and the negative electrode of the external electrodes 15, respectively. Thus, each piezoelectric actuator using the multilayer piezoelectric element as shown in FIG. 1 was manufactured (Sample Nos. I-1 to I-9 in Table 1). By applying a dc current of 170V to the obtained multilayer piezoelectric element, every piezoelectric actuator had a displacement in the stacking direction.

<Evaluations>

A continuous driving test was conducted for each of the obtained piezoelectric actuators. Its evaluation method was as follows. The evaluation results are shown in Table 1.

(Evaluation Method of the Continuous Driving Test)

In the test, each piezoelectric actuator was continuously driven up to $1\times10^9$ times by applying an alternating voltage of 0 to +170V at a frequency of 150 Hz at room temperature. More specifically, the test was conducted using 100 pieces per sample. The displacements were measured with an optical non-contact micro-displacement meter. The displacement in the initial state means the displacement when driven a time. Using a metal microscope and an SEM or the like, the stacked portions after the continuous driving were observed to confirm the presence and absence of delamination. Further, the presence and absence of the noise generation of harmonic components, and the presence and absence of beat sound generation at 1 kHz were evaluated.

TABLE 1

Figure 22:
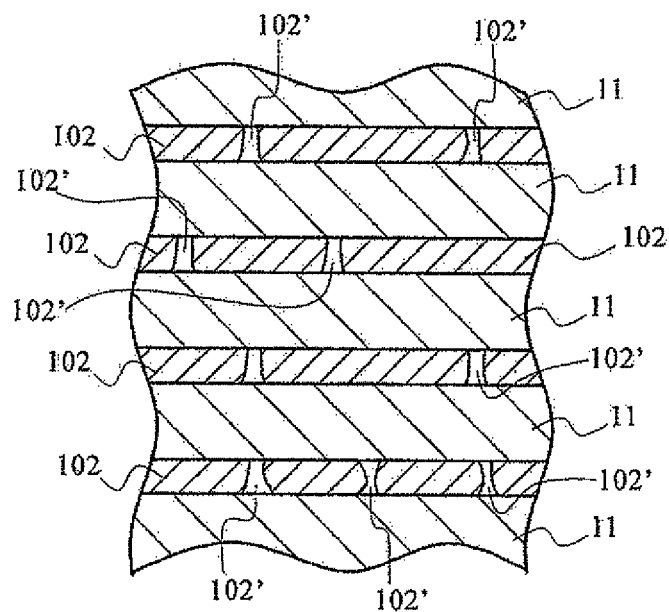
FIG. 22 is a partially enlarged cross section showing the stacked structure in the conventional multilayer piezoelectric element.

| Sample No. | Constitution of metal layers | Rate of layer numbers of metal layers 12a | Existence of low-filled metal layers 12b (Position) | Existence of high-filled metal layers 12c (Position) | Opposite arrangement of low-filled metal layers 12b and high-filled metal layers 12c | High-filled metal layers 12c as being metal layers disposed to both sides of low-filled metal layers 12b |
|---|---|---|---|---|---|---|
| I-1 | FIG. 2 | 98% | Existence 50, 100, 150, 200, 250 | None | None | None |
| I-2 | FIG. 7 | 98% | None | Existence 50, 100, 150, 200, 250 | None | None |
| I-3 | FIG. 4 | 96% | Existence 50, 100, 200, 250 | Existence 48, 99, 201, 251 | Existence | None |
| I-4 | FIG. 4 | 96% | Existence 49, 99, 201, 251 | Existence 50, 100,, 200, 250 | Existence | None |
| I-5 | FIG. 5 | 95% | Existence 50, 100, 150, 200, 250 | Existence 49, 51, 99, 101, 149, 151, 199, 201, 249, 251 | Existence | Existence |
| I-6 | FIG. 5 | 93% | Existence 1, 50, 100, 150, 200, 250, 300 | Existence 2, 49, 51, 99, 101, 149, 151, 199, 201, 249, 251, 299 | Existence | Existence |
| I-7 | FIG. 5 | 92% | Existence 2, 50, 100, 150, 200, 250, 299 | Existence 1, 3, 49, 51, 99, 101, 149, 151, 199, 201, 249, 251, 298, 300 | Existence | Existence |
| I-8 | FIG. 5 | 95% | Existence 50, 100, 150, 200, 250 | Existence 49, 51, 99, 101, 149, 151, 199, 201, 249, 251 | Existence | Existence |
| I-9 | FIG. 22 | 100% | None | None | None | None |

| Sample No. | Metal layers 12a stacked in descending order of metal filling rate | Result of continuous driving test | | | | |
|---|---|---|---|---|---|---|
| | | Displacement in initial state (μm) | Displacement after continuous driving (μm) | Delamination | Noise generation of harmonic components | Beat sound generation |
| I-1 | None | 50.0 | 49.9 | None | None | None |
| I-2 | None | 50.0 | 49.9 | None | None | None |
| I-3 | None | 55.0 | 54.9 | None | None | None |
| I-4 | None | 55.0 | 54.9 | None | None | None |
| I-5 | None | 60.0 | 59.9 | None | None | None |
| I-6 | None | 60.0 | 60.0 | None | None | None |

TABLE 1-continued

| | | | | | | | |
|---|---|---|---|---|---|---|---|
| I - 7 | None | 60.0 | 60.0 | None | None | None |
| I - 8 | Existence | 60.0 | 60.0 | None | None | None |
| I - 9 | None | 45.0 | 42.0 | Occurred | Occurred | Occurred |

As apparent from Table 1, in Sample No. I-9 as a comparative example, the stress exerted on the stacking interface was concentrated at a point, which increased load and caused delamination (inter-layer peeling), as well as beat sound generation and noise generation. On the other hand, in Samples Nos. I-1 to I-8 as the present invention, no remarkable drop in the element displacement was confirmed even after being continuously driven $1\times10^9$ times, and hence these samples had effective displacements required for the piezoelectric actuators, respectively. This shows that the piezoelectric actuators having excellent durability were achieved.

Particularly, it can be seen that Samples Nos. I-3 and I-4, in which a stress relaxing layer (the low-filled metal layer 12b) and a stress concentrating layer (the high-filled metal layer 12c) were adjacent to each other with the piezoelectric layer 11 in between, were capable of increasing the element displacement and also manufacturing the multilayer actuators exhibiting a stable element displacement. It can also be seen that Samples Nos. I-5 to I-8, in which the stress relaxing layers were interposed with the piezoelectric layer 11 in between, were capable of achieving the largest element displacement, and also manufacturing the piezoelectric actuators which caused little change of the element displacement and had extremely excellent durability, thereby exhibiting a stable element displacement.

Example I-b

Piezoelectric actuators were obtained (Samples Nos. I-10 to I-15 in Table 2) by changing the compositions (Y1/X1 and Z1/X1) of the metal layers 12 in the piezoelectric actuators of Sample No. I-8 in the above Example I-a, into those as shown in Table 2. As a comparative example, the piezoelectric actuator of Sample No. I-9 in Example I-a was also presented (Sample No. I-15 in Table 2). By applying a dc voltage of 170V to each of the obtained multilayer piezoelectric elements, every piezoelectric actuator had a displacement in the stacking direction. Since in the piezoelectric actuator of Sample No. I-15, the metal filling rates of all of the metal layers were set to about 70%, these are expressed as X1=70%, Y1=70% and Z1=70%, and the filling rate ratio was expressed as Y1/X1=1, and Z1/X1=1 in Table 2.

In the same manner as in Example I-a, a continuous driving test was conducted for each of the obtained piezoelectric actuators (Samples Nos. I-10 to I-15 in Table 2). The results are shown in Table 2.

As apparent from Table 2, in Sample No. I-15, in which Y1/X1 was larger than 0.9, and Z1/X1 was smaller than 1.05, the stress exerted on the stacking interface was concentrated at a point, which increased load and caused delamination (inter-layer peeling), as well as beat sound generation and noise generation.

On the other hand, in Samples Nos. I-10 to I-14, in which Y1/X1 was in the range of 0.1 to 0.9, and Z1/X1 was in the range of 1.05 to 2, were capable of achieving the largest element displacement and also achieving the multilayer actuators which caused little change of the element displacement and had extremely excellent durability, thereby exhibiting a stable element displacement. In particular, Samples Nos. I-12 and I-13, in which Y1/X1 was in the range of 0.5 to 0.8, and Z1/X1 was in the range of 1.1 to 1.2, were capable of achieving the multilayer actuators having excellent element displacement.

Example I-c

Piezoelectric actuators were obtained (Samples Nos. I-16 to I-33 in Table 3) by changing the material compositions of the metal layers 12 in the piezoelectric actuators of Sample No. I-8 in the above Example I-a, into those as shown in Table 3. By applying a dc voltage of 170V to each of the obtained multilayer piezoelectric elements, every piezoelectric actuator had a displacement in the stacking direction.

In the same manner as in Example I-a, a continuous driving test was conducted for each of the obtained piezoelectric actuators. Each rate of change of the displacement (%) was calculated by introducing the displacement of the initial state and the displacement after the continuous driving into the equation: [1−(Displacement after continuous driving)/(Displacement of initial state)]×100. The results are shown in Table 3.

TABLE 3

| | Material compositions of metal layers 12 | | | | Result of continuous driving test Rate of change of displacement (%) |
|---|---|---|---|---|---|
| Sample No. | Pd (% by mass) | Ag (% by mass) | Cu (% by mass) | Ni (% by mass) | |
| I - 16 | 0.001 | 99.999 | 0 | 0 | 0.7 |
| I - 17 | 0.01 | 99.99 | 0 | 0 | 0.7 |

TABLE 2

| | | | | | | | | Result of continuous driving test | | | |
|---|---|---|---|---|---|---|---|---|---|---|---|
| Sample No. | Constitution of metal layer | X1 (%) | Y1 (%) | Z1 (%) | Y1/X1 | Z1/X1 | Displacement in initial state (μm) | Displacement after continuous driving (μm) | Delamination | Noise generation of harmonic components | Beat sound generation |
| I - 10 | FIG. 5 | 48 | 4.8 | 96 | 0.1 | 2 | 60.0 | 60.0 | None | None | None |
| I - 11 | FIG. 5 | 66 | 20 | 99 | 0.3 | 1.5 | 65.0 | 65.0 | None | None | None |
| I - 12 | FIG. 5 | 63 | 32 | 76 | 0.5 | 1.2 | 70.0 | 70.0 | None | None | None |
| I - 13 | FIG. 5 | 72 | 36 | 80 | 0.8 | 1.1 | 70.0 | 70.0 | None | None | None |
| I - 14 | FIG. 5 | 66 | 60 | 70 | 0.9 | 1.05 | 65.0 | 65.0 | None | None | None |
| I - 15 | FIG. 22 | 70 | 70 | 70 | 1 | 1 | 45.0 | 42.0 | Occurred | Occurred | Occurred |

TABLE 3-continued

| Sample No. | Material compositions of metal layers 12 | | | | Result of continuous driving test Rate of change of displacement (%) |
|---|---|---|---|---|---|
| | Pd (% by mass) | Ag (% by mass) | Cu (% by mass) | Ni (% by mass) | |
| I - 18 | 0.1 | 99.9 | 0 | 0 | 0.4 |
| I - 19 | 0.5 | 99.5 | 0 | 0 | 0.2 |
| I - 20 | 1 | 99 | 0 | 0 | 0.2 |
| I - 21 | 2 | 98 | 0 | 0 | 0 |
| I - 22 | 4 | 95 | 1 | 0 | 0 |
| I - 23 | 5 | 95 | 0 | 0 | 0 |
| I - 24 | 8 | 92 | 0 | 0 | 0 |
| I - 25 | 9 | 91 | 0 | 0 | 0.2 |
| I - 26 | 9.5 | 90.5 | 0 | 0 | 0.2 |
| I - 27 | 10 | 90 | 0 | 0 | 0.4 |
| I - 28 | 15 | 85 | 0 | 0 | 0.7 |
| I - 29 | 0 | 0 | 100 | 0 | 0.2 |
| I - 30 | 0 | 0 | 99.9 | 0.1 | 0 |
| I - 31 | 0 | 0 | 0 | 100 | 0.4 |
| I - 32 | 20 | 80 | 0 | 0 | 0.9 |
| I - 33 | 30 | 70 | 0 | 0 | 0.9 |

As apparent from Table 3, in Sample Nos. I-32 and I-33, the content of metal of groups 8 to 10 in the metal composition in the metal layers 12 was above 15% by mass, and the content of metal of group 11 was below 85%. Consequently, the metal layers 12 had a large specific resistance, and when the multilayer piezoelectric element was continuously driven, heat was generated, and the displacement of the piezoelectric actuator was lowered.

On the other hand, Samples Nos. I-16 to I-28 were composed mainly of a metal composition satisfying the following relationship of: $0<M1\leq15$, $85\leq M2<100$, $M1+M2=100\%$ by mass, where M1% by mass is a content of metal in groups 8 to 10 in the metal layers 12, and M2% by mass is a content of a metal in group 11b. It was therefore capable of reducing the specific resistance of the metal layers 12, and suppressing the heat generation occurred in the metal layers 12 even in the continuous driving, thereby manufacturing the multilayer actuators with a stable element displacement. It can also be seen that Samples Nos. I-29 to I-31 were capable of reducing the specific resistance of the metal layers 12, and suppressing the heat generation occurred in the metal layers 12 even in the continuous driving, thereby manufacturing the multilayer actuators with a stable element displacement.

Example I-d

Manufacturing of Piezoelectric Actuators

Piezoelectric actuators composed of a multilayer piezoelectric element were manufactured as follows.

In the same manner as in Example I-a, there were prepared 30 sheets on which the respective metal layers were printed. Separately, green sheets constituting inactive layer 14 were prepared. These two kinds of sheets were stacked so that 5 pieces of the inactive layers, 30 pieces of stacked bodies and 5 pieces of the inactive layers were stacked in this order and from bottom to top, thereby obtaining a stacked matter.

The stacking was made in the combinations shown in Table 4. The details in Table 4 are as follows.

"Arrangement of the low-filled metal layers 12b and the high-filled metal layers 12c" means that whether or not the low-filled metal layers 12b and the high-filled metal layers 12c are oppositely arranged with at least one layer of the piezoelectric layer 11 in between.

The stacked matter was pressed, debindered and sintered. In the sintering process, the stacked body was retained at 800° C. for two hours, and then sintered at 1000° C. for two hours, thereby obtaining a stacked body 13. The metal filling rate of the metal layers 12a to 12c in the stacked body 13 were measured. The results are as follows.

The metal filling rate X1 in the main metal layer 12a was 70%.

The metal filling rate Y1 in the low-filled metal layer 12b was 45%.

The metal filling rate Z1 in the high-filled metal layer 12c was 85%.

Next, in the same manner as in Example I-a, each multilayer piezoelectric element was obtained by forming external electrodes 15 on the stacked body 13. Then, the polarization processing was performed by connecting lead wires to the external electrodes 15 of the obtained multilayer piezoelectric element, respectively, and by applying through the lead wires a dc electric field of 3 kV/mm for 15 minutes to the positive electrode and the negative electrode of the external electrodes 15, respectively. Thus, each piezoelectric actuator using the multilayer piezoelectric element as shown in FIG. 1 was manufactured (Sample Nos. I-34 to I-37 in Table 4). By applying a dc current of 170V to the obtained multilayer piezoelectric element, every piezoelectric actuator had a displacement in the stacking direction.

<Evaluations>

In the same manner as in Example I-a, a continuous driving test was conducted for each of the obtained piezoelectric actuators. The evaluation results are shown in Table 4.

TABLE 4

| Sample No. | Existence of low-filled metal layers 12b (Position) | Existence of high-filled metal layers 12c (Position) | Opposite arrangement of low-filled metal layers 12b and high-filled metal layers 12c | Result of continuous driving test | | Delamination |
|---|---|---|---|---|---|---|
| | | | | Displacement in initial state (μm) | Displacement after continuous driving (μm) | |
| I - 34 | Existence 1, 30 | None | None | 5.0 | 4.9 | None |
| I - 35 | None | Existence 1, 30 | None | 5.5 | 5.4 | None |
| I - 36 | Existence 1, 30 | Existence 2, 29 | Existence | 5.5 | 5.5 | None |
| I - 37 | None | None | None | 5.0 | 4.2 | Occurred |

As apparent from Table 4, in Sample No. I-37 as a comparative example, the stress exerted on the stacking interface was concentrated at a point, which increased load and caused delamination (inter-layer peeling), as well as beat sound generation and noise generation. On the other hand, in Samples Nos. I-34 to I-36 as the present invention, no remarkable drop in the element displacement was confirmed even after being continuously driven $1 \times 10^9$ times, and hence these samples had effective displacements required for the piezoelectric actuators, respectively. This shows that the piezoelectric actuators having excellent durability were achieved.

Particularly, it can be seen that Sample No. I-36, in which the stress relaxing layer (the low-filled metal layer 12b) and the stress concentrating layer (the high-filled metal layer 12c) were adjacent to each other with the piezoelectric layer 11 in between, were capable of increasing the element displacement and also manufacturing the multilayer actuators exhibiting a stable element displacement.

Example II-a

Manufacturing of Piezoelectric Actuators

Piezoelectric actuators composed of a multilayer were manufactured as follows.

Firstly, in the same manner as in Example I-a, a plurality of ceramic green sheets composed of a piezoelectric layer 11 having a thickness of 150 μm were prepared. Subsequently, using a conductive paste obtained by adding binder to silver-palladium alloy (95% by mass of silver and 5% by mass of palladium), a main metal layer 12d, a thin metal layer 12e and a thick metal layer 12f were printed on one surface of each of the above green sheets by screen printing, respectively.

Specifically, the main metal layer 12d, the thin metal layer 12e and the thick metal layer 12f were printed as follows.

The main metal layer 12d was printed in a thickness of 5 μm by a process using a resist thickness of 10 μm.

The thin metal layer 12e was printed in a thickness of 1 μm by a process using a resist thickness of 2 μm.

The main metal layer 12f was printed in a thickness of 10 μm by a process using a resist thickness of 20 μm.

There were prepared 300 sheets on which the respective metal layers were thus printed. Separately, green sheets constituting inactive layer 14 were prepared. These two kinds of sheets were stacked so that 30 pieces of the inactive layers, 300 pieces of stacked bodies and 30 pieces of the inactive layers were stacked in this order and from bottom to top, thereby obtaining a stacked matter.

The stacking was made in the combinations shown in Table 5. The details in Table 5 are as follows.

"Rate of layer numbers of the metal layers 12d" means that the rate (%) of the layer numbers of the main metal layers 12d to the total metal layer numbers.

"Opposite arrangement of the thin metal layers 12e and the thick metal layers 12f" means that whether or not the thin metal layers 12e and the thick metal layers 12f are oppositely arranged with at least one layer of the piezoelectric layer 11 in between.

"The thick metal layers 12f as being metal layers disposed to the both sides of the thin metal layer 12e" means that whether or not metal layers adjacent and opposed to the thin metal layer 12e in the stacking direction are the thick metal layers 12f.

"The metal layers 12d stacked in descending order of thickness from bottom to top" means that whether or not the thin metal layer 12e, the thick metal layer 12f and the main metal layer 12d are arranged in the order named and in the stacking direction, with the piezoelectric layer 11 in between, and also the main metal layers 12d are stacked in descending order of thickness from bottom to top.

The stacked matter was pressed, debindered and sintered. In the sintering process, the stacked body was retained at 800° C. for two hours, and then sintered at 1000° C. for two hours, thereby obtaining a stacked body 13. The thicknesses of the metal layers 12d to 12f in the stacked body 13 were measured. The results are as follows.

The thickness X2 of the main metal layer 12d was 5 μm.
The thickness Y2 of the thin metal layer 12e was 2 μm.
The thickness Z2 of the thick metal layer 12f was 7 μm.

Next, in the same manner as in Example I-a, each multilayer piezoelectric element was obtained by forming external electrodes 15 on the stacked body 13. Then, the polarization processing was performed by connecting lead wires to the external electrodes 15 of the obtained multilayer piezoelectric element, respectively, and by applying through the lead wires a dc electric field of 3 kV/mm for 15 minutes to the positive electrode and the negative electrode of the external electrodes 15, respectively. Thus, each piezoelectric actuator using the multilayer piezoelectric element as shown in FIG. 1 was manufactured (Sample Nos. II-1 to II-9 in Table 5). By applying a dc current of 170V to the obtained multilayer piezoelectric element, every piezoelectric actuator had a displacement in the stacking direction.

<Evaluations>

In the same manner as in Example I-a, a continuous driving test was conducted for each of the obtained piezoelectric actuators. The evaluation results are shown in Table 5.

TABLE 5

| Sample No. | Constitution of metal layers | Rate of layer numbers of metal layers 12a | Existence of thin metal layers 12e (Position) | Existence of thick metal layers 12f (Position) | Opposite arrangement of thin metal layers 12e and thick metal layers 12f | Thick metal layers 12f as being metal layers disposed to both sides of thin metal layers 12e |
|---|---|---|---|---|---|---|
| II-1 | FIG. 8 | 98% | Existence 50, 100, 150, 200, 250 | None | None | None |
| II-2 | FIG. 13 | 98% | None | Existence 50, 100, 150, 200, 250 | None | None |
| II-3 | FIG. 10 | 96% | Existence 50, 100, 200, 250 | Existence 49, 99, 201, 251 | Existence | None |
| II-4 | FIG. 10 | 96% | Existence 49, 99, 201, 251 | Existence 50, 100,, 200, 250 | Existence | None |

TABLE 5-continued

Figure 23:
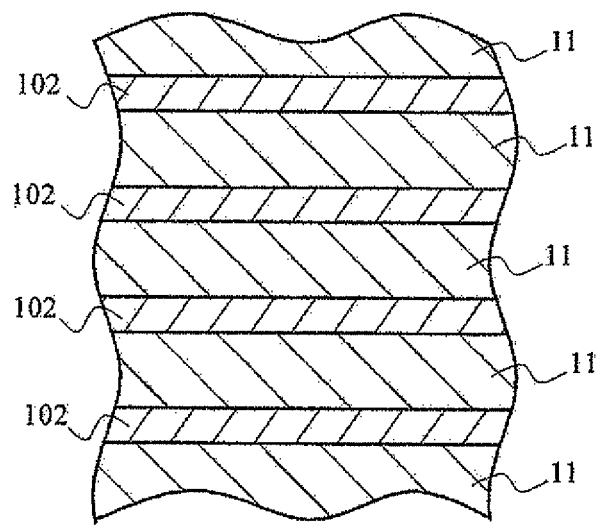
FIG. 23 is a partially enlarged cross section showing the stacked structure in the conventional multilayer piezoelectric element.

| | | | | | | | |
|---|---|---|---|---|---|---|---|
| II-5 | FIG. 11 | 95% | Existence 50, 100, 150, 200, 250 | Existence 49, 51, 99, 101, 149, 151, 199, 201, 249, 251 | | Existence | Existence |
| II-6 | FIG. 11 | 93% | Existence 1, 50, 100, 150, 200, 250, 300 | Existence 2, 49, 51, 99, 101, 149, 151, 199, 201, 249, 251, 299 | | Existence | Existence |
| II-7 | FIG. 11 | 92% | Existence 2, 50, 100, 150, 200, 250, 299 | Existence 1, 3, 49, 51, 99, 101, 149, 151, 199, 201, 249, 251, 298, 300 | | Existence | Existence |
| II-8 | FIG. 11 | 95% | Existence 50, 100, 150, 200, 250 | Existence 49, 51, 99, 101, 149, 151, 199, 201, 249, 251 | | Existence | Existence |
| II-9 | FIG. 23 | 100% | None | None | | None | None |

| | | | Result of continuous driving test | | | | |
|---|---|---|---|---|---|---|---|
| Sample No. | Metal layers 12d stacked in descending order of thickness | | Displacement in initial state (μm) | Displacement after continuous driving (μm) | Delamination | Noise generation of harmonic components | Beat sound generation |
| II-1 | None | | 50.0 | 49.9 | None | None | None |
| II-2 | None | | 50.0 | 49.9 | None | None | None |
| II-3 | None | | 55.0 | 54.9 | None | None | None |
| II-4 | None | | 55.0 | 54.9 | None | None | None |
| II-5 | None | | 60.0 | 59.9 | None | None | None |
| II-6 | None | | 60.0 | 60.0 | None | None | None |
| II-7 | None | | 60.0 | 60.0 | None | None | None |
| II-8 | Existence | | 60.0 | 60.0 | None | None | None |
| II-9 | None | | 45.0 | 42.0 | Occurred | Occurred | Occurred |

As apparent from Table 5, in Sample No. II-9 as a comparative example, the stress exerted on the stacking interface was concentrated at a point, which increased load and caused delamination (inter-layer peeling), as well as beat sound generation and noise generation. On the other hand, in Samples Nos. II-1 to II-8 as the present invention, no remarkable drop in the element displacement was confirmed even after being continuously driven $1 \times 10^9$ times, and hence these samples had effective displacements required for the piezoelectric actuators, respectively. This shows that the piezoelectric actuators having excellent durability were achieved.

Particularly, it can be seen that Sample No. II-3, in which the stress relaxing layer (the thin metal layer 12e) and the stress concentrating layer (the thick metal layer 12f) were adjacent to each other with the piezoelectric layer 11 in between, were capable of increasing the element displacement and also manufacturing the multilayer actuators exhibiting a stable element displacement. It can also be seen that Samples Nos. II-4 to II-8, in which the stress relaxing layers were interposed with the piezoelectric layer 11 in between, were capable of achieving the largest element displacement, and also manufacturing the piezoelectric actuators which caused little change of the element displacement and had extremely excellent durability, thereby exhibiting a stable element displacement. Among others, Samples Nos. II-6 and II-7, in which the stress relaxing layer (the thin metal layer 12e) and the stress concentrating layer (the thick metal layer 12f) were arranged on the boundary with the inactive layer, had extremely excellent durability.

Example II-b

Piezoelectric actuators were obtained (Samples Nos. II-10 to II-14 in Table 6) by changing the thickness of the metal layers 12 (12/X2 and Z2/X2) in the piezoelectric actuators of Sample No. II-8 in the above Example II-a, into those as shown in Table 6. As a comparative example, the piezoelectric actuator of Sample No. II-9 in Example II-a was also presented (Sample No. II-15 in Table 6). By applying a dc voltage of 170V to each of the obtained multilayer piezoelectric elements, every piezoelectric actuator had a displacement in the stacking direction. Since in the piezoelectric actuator of Sample No. II-15, the thickness of all of the metal layers was set to about 5 μm, these are expressed as X2=5 μm, Y2=5 μm and Z2=5 μm, and the thickness ratio was expressed as Y2/X2=1, and Z2/X2=1 in Table 6.

In the same manner as in Example I-a, a continuous driving test was conducted for each of the obtained piezoelectric actuators (Samples Nos. II-10 to II-15 in Table 6). The results are shown in Table 6.

TABLE 6

| | | | | | | | Result of continuous driving test | | | | |
|---|---|---|---|---|---|---|---|---|---|---|---|
| Sample No. | Constitution of metal layers | X2 (μm) | Y2 (μm) | Z2 (μm) | Y2/X2 | Z2/X2 | Displacement in initial state (μm) | Displacement after continuous driving (μm) | Delamination | Noise generation of harmonic components | Beat sound generation |
| II-10 | FIG. 11 | 5 | 0.5 | 10 | 0.1 | 2 | 60.0 | 60.0 | None | None | None |
| II-11 | FIG. 11 | 5 | 1.5 | 7.5 | 0.3 | 1.5 | 65.0 | 65.0 | None | None | None |
| II-12 | FIG. 11 | 5 | 2.5 | 6 | 0.5 | 1.2 | 70.0 | 70.0 | None | None | None |
| II-13 | FIG. 11 | 5 | 4 | 5.5 | 0.8 | 1.1 | 70.0 | 70.0 | None | None | None |

TABLE 6-continued

| | | | | | | | Result of continuous driving test | | | | |
|---|---|---|---|---|---|---|---|---|---|---|---|
| Sample No. | Constitution of metal layers | X2 (μm) | Y2 (μm) | Z2 (μm) | Y2/X2 | Z2/X2 | Displacement in initial state (μm) | Displacement after continuous driving (μm) | Delamination | Noise generation of harmonic components | Beat sound generation |
| II-14 | FIG. 11 | 5 | 4.5 | 5.25 | 0.9 | 1.05 | 65.0 | 65.0 | None Occurred | None Occurred | None Occurred |
| II-15 | FIG. 23 | 5 | 5 | 5 | 1 | 1 | 45.0 | 42.0 | Occurred | Occurred | Occurred |

As apparent from Table 6, in Sample No. II-15, in which Y2/X2 was larger than 0.9, and Z2/X2 was smaller than 1.05, the stress exerted on the stacking interface was concentrated at a point, which increased load and caused delamination (inter-layer peeling), as well as beat sound generation and noise generation.

On the other hand, Samples Nos. II-10 to II-14, in which Y2/X2 was in the range of 0.1 to 0.9, and Z2/X2 was in the range of 1.05 to 2, were capable of achieving the largest element displacement and also achieving the multilayer actuators which caused little change of the element displacement and had extremely excellent durability, thereby, exhibiting a stable element displacement. In particular, Samples Nos. II-12 and II-13, in which Y2/X2 was in the range of 0.5 to 0.8, and Z2/X2 was in the range of 1.1 to 1.2, were capable of achieving the multilayer actuators having excellent element displacement.

Example II-c

Piezoelectric actuators were obtained (Samples Nos. II-16 to II-33 in Table 7) by changing the material compositions of the metal layers 12 in the piezoelectric actuators of Sample No. II-8 in the above Example II-a, into those as shown in Table 7. By applying a dc voltage of 170V to each of the obtained multilayer piezoelectric elements, every piezoelectric actuator had a displacement in the stacking direction.

In the same manner as in Example I-a, a continuous driving test was conducted for each of the obtained piezoelectric actuators. Each rate of change of the displacement (%) was calculated in the same manner as in Example I-c. The results are shown in Table 7.

TABLE 7

| | Material compositions of metal layers 12 | | | | Result of continuous driving test Rate of change of displacement (%) |
|---|---|---|---|---|---|
| Sample No. | Pd (% by mass) | Ag (% by mass) | Cu (% by mass) | Ni (% by mass) | |
| I-16 | 0.001 | 99.999 | 0 | 0 | 0.7 |
| I-17 | 0.01 | 99.99 | 0 | 0 | 0.7 |
| I-18 | 0.1 | 99.9 | 0 | 0 | 0.4 |
| I-19 | 0.5 | 99.5 | 0 | 0 | 0.2 |
| I-20 | 1 | 99 | 0 | 0 | 0.2 |
| I-21 | 2 | 98 | 0 | 0 | 0 |
| I-22 | 4 | 95 | 1 | 0 | 0 |
| I-23 | 5 | 95 | 0 | 0 | 0 |
| I-24 | 8 | 92 | 0 | 0 | 0 |
| I-25 | 9 | 91 | 0 | 0 | 0.2 |
| I-26 | 9.5 | 90.5 | 0 | 0 | 0.2 |
| I-27 | 10 | 90 | 0 | 0 | 0.4 |
| I-28 | 15 | 85 | 0 | 0 | 0.7 |
| I-29 | 0 | 0 | 100 | 0 | 0.2 |
| I-30 | 0 | 0 | 99.9 | 0.1 | 0 |
| I-31 | 0 | 0 | 0 | 100 | 0.4 |
| I-32 | 20 | 80 | 0 | 0 | 0.9 |
| I-33 | 30 | 70 | 0 | 0 | 0.9 |

As apparent from Table 7, in Sample Nos. II-32 and II-33, the content of metal of groups 8 to 10 in the metal composition in the metal layers 12 was above 15% by mass, and the content of metal of group 11 was below 85%. Consequently, the metal layers 12 had a large specific resistance, and when the multilayer piezoelectric element was continuously driven, heat was generated, and the displacement of the piezoelectric actuator was lowered.

On the other hand, Samples Nos. II-16 to II-28 were composed mainly of a metal composition satisfying the following relationship of: $0<M1\leq15$, $85\leq M2<100$, $M1+M2=100\%$ by mass, where M1% by mass is a content of metal in groups 8 to 10 in the metal layers 12, and M2% by mass is a content of a metal in group 11b. It was therefore capable of reducing the specific resistance of the metal layers 12, and suppressing the heat generation occurred in the metal layers 12 even in the continuous driving, thereby manufacturing the multilayer actuators with a stable element displacement. It can also be seen that Samples Nos. II-29 to 31 were capable of reducing the specific resistance of the metal layers 12, and suppressing the heat generation occurred in the metal layers 12 even in the continuous driving, thereby manufacturing the multilayer actuators with a stable element displacement.

Example II-d

Manufacturing of Piezoelectric Actuators

Piezoelectric actuators composed of a multilayer piezoelectric element were manufactured as follows.

In the same manner as in Example II-a, there were prepared 30 sheets on which the respective metal layers were printed. Separately, green sheets constituting inactive layer 14 were prepared. These two kinds of sheets were stacked so that 5 pieces of the inactive layers, 30 pieces of stacked bodies and 5 pieces of the inactive layers were stacked in this order and from bottom to top, thereby obtaining a stacked matter.

The stacking was made in the combinations shown in Table 8. The details in Table 8 are as follows.

"Arrangement of the thin metal layers 12e and the thick metal layers 12f" means that whether or not the thin metal layers 12e and the thick metal layers 12f are oppositely arranged with at least one layer of the piezoelectric layer 11 in between.

The stacked matter was pressed, debindered and sintered. In the sintering process, the stacked body was retained at 800° C. for two hours, and then sintered at 1000° C. for two hours, thereby obtaining a stacked body 13. The metal filling rate of the metal layers 12d to 12f in the stacked body 13 were measured. The results are as follows.

The thickness X2 of the main metal layer 12d was 5 μm.
The thickness Y2 of the thin metal layer 12e was 2 μm.
The thickness Z2 of the thick metal layer 12f was 7 μm.

Next, in the same manner as in Example I-a, each multilayer piezoelectric element was obtained by forming external electrodes 15 on the stacked body 13. Then, the polarization processing was performed by connecting lead wires to the external electrodes 15 of the obtained multilayer piezoelectric element, respectively, and by applying through the lead wires a dc electric field of 3 kV/mm for 15 minutes to the positive electrode and the negative electrode of the external electrodes 15, respectively. Thus, each piezoelectric actuator using the multilayer piezoelectric element as shown in FIG. 1 was manufactured (Sample Nos. II-34 to II-37 in Table 8). By applying a dc current of 170V to the obtained multilayer piezoelectric element, every piezoelectric actuator had a displacement in the stacking direction.

<Evaluations>

In the same manner as in Example I-a, a continuous driving test was conducted for each of the obtained piezoelectric actuators. The evaluation results are shown in Table 8.

between, were capable of increasing the element displacement and also manufacturing the multilayer actuators exhibiting a stable element displacement.

Example III-a

Manufacturing of Piezoelectric Actuators

Piezoelectric actuators composed of the multilayer piezoelectric element according to the ninth preferred embodiment were manufactured as follows.

Firstly, in the same manner as in Example I-a, a ceramic green sheet having a thickness of 150 μm and constituting a piezoelectric layer 11 was prepared. On one surface of this ceramic green sheet, 300 pieces of sheets were stacked which were formed by screen printing using a conductive paste. The conductive paste was prepared by adding binder to an alloy composed mainly of silver-palladium so as to have the composition as shown in Table 9. This was sintered to obtain a stacked body 13, under the sintering condition that the stacked matter was retained at 800° C. for two hours, and then sintered at 1000° C. for two hours.

At this time, a conductive paste obtained by adding binder to silver-palladium alloy was printed on the portions for forming a high-ratio metal layer 12h so that they had a thickness of 3 μm and had the composition as shown in Table 9, and the high-ratio metal layers 12h were arranged on the 50th layer, the 100th layer, the 150th layer, the 200th layer and 250th layer, respectively.

Next, in the same manner as in Example I-a, each multilayer piezoelectric element was obtained by forming external electrodes 15 on the stacked body 13. Then, the polarization processing was performed by connecting lead wires to the external electrodes 15 of the obtained multilayer piezoelectric element, respectively, and by applying through the lead

TABLE 8

| | | | | Result of continuous driving test | | |
|---|---|---|---|---|---|---|
| Sample No. | Existence of thin metal layers 12e (Position) | Existence of thick metal layers 12f (Position) | Opposite arrangement of thin metal layers 12e and thick metal layers 12f | Displacement in initial state (μm) | Displacement after continuous driving (μm) | Delamination |
| II - 34 | Existence 1, 30 | None | None | 5.0 | 4.9 | None |
| II - 35 | None | Existence 1, 30 | None | 5.5 | 5.4 | None |
| II - 36 | Existence 1, 30 | Existence 2, 29 | Existence | 5.5 | 5.5 | None |
| II - 37 | None | None | None | 5.0 | 4.2 | Occurred |

As apparent from Table 8, in Sample No. II-37 as a comparative example, the stress exerted on the stacking interface was concentrated at a point, which increased load and caused delamination (inter-layer peeling), as well as beat sound generation and noise generation. On the other hand, in Samples Nos. II-34 to II-36 as the present invention, no remarkable drop in the element displacement was confirmed even after being continuously driven $1 \times 10^9$ times, and hence these samples had effective displacements required for the piezoelectric actuators, respectively. This shows that the piezoelectric actuators having excellent durability were achieved.

Particularly, it can be seen that Sample No. II-36, in which the stress relaxing layer (the thin metal layer 12e) and the stress concentrating layer (the thick metal layer 12f) were adjacent to each other with the piezoelectric layer 11 in wires a dc electric field of 3 kV/mm for 15 minutes to the positive electrode and the negative electrode of the external electrodes 15, respectively. Thus, each piezoelectric actuator using the multilayer piezoelectric element as shown in FIG. 1 was manufactured (Sample Nos. III-1 to III-6 in Table 9). By applying a dc current of 170V to the obtained multilayer piezoelectric element, every piezoelectric actuator had a displacement in the stacking direction.

<Evaluations>

In the same manner as in Example I-a, a continuous driving test was conducted for each of the obtained piezoelectric actuators. The evaluation results are shown in Table 9. The metal layers other than the high-ratio metal layer had substantially the same composition as shown in Table 9.

TABLE 9

| Sample No. | Constitution of metal layers | Main components of metal layers 12 | High-ratio metal components | Composition of high-ratio metal layers 12h (% by mass) | Composition of other metal layers 12g (% by mass) | Displacement in initial state (μm) | Displacement after continuous driving (μm) | Delamination | Noise generation of harmonic components | Beat sound generation |
|---|---|---|---|---|---|---|---|---|---|---|
| III - 1 | FIG. 14 | Ag—Pd Alloy | Ag | Ag70% Pd30% | Ag65% Pd30% Pt5% | 50.0 | 49.9 | None | None | None |
| III - 2 | FIG. 14 | Ag—Pd Alloy | Ag | Ag75% Pd25% | Ag70% Pd30% | 50.0 | 49.9 | None | None | None |
| III - 3 | FIG. 14 | Ag—Pd Alloy | Ag | Ag85% Pd15% | Ag80% Pd20% | 55.0 | 54.9 | None | None | None |
| III - 4 | FIG. 14 | Ag—Pd Alloy | Ag | Ag90% Pd10% | Ag85% Pd15% | 60.0 | 59.9 | None | None | None |
| III - 5 | FIG. 14 | Ag—Pd Alloy | Ag | Ag95% Pd5% | Ag90% Pd10% | 60.0 | 60.0 | None | None | None |
| III - 6 | FIG. 23 | Ag—Pd Alloy | x | Ag70% Pd30% | Ag70% Pd30% | 45.0 | 42.0 | Occurred | Occurred | Occurred |

As apparent from Table 9, in Sample No. III-6 as a comparative example, the stress exerted on the stacking interface was concentrated at a point, which increased load and caused peeling, as well as beat sound generation and noise generation. On the other hand, in Samples Nos. III-1 to III-5 as the present invention, no remarkable drop in the element displacement was confirmed even after being continuously driven $1 \times 10^9$ times, and hence these samples had effective displacements required for the piezoelectric actuators, respectively. That is, the piezoelectric actuators having excellent durability were achieved.

Example III-b

Manufacturing of Piezoelectric Actuators

Piezoelectric actuators composed of the multilayer piezoelectric element according to the tenth preferred embodiment were manufactured as follows.

Firstly, in the same manner as in Example I-a, a ceramic green sheet having a thickness of 150 μm and constituting a piezoelectric layer 11 was prepared. On one surface of this ceramic green sheet, 300 pieces of sheets were stacked which were formed by screen printing using a conductive paste. The conductive paste was prepared by adding binder to silver-palladium alloy so as to have the composition as shown in Table 10. This was sintered to obtain a stacked body 13, under the sintering condition that the stacked matter was retained at 800° C., and then sintered at 1000° C.

At this time, a conductive paste consisting of 100% of silver was printed on the portion for forming a high-ratio metal layer 12j so that they had a thickness of 3 μm, and the high-ratio metal layers 12j were arranged on the 50th layer, the 100th layer, the 150th layer, the 200th layer and 250th layer, respectively.

Next, in the same manner as in Example I-a, each multilayer piezoelectric element was obtained by forming external electrodes 15 on the stacked body 13. Then, the polarization processing was performed by connecting lead wires to the external electrodes 15 of the obtained multilayer piezoelectric element, respectively, and by applying through the lead wires a dc electric field of 3 kV/mm for 15 minutes to the positive electrode and the negative electrode of the external electrodes 15, respectively. Thus, each piezoelectric actuator using the multilayer piezoelectric element as shown in FIG. 1 was manufactured (Sample Nos. III-7 to III-12 in Table 10). By applying a dc current of 170V to the obtained multilayer piezoelectric element, every piezoelectric actuator had a displacement in the stacking direction.

<Evaluations>

In the same manner as in Example I-a, a continuous driving test was conducted for each of the obtained piezoelectric actuators. The evaluation results are shown in Table 10. The metal layers other than the high-ratio metal layer had substantially the same composition as shown in Table 10.

TABLE 10

| Sample No. | Constitution of metal layers | Main components of metal layers 12 | High-ratio metal components | Composition of high-ratio metal layers 12j (% by mass) | Composition of other metal layers 12i (% by mass) | Displacement in initial state (μm) | Displacement after continuous driving (μm) | Delamination | Noise generation of harmonic components | Beat sound generation |
|---|---|---|---|---|---|---|---|---|---|---|
| III - 7 | FIG. 15 | Ag | Ag | Ag100% | Ag65% Pd30% Pt5% | 50.0 | 49.9 | None | None | None |
| III - 8 | FIG. 15 | Ag | Ag | Ag100% | Ag70% Pd30% | 50.0 | 49.9 | None | None | None |
| III - 9 | FIG. 15 | Ag | Ag | Ag100% | Ag80% Pd20% | 55.0 | 54.9 | None | None | None |
| III - 10 | FIG. 15 | Ag | Ag | Ag100% | Ag85% Pd15% | 60.0 | 59.9 | None | None | None |

TABLE 10-continued

| Sample No. | Constitution of metal layers | Main components of metal layers 12 | High-ratio metal components | Composition of high-ratio metal layers 12j (% by mass) | Composition of other metal layers 12i (% by mass) | Result of continuous driving test ||||| 
|---|---|---|---|---|---|---|---|---|---|---|
| | | | | | | Displacement in initial state (μm) | Displacement after continuous driving (μm) | Delamination | Noise generation of harmonic components | Beat sound generation |
| III - 11 | FIG. 15 | Ag | Ag | Ag100% | Ag95% Pd5% | 60.0 | 60.0 | None | None | None |
| III - 12 | FIG. 23 | Ag | x | Ag70% Pd30% | Ag70% Pd30% | 45.0 | 42.0 | Occurred | Occurred | Occurred |

As shown in Table 10, in Sample No. III-12 as a comparative example, the stress exerted on the stacking interface was concentrated at a point, which increased load and caused peeling, as well as beat sound generation and noise generation. On the other hand, in Samples Nos. III-7 to III-11 as the preferred embodiments of the present invention, no remarkable drop in the element displacement was confirmed even after being continuously driven $1 \times 10^9$ times, and hence these samples had effective displacements required for the piezoelectric actuators, respectively. That is, the piezoelectric actuators having excellent durability were achieved.

Example III-c

Manufacturing of Piezoelectric Actuators

Piezoelectric actuators composed of the multilayer piezoelectric element according to the eleventh preferred embodiment were manufactured as follows.

Firstly, in the same manner as in Example I-a, a ceramic green sheet having a thickness of 150 μm and constituting a piezoelectric layer 11 was prepared. On one surface of this ceramic green sheet, 300 pieces of sheets were stacked which were formed by screen printing using a conductive paste prepared by adding binder to copper powder. This was sintered in nitrogen atmosphere, thereby obtaining a stacked body 13, under the sintering condition that the stacked matter was retained at 800° C., and then sintered at 1000° C.

At this time, a conductive paste consisting of silver-palladium alloy as shown in Table 11 was printed on the portions for forming a metal layer 12*l* so that they had a thickness of 3 μm, and the metal layers 12*l* were arranged on the 50th layer, the 100th layer, the 150th layer, the 200th layer and 250th layer, respectively.

Next, in the same manner as in Example I-a, each multilayer piezoelectric element was obtained by forming external electrodes 15 on the stacked body 13. Then, the polarization processing was performed by connecting lead wires to the external electrodes 15 of the obtained multilayer piezoelectric element, respectively, and by applying through the lead wires a dc electric field of 3 kV/mm for 15 minutes to the positive electrode and the negative electrode of the external electrodes 15, respectively. Thus, each piezoelectric actuator using the multilayer piezoelectric element as shown in FIG. 1 was manufactured (Sample Nos. III-13 to III-19 in Table 11). By applying a dc current of 170V to the obtained multilayer piezoelectric element, every piezoelectric actuator had a displacement in the stacking direction.

<Evaluations>

In the same manner as in Example I-a, a continuous driving test was conducted for each of the obtained piezoelectric actuators. The evaluation results are shown in Table 11. All of the metal layers having the same main component had substantially the same composition as shown in Table 11.

TABLE 11

| Sample No. | Constitution of metal layers | Composition of metal layers 12k (% by mass) | Composition of metal layers 12l (% by mass) | Result of continuous driving test |||||
|---|---|---|---|---|---|---|---|---|
| | | | | Displacement in initial state (μm) | Displacement after continuous driving (μm) | Delamination | Noise generation of harmonic components | Beat sound generation |
| III - 13 | FIG. 16 | Cu100% | Ag65% Pd30% Pt5% | 50.0 | 49.9 | None | None | None |
| III - 14 | FIG. 16 | Cu100% | Ag70% Pd30% | 50.0 | 49.9 | None | None | None |
| III - 15 | FIG. 16 | Cu100% | Ag80% Pd20% | 55.0 | 54.9 | None | None | None |
| III - 16 | FIG. 16 | Cu100% | Ag85% Pd15% | 60.0 | 59.9 | None | None | None |
| III - 17 | FIG. 16 | Cu100% | Ag95% Pd5% | 60.0 | 60.0 | None | None | None |
| III - 18 | FIG. 23 | Ag70% Pd30% | Ag70% Pd30% | 45.0 | 42.0 | Occurred | Occurred | Occurred |
| III - 19 | FIG. 23 | Cu100% | Cu100% | 45.0 | 42.0 | Occurred | Occurred | Occurred |

As shown in Table 11, in Samples Nos. III-18 and III-19 as comparative examples, the stress exerted on the stacking interface was concentrated at a point, which increased load and caused peeling, as well as beat sound generation and noise generation. On the other hand, in Samples Nos. III-13 to III-17 as the preferred embodiments of the present invention, no remarkable drop in the element displacement was confirmed even after being continuously driven $1\times10^9$ times, and hence these samples had effective displacements required for the piezoelectric actuators, respectively. That is, the piezoelectric actuators having excellent durability were achieved.

Example III-d

The material compositions of the metal layers 12 in the piezoelectric actuators of Sample No. III-5 in the above Example III-a was changed, and each rate of change of the displacement (%) was calculated in the same manner as in Example I-c. The results are shown in Table 12.

TABLE 12

| Sample No. | Pd composition of other metal layers 12 g (% by mass) | Ag composition of other metal layers 12 g (% by mass) | Pd composition of high-ratio metal layers 12 h (% by mass) | Ag composition of high-ratio metal layers 12 h (% by mass) | Rate of change of displacement (%) |
|---|---|---|---|---|---|
| III - 20 | 0.01 | 99.99 | 0.001 | 99.999 | 0.7 |
| III - 21 | 0.1 | 99.9 | 0.01 | 99.99 | 0.4 |
| III - 22 | 0.5 | 99.5 | 0.1 | 99.9 | 0.2 |
| III - 23 | 1 | 99 | 0.5 | 99.5 | 0.2 |
| III - 24 | 2 | 98 | 1 | 99 | 0.1 |
| III - 25 | 4 | 96 | 2 | 98 | 0 |
| III - 26 | 5 | 95 | 4 | 96 | 0 |
| III - 27 | 8 | 92 | 5 | 95 | 0 |
| III - 28 | 9 | 91 | 8 | 92 | 0.1 |
| III - 29 | 9.5 | 90.5 | 9 | 91 | 0.2 |
| III - 30 | 10 | 90 | 9.5 | 90.5 | 0.4 |
| III - 31 | 15 | 85 | 10 | 90 | 0.7 |
| III - 32 | 20 | 80 | 15 | 85 | 0.9 |
| III - 33 | 30 | 70 | 20 | 80 | 0.9 |
| III - 34 | 0 | 100 | 0 | 100 | Damaged by migration |

As apparent from Table 12, in Sample Nos. III-34, in which all of the metal layers 12 were composed of 100% silver, ion migration of silver occurred, and the multilayer piezoelectric element was broken, the continuous driving was unable. In Samples Nos. III-32 and III-33, in which the palladium content in the metal composition of the metal layers 12 was above 15 mass %, and the silver content was below 85% by mass, the metal layers 12 had a large specific resistance, and when the multilayer piezoelectric element was continuously driven, heat was generated, and the displacement of the piezoelectric actuator was lowered.

On the other hand, Samples Nos. III-20 to III-31 were composed mainly of a metal composition satisfying the following relationship of: $0<M1\leq15$, $85\leq M2<100$, M1+M2=100% by mass, where M1% by mass is a content of metal in groups 8 to 10 in the metal layers 12, and M2% by mass is a content of a metal in group 1b. It was therefore capable of reducing the specific resistance of the metal layers 12, and suppressing the heat generation occurred in the metal layers 12 even in the continuous driving, thereby manufacturing the multilayer actuators with a stable element displacement.

Particularly, Samples Nos. III-25 to 27 were composed mainly of a metal composition satisfying the following relationship of: $2\leq M1\leq8$, $92\leq M2\leq98$, M1+M2=100% by mass, where M1% by mass is a content of metal in groups 8 to 10 in the metal layers 12, and M2% by mass is a content of a metal in group 1b. It was therefore capable of reducing the specific resistance of the metal layers 12, and suppressing the heat generation occurred in the metal layers 12 even in the continuous driving, thereby manufacturing the multilayer actuators which had no change in the element displacement and hence were extremely stable.

Example III-e

From the multilayer piezoelectric elements shown in Table 9, a piece of each sample was taken out, and processed in 3 mm×4 mm×36 mm so that the electrode surface of the metal layers 12 was substantially perpendicular to the longitudinal direction of the specimen. Then, the bending strength was measured under the four-point bending in JIS R 1601. At this time, the location of breakage was confirmed to specify a weak adhesion portion of the multilayer piezoelectric element.

That is, the breakage within the piezoelectric layer 11 shows that the strength of the piezoelectric body is low. The breakage within the metal layer 12 shows that the strength of the metal layer 12 is low. The breakage on the interface between the piezoelectric layer 11 and the metal layer 12 shows that the strength of the interface between the piezoelectric layer 11 and the metal layer 12 is low. The results are shown in Table 13. Although the durability when each sample was functioned as an actuator is already presented in Table 9, this is also presented for reference in Table 13.

TABLE 13

| Sample No. | Constitution of metal layers | Main component of metal layers 12 | High-ratio metal component | Composition of high-ratio metal layer 12h (% by mass) | Composition of other metal layer 12g (% by mass) | Breakage | Delamination |
|---|---|---|---|---|---|---|---|
| III-1 | FIG. 14 | Ag—Pd Alloy | Ag | Ag70% Pd30% | Ag65% Pd30% Pt5% | High-ratio metal | None |
| III-2 | FIG. 14 | Ag—Pd Alloy | Ag | Ag75% Pd25% | Ag70% Pd30% | High-ratio metal | None |
| III-3 | FIG. 14 | Ag—Pd Alloy | Ag | Ag85% Pd15% | Ag80% Pd20% | High-ratio metal | None |
| III-4 | FIG. 14 | Ag—Pd Alloy | Ag | Ag90% Pd10% | Ag85% Pd15% | High-ratio metal | None |
| III-5 | FIG. 14 | Ag—Pd Alloy | Ag | Ag95% Pd5% | Ag90% Pd10% | High-ratio metal | None |
| III-6 | FIG. 23 | Ag—Pd Alloy | x | Ag70% Pd30% | Ag70% Pd30% | Piezoelectrics | Occurred |

In Sample No. III-6 as a comparative example, a breakage occurred in the piezoelectric layer 11. This shows that all of the piezoelectric layers 11 and the metal layers 12 were connected to each other at a high strength. From this, when this sample was continuously driven $1 \times 10^9$ times as an actuator, the stress exerted on the stacking interface was concentrated at a point, which increased load and caused peeling.

On the other hand, in Sample No. III-1 to III-5 as the preferred embodiment of the present invention, a breakage occurred on the interface between the piezoelectric layer 11 and the high-ratio metal layer. This shows that the adhesion between the high-ratio metal layer and the piezoelectric layer was the lowest. From this, it can be considered as follows. That is, when stress was exerted during the continuous driving, the high-ratio metal layer having low adhesion was deformed to generate the phenomenon for relaxing the stress. Even after being continuously driven $1 \times 10^9$ times as an actuator, no peeling occurred, exhibiting excellent durability.

Example III-f

From the multilayer piezoelectric elements shown in Table 9, a piece of each sample was taken out, and the Vickers hardness was measured by using a Micro Vickers Tester such as Model MVK-H3 manufactured by Akashi Seisakusho Co., Ltd. In the measurements, in order to avoid the influence of the piezoelectric layer 11 as a base, there was used the method in which a diamond probe was forced into the metal layer 12 from a direction perpendicular to the stacking direction of the metal layers 12. The results are shown in Table 14. Although the durability when each sample was functioned as an actuator is already presented in Table 9, this is also presented for reference in Table 14.

In Sample No. III-6 as a comparative example, all of the metal layers had the same composition and hence had the same hardness. This shows that all of the piezoelectric layers 11 are connected with the metal layer of the same hardness. When Sample No. III-6 was continuously driven $1 \times 10^9$ times as an actuator, the stress exerted on the stacking interface was concentrated at a point, which increased load and caused peeling.

On the other hand, Sample No. III-1 to III-5 as the preferred embodiment of the present invention had superior results to other metal layers in terms of the hardness of the high-ratio metal layer. This shows that the high-ratio metal layer was softer than other metal layers. From this, it can be considered as follows. That is, when stress was exerted during the continuous driving, the high-ratio metal layer being soft was deformed to generate the phenomenon for relaxing the stress. Even after being continuously driven $1 \times 10^9$ times as an actuator, no peeling occurred, exhibiting excellent durability.

Example III-g

Manufacturing of Piezoelectric Actuators

Piezoelectric actuators composed of the multilayer piezoelectric element having a tilted concentration part were manufactured as follows.

Firstly, in the same manner as in Example I-a, a ceramic green sheet having a thickness of 150 μm and constituting a piezoelectric layer 11 was prepared. On one surface of this ceramic green sheet, 300 pieces of sheets were stacked which were formed by screen printing using a conductive paste

TABLE 14

| Sample No. | Constitution of metal layers | Main component of metal layers 12 | High-ratio metal component | Composition of high-ratio metal layers 12h (% by mass) | Vickers hardness of high-ratio metal layers 12h | Composition of other metal layers 12g (% by mass) | Vickers hardness of other metal layers 12g | Delamination |
|---|---|---|---|---|---|---|---|---|
| III-1 | FIG. 14 | Ag—Pd Alloy | Ag | Ag70% Pd30% | 35 | Ag65% Pd30% Pt5% | 40 | None |
| III-2 | FIG. 14 | Ag—Pd Alloy | Ag | Ag75% Pd25% | 32 | Ag70% Pd30% | 35 | None |
| III-3 | FIG. 14 | Ag—Pd Alloy | Ag | Ag85% Pd15% | 29 | Ag80% Pd20% | 31 | None |
| III-4 | FIG. 14 | Ag—Pd Alloy | Ag | Ag90% Pd10% | 27 | Ag85% Pd15% | 29 | None |
| III-5 | FIG. 14 | Ag—Pd Alloy | Ag | Ag95% Pd5% | 25 | Ag90% Pd10% | 27 | None |
| III-6 | FIG. 23 | Ag—Pd Alloy | x | Ag70% Pd30% | 35 | Ag70% Pd30% | 35 | Occurred | prepared by adding binder to silver-palladium alloy (80% by mass of silver and 20% by mass of palladium). This was sintered to obtain a stacked body 13, under the sintering condition that the stacked matter was retained at 800° C. for two hours, and then sintered at 1000° C. for two hours.

Figure 17:
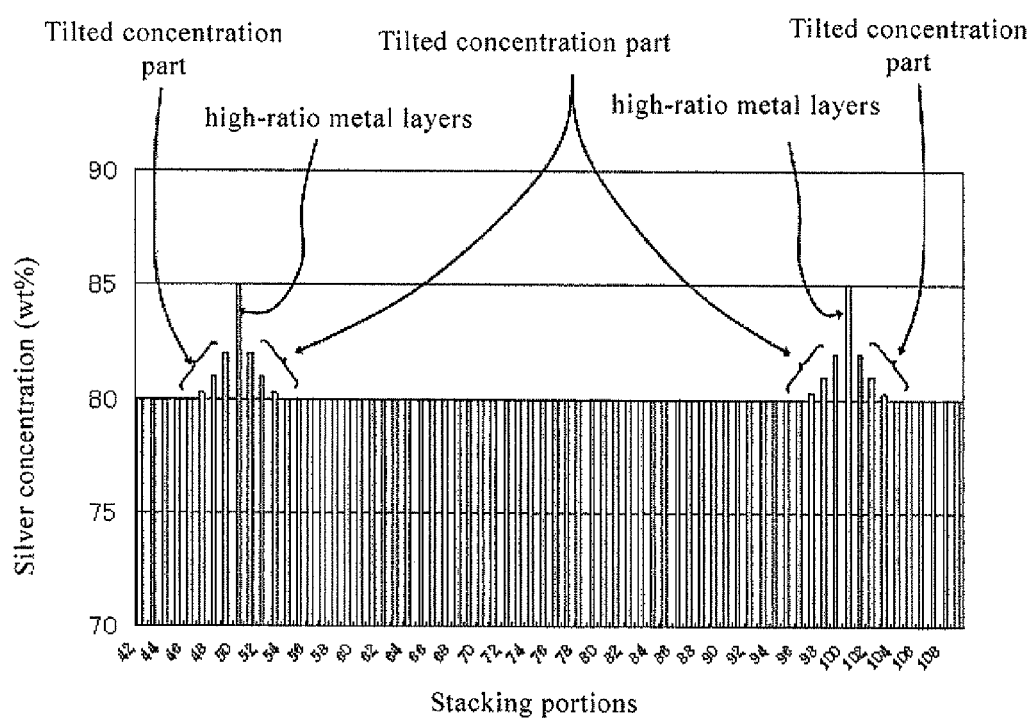
FIG. 17 is a graph showing the silver composition of the metal layer of Sample No. III-35 in Table 15 in an example.

At this time, a conductive paste of silver-palladium alloy (85% by mass of silver and 15% by mass of palladium) was printed on the portions for forming a high-ratio metal layer 12h so that they had a thickness of 3 µm, and further that the high-ratio metal layers 12h were arranged on the 50th layer, the 100th layer, the 150th layer, the 200th layer and 250th layer, respectively, and the silver concentration was gradually reduced from the high-ratio metal layer 12h, as shown in FIG. 17.

Next, in the same manner as in Example I-a, each multilayer piezoelectric element was obtained by forming external electrodes 15 on the stacked body 13. Then, the polarization processing was performed by connecting lead wires to the external electrodes 15 of the obtained multilayer piezoelectric element, respectively, and by applying through the lead wires a dc electric field of 3 kV/mm for 15 minutes to the positive electrode and the negative electrode of the external electrodes 15, respectively. Thus, each piezoelectric actuator using the multilayer piezoelectric element as shown in FIG. 1 was manufactured. By applying a dc current of 170V to the obtained multilayer piezoelectric element, every piezoelectric actuator had a displacement in the stacking direction.

<Evaluations>

In the same manner as in Example I-a, a continuous driving test was conducted for each of the obtained piezoelectric actuators. Each rate of change of the displacement (%) was calculated in the same manner as in Example I-c. The evaluation results are shown in Table 15.

actuator. That is, the piezoelectric actuators having extremely excellent durability was achieved.

Example IV

Manufacturing of Piezoelectric Actuators

Piezoelectric actuators composed of the multilayer piezoelectric element according to the twelfth preferred embodiment were manufactured as follows.

Firstly, in the same manner as in Example I-a, a plurality of ceramic green sheets having a thickness of 150 µm and constituting a piezoelectric layer 11 were prepared. On one surface of each of these ceramic green sheets, a conductive paste prepared by adding binder to silver-palladium alloy (95% by mass of silver and 5% by mass of palladium) was printed by screen printing. In this manner, there were prepared 300 sheets on which the conductive paste was printed. Separately, green sheets serving as protecting layers was prepared. These layers were stacked so that 30 pieces of the protecting layers, 300 pieces of stacked bodies and 30 pieces of the protecting layers were arranged in this order and from bottom to top. This stacked matter was pressed, debindered and sintered to obtain a stacked body 13, under the sintering conditions that the stacked matter was retained at 800° C. for two hours, and then sintered at 1000° C. for two hours.

At this time, a conductive paste prepared by adding binder to silver-palladium alloy (95% by mass of silver and 5% by mass of palladium) was printed on the portions for forming other metal layers so that they had a thickness of 5 or 10 µm after sintering. Depending on the case, voids were formed in the metal layers by adding acryl beads of 0.2 µm to the above conductive paste. A conductive paste, which was prepared by

TABLE 15

| Sample No. | Constitution of metal layers | Main component of metal layers 12 | High-ratio metal component | Composition of high-ratio metal layers 12h (% by mass) | Composition of other metal layers 12g (% by mass) | Existence of tilted concentration part |
|---|---|---|---|---|---|---|
| III - 35 | FIG. 14 | Ag—Pd Alloy | Ag | Ag85% Pd15% | Ag80% Pd20% | Existence |
| III - 36 | FIG. 14 | Ag—Pd Alloy | Ag | Ag85% Pd15% | Ag80% Pd20% | None |
| III - 37 | FIG. 23 | Ag—Pd Alloy | x | Ag70% Pd30% | Ag70% Pd30% | Existence |

| | Result of continuous driving test | | | | | |
|---|---|---|---|---|---|---|
| Sample No. | Displacement in initial state (µm) | Displacement after continuous driving (µm) | Rate of change of displacement (%) | Delamination | Noise generation of harmonic components | Beat sound generation |
| III - 35 | 54.9 | 54.9 | 0.0 | None | None | None |
| III - 36 | 55.0 | 54.9 | 0.2 | None | None | None |
| III - 37 | 45.0 | 42.0 | 6.7 | Occurred | Occurred | Occurred |

As shown in Table 15, in Sample No. III-37 as a comparative example, the stress exerted on the stacking interface was concentrated at a point, which increased load and caused peeling, as well as beat sound generation and noise generation. On the other hand, Samples Nos. III-35 and III-36 as the preferred embodiments of the present invention had good results. Unlike Sample No. III-36, particularly, in Sample No. III-35, no drop in the element displacement was confirmed even after being continuously driven $1 \times 10^9$ times, and hence had effective displacement required for the piezoelectric adding a proper amount of acryl beads having a mean particle size of 0.2 µm, and binder to particles of silver-palladium alloy (95% by mass of silver and 5% by mass of palladium) whose surfaces were oxidized, was printed on the portions for forming other metal layers so that they had a thickness of 1 to 4 µm after sintering. In this manner, the void ratio as shown in Table 16 were attained.

Further, high-resistance metal layers 12m in the stacked body 13 had the layer number as shown in Table 16. The high-resistance metal layers 12m, except for those of Sample No. IV-9, were regularly arranged. Specifically, in Sample No. IV-1 that was one in the layer number of the high-resistance metal layers, the high-resistance metal layer was arranged on the 150th layer from the top of the stacked body. In Sample No. IV-2 that was two in the layer number of the high-resistance metal layers, the high-resistance metal layers were regularly arranged on the 100th layer and 200th layer from the top of the stacked body. In Sample No. IV-3 that was three in the layer number of the high-resistance metal layers, the high-resistance metal layers were regularly arranged at intervals of 50 layers from the top of the stacked body.

In the sample that was 14 in the layer number of the high-resistance metal layers, the high-resistance metal layers were regularly arranged at intervals of 20 layers, and the sample that was 59 in the layer number of the high-resistance metal layers, the high-resistance metal layers were regularly arranged at intervals of 5 layers. In the sample that was 10 in the layer number of the high-resistance metal layers, the high-resistance metal layers were regularly arranged at intervals of 26, 27, 27, 28, 28, 28, 28, 28, 27 and 27. In the sample that was 39 in the layer number of the high-resistance metal layers, the high-resistance metal layers were regularly arranged by alternately taking the intervals of seven layers and eight layers from the top of the stacked body, such as 7, 8, 7 and 8. In the sample that was 20 in the layer number of the high-resistance metal layers, the high-resistance metal layers were regularly arranged at the intervals of 13, 13, 13, 13, 14, 14, 15, 15, 16, 16, 16, 16, 16, 15, 15, 14, 14, 13, 13 and 13. In Sample No. IV-9, which was the samples that was 20 in the layer number of the high-resistance metal layers, and the high-resistance metal layers were not regularly arranged, the high-resistance metal layers were arranged from the top of the stacked body at the intervals of 5, 5, 25, 25, 15, 10, 20, 20, 10, 10, 10, 10, 10, 20, 20, 10, 15, 25, 25 and 5.

As the high-resistance metal layers 12*m*, depending on the case, there were prepared those containing a high-resistance component such as PZT, lead titanate, alumina, titania, silicon nitride, silica or the like.

Next, in the same manner as in Example I-a, each multilayer piezoelectric element was obtained by forming external electrodes 15 on the stacked body 13. Then, the polarization processing was performed by connecting lead wires to the external electrodes 15 of the obtained multilayer piezoelectric element, respectively, and by applying through the lead wires a dc electric field of 3 kV/mm for 15 minutes to the positive electrode and the negative electrode of the external electrodes 15, respectively. Thus, each piezoelectric actuator using the multilayer piezoelectric element as shown in FIG. 18 was manufactured (Samples Nos. IV-1 to IV-32 in Table 16). By applying a dc current of 170V to the obtained multilayer piezoelectric element, every piezoelectric actuator had a displacement in the stacking direction.

<Evaluations>

In a test, each piezoelectric actuator was continuously driven up to $2\times10^9$ times by applying an alternating voltage of 0 to +170V at a frequency of 300 Hz at room temperature. The test was conducted using 100 pieces per sample. After the test, the rate of the fractured samples was calculated, and the results were presented in Table 16, as a fracture rate after testing. Further, using a metal microscope and an SEM or the like, the stacked portions were observed to confirm the number of layers with peeling. Further, the absolute value of a difference between the displacement of the multilayer piezoelectric element at the initial stage and the displacement of the multilayer piezoelectric element after the test, is divided by the displacement of the multilayer piezoelectric element at the initial stage, and the result was multiplied by 100. The obtained value was presented in Table 16, as a rate of change in the displacements before and after the driving test. The results are shown in Table 16.

TABLE 16

| Sample No. | Number of high-resistance metal layers | Arrangement of high-resistance metal layers | Void ratio of high-resistance metal layers (%) | Void ratio of other metal layers (%) | Content of high resistance component in high-resistance metal layers (%) | Content of high resistance component in other metal layers (%) |
|---|---|---|---|---|---|---|
| IV - 1 | 1 | — | 70 | 1 | 1 | 1 |
| IV - 2 | 2 | Almost regular | 70 | 1 | 1 | 1 |
| IV - 3 | 5 | Almost regular | 70 | 1 | 1 | 1 |
| IV - 4 | 10 | Almost regular | 70 | 1 | 1 | 1 |
| IV - 5 | 14 | Almost regular | 70 | 1 | 1 | 1 |
| IV - 6 | 20 | Almost regular | 70 | 1 | 1 | 1 |
| IV - 7 | 39 | Almost regular | 70 | 1 | 1 | 1 |
| IV - 8 | 59 | Almost regular | 70 | 1 | 1 | 1 |
| IV - 9 | 20 | irregular | 70 | 1 | 1 | 1 |
| IV - 10 | 20 | Almost regular | 30 | 1 | 1 | 1 |
| IV - 11 | 20 | Almost regular | 40 | 1 | 1 | 1 |
| IV - 12 | 20 | Almost regular | 50 | 1 | 1 | 1 |
| IV - 13 | 20 | Almost regular | 90 | 1 | 1 | 1 |
| IV - 14 | 20 | Almost regular | 99 | 1 | 1 | 1 |
| IV - 15 | 20 | Almost regular | 70 | 5 | 1 | 1 |
| IV - 16 | 20 | Almost regular | 70 | 10 | 1 | 1 |
| IV - 17 | 20 | Almost regular | 1 | 1 | 40 | 1 |
| IV - 18 | 20 | Almost regular | 1 | 1 | 50 | 1 |
| IV - 19 | 20 | Almost regular | 1 | 1 | 70 | 1 |
| IV - 20 | 20 | Almost regular | 1 | 1 | 90 | 1 |
| IV - 21 | 20 | Almost regular | 1 | 1 | 99 | 1 |
| IV - 22 | 20 | Almost regular | 1 | 1 | 70 | 1 |
| IV - 23 | 20 | Almost regular | 1 | 1 | 70 | 1 |
| IV - 24 | 20 | Almost regular | 1 | 1 | 70 | 1 |
| IV - 25 | 20 | Almost regular | 1 | 1 | 70 | 1 |
| IV - 26 | 20 | Almost regular | 1 | 1 | 70 | 1 |
| IV - 27 | 20 | Almost regular | 70 | 1 | 1 | 1 |
| IV - 28 | 20 | Almost regular | 70 | 1 | 1 | 1 |

TABLE 16-continued

| Sample No. | | | | | |
|---|---|---|---|---|---|
| IV - 29 | 20 | Almost regular | 70 | 1 | 1 | 1 |
| IV - 30 | 20 | Almost regular | 70 | 1 | 1 | 1 |
| IV - 31 | 20 | Almost regular | 70 | 1 | 1 | 1 |
| IV - 32 | 20 | Almost regular | 70 | 1 | 1 | 1 |

| Sample No. | High resistance component | Thickness of other matal layers (μm) | Thickness of high-resistance matal layers (μm) | Fracture rate after test (%) | Changing rate of displacement before and after continuous driving test (%) |
|---|---|---|---|---|---|
| IV - 1 | PZT | 3 | 5 | 10 | 20 |
| IV - 2 | PZT | 3 | 5 | 3 | 10 |
| IV - 3 | PZT | 3 | 5 | 3 | 5 |
| IV - 4 | PZT | 3 | 5 | 0 | 3 |
| IV - 5 | PZT | 3 | 5 | 0 | 2.5 |
| IV - 6 | PZT | 3 | 5 | 0 | 1.5 |
| IV - 7 | PZT | 3 | 5 | 0 | 1.4 |
| IV - 8 | PZT | 3 | 5 | 0 | 1.3 |
| IV - 9 | PZT | 3 | 5 | 2 | 2.2 |
| IV - 10 | PZT | 3 | 5 | 0 | 2 |
| IV - 11 | PZT | 3 | 5 | 0 | 1.8 |
| IV - 12 | PZT | 3 | 5 | 0 | 1.6 |
| IV - 13 | PZT | 3 | 5 | 0 | 1.6 |
| IV - 14 | PZT | 3 | 5 | 0 | 1.8 |
| IV - 15 | PZT | 3 | 5 | 0 | 1.6 |
| IV - 16 | PZT | 3 | 5 | 0 | 1.6 |
| IV - 17 | PZT | 3 | 5 | 0 | 0.9 |
| IV - 18 | PZT | 3 | 5 | 0 | 0.5 |
| IV - 19 | PZT | 3 | 5 | 0 | 0.4 |
| IV - 20 | PZT | 3 | 5 | 0 | 0.5 |
| IV - 21 | PZT | 3 | 5 | 0 | 0.8 |
| IV - 22 | Lead titanate | 3 | 5 | 0 | 0.5 |
| IV - 23 | Alumina | 3 | 5 | 0 | 0.5 |
| IV - 24 | Titania | 3 | 5 | 0 | 0.6 |
| IV - 25 | Silicon nitride | 3 | 5 | 0 | 0.8 |
| IV - 26 | Silica | 3 | 5 | 0 | 0.8 |
| IV - 27 | PZT | 6 | 5 | 0 | 1.9 |
| IV - 28 | PZT | 4 | 5 | 0 | 1.6 |
| IV - 29 | PZT | 3 | 5 | 0 | 1.5 |
| IV - 30 | PZT | 2 | 5 | 0 | 1.4 |
| IV - 31 | PZT | 1 | 5 | 0 | 1.4 |
| IV - 32 | PZT | 3 | 10 | 0 | 1.4 |

From Table 16, Sample No. IV-1 as a comparative example, in which the number of the high-resistance metal layer in the multilayer piezoelectric element was one, could not disperse stress suitably, and the generated crack was extended to the entire element, so that the fracture rate after the test was as large as 10%. The number of layers which caused peeling in the layers of the stacked body was as much as 100. Further, the range of change in the displacement before and after the driving test was as large as 20%, and the durability was low.

On the other hand, in Sample Nos. IV-2 to IV-32 as the preferred embodiments of the present invention, the fracture rate after the $2 \times 10^9$ times of continuous driving was not more than 3%, and was extremely superior in durability to Sample Nos. IV-1 as a comparative example. The samples where the high-resistance metal layers were regularly arranged, for example, Sample No. IV-6, was superior in durability to Sample No. IV-9 where these layers were not regularly arranged, owing to the absence of the fracture after the test, and a small rate of change in the displacement before and after the test.

In Samples Nos. IV-10 to IV-16 in which 20 layers of the high-resistance metal layers were regularly arranged, and the void ratio of the high-resistance metal layers was larger than that of other metal layers, the rate of change in the displacement before and after the test was as small as 2.0% or below. This shows these samples had excellent durability as the multilayer piezoelectric element. In Samples No. IV-11 to IV-16 in which the void ratio of the high-resistance metal layers was 40 to 99%, the rate of change in the displacement before and after the test was smaller, namely 1.8% or below, exhibiting excellent durability.

In Samples Nos. IV-17 to IV-26 in which 20 layers of the high-resistance metal layers were regularly arranged, and the content of the high resistance component in the high-resistance metal layers was larger than that of other metal layers, any one of these samples was not fractured, and the rate of change in the displacement before and after the test was as remarkably small, namely 0.4% to 0.9%. This shows these samples had excellent durability as the multilayer piezoelectric element. The samples using PZT, lead titanate, alumina, or titania were further excellent in durability.

In Samples Nos. IV-6, IV-28 to IV-32, in which the high-resistance metal layers and other metal layers had different thicknesses in order to confirm the effect produced by setting so that the high-resistance metal layer had a smaller thickness than other metal layers, the rate of change in the displacement before and after the test was as small as 1.6%, than Sample No. IV-27 in which the high-resistance metal layer had a larger thickness than other metal layers. This shows these samples had excellent durability.

Further, in the sample in which the electrical resistance ratio of the high-resistance metal layers to the piezoelectric layers is 1/10 to 1000 times, and in the sample in which the electrical resistance ratio of the high-resistance metal layers to other metal layers is above 1000 times, no peeling occurred in the high-resistance metal layers, exhibiting excellent durability.

From the foregoing results, the injectors containing the multilayer piezoelectric elements of the present preferred embodiments, respectively, permit efficient injection and exhibit excellent durability. Hence, these injectors become environmental friendly products.

Example V

Manufacturing of Piezoelectric Actuators

Piezoelectric actuators composed of the multilayer piezoelectric element according to the thirteenth preferred embodiment were manufactured as follows.

Next, in the same manner as in Example I-a, each multilayer piezoelectric element was obtained by forming external electrodes 15 on the stacked body 13. Then, the polarization processing was performed by connecting lead wires to the external electrodes 15 of the obtained multilayer piezoelectric element, respectively, and by applying through the lead wires a dc electric field of 3 kV/mm for 15 minutes to the positive electrode and the negative electrode of the external electrodes 15, respectively. Thus, each piezoelectric actuator using the multilayer piezoelectric element as shown in FIG. 19 was manufactured (Sample Nos. V-1 to V-6 in Table 17). By applying a dc current of 170V to the obtained multilayer piezoelectric element, every piezoelectric actuator had a displacement in the stacking direction.

<Evaluations>

In the same manner as in Example I-a, a continuous driving test was conducted for each of the obtained piezoelectric actuators. The evaluation results are shown in Table 17.

TABLE 17

| Sample No. | At least one of a plurality of metal layers is a metal part composed of a plurality of metals scattered between piezoelectric layers | A part of a plurality of metals is oppositely disposed both ends of piezoelectric layers adjacent to both sides in thickness direction of metal parts, and the rest are connected through only one end thereof in thickness direction to piezoelectric layers | There are a plurality of metal parts | Metal parts are arranged interposing in between a plurality of piezoelectric layers | Metal parts are disposed regularly | There are a plurality of metal parts |
|---|---|---|---|---|---|---|
| V-1 | o | o | x | x | x | x |
| V-2 | o | x | o | x | x | x |
| V-3 | o | o | o | o | x | x |
| V-4 | o | o | o | o | o | x |
| V-5 | o | o | o | o | o | o |
| V-6 | x | x | x | x | x | x |

| Sample No. | Metal composing metal parts | Voids exist between a plurality of metal adjacent to each other in metal parts | Displacement in initial state (μm) | Displacement after continuous driving (μm) | Delamination | Noise generation of harmonic components | Beat sound generation |
|---|---|---|---|---|---|---|---|
| V-1 | Ag, Pd | o | 50.0 | 49.9 | None | None | None |
| V-2 | Ag, Pd | x | 50.0 | 49.9 | None | None | None |
| V-3 | Ag, Pd | o | 55.0 | 54.9 | None | None | None |
| V-4 | Ag, Pd | o | 60.0 | 59.9 | None | None | None |
| V-5 | Ag, Pd | x | 60.0 | 60.0 | None | None | None |
| V-6 | — | x | 45.0 | 42.0 | Occurred | Occurred | Occurred |

In this table, "o" means that it is satisfied with the condition mentioned above, and "x" means that it is unsatisfied with the condition mentioned above.

Firstly, in the same manner as in Example I-a, a ceramic green sheet having a thickness of 150 μm and constituting a piezoelectric layer 11 was prepared. On one surface of this ceramic green sheet, 300 pieces of sheets were stacked which were formed by screen printing using a conductive paste prepared by adding binder to silver-palladium alloy (95% % by mass of silver and 5% by mass of palladium). This was sintered to obtain a stacked body 13, under the sintering condition that the stacked matter was retained at 800° C., and then sintered at 1000° C.

At this time, printing was performed on the portions for forming metal layers so that they had a thickness of 10 μm by a process using a resist thickness of 20 μm, and printing was performed on the portions for forming metal parts so that they had a thickness of 5 μm by a process using a resist thickness of 10 μm. The metal parts were arranged on the 50th layer, the 100th layer, the 150th layer, the 200th layer and 250th layer, respectively. In the metal layers composed of the metal parts, six metal parts were arranged as shown in FIG. 19(b).

As shown in Table 17, in Samples Nos. V-6 as a comparative example, the stress exerted on the stacking interface was concentrated at a point, which increased load and caused peeling, as well as beat sound generation and noise generation. On the other hand, in Samples Nos. V-1 to V-5 as the preferred embodiments of the present invention, no remarkable drop in the element displacement was confirmed even after being continuously driven $1 \times 10^9$ times, and hence these samples had effective displacements required for the piezoelectric actuators, respectively. That is, the piezoelectric actuators causing no error and having excellent durability were achieved.

Particularly, it can be seen that Sample No. V-3, in which the stress relaxing layer and the stress concentrating layer were adjacent to each other with the piezoelectric body in between, were capable of increasing the element displacement and also manufacturing the multilayer actuators exhibiting a stable element displacement. Further, Samples Nos. V-4 and V-5, in which the stress relaxing layers were interposed with the piezoelectric body in between, were capable of achieving the largest element displacement, and also manufacturing the piezoelectric actuators which caused little change of the element displacement and had extremely excellent durability. This permitted the multilayer actuator exhibiting a stable element displacement.

The invention claimed is:

1. A multilayer piezoelectric element in which a plurality of piezoelectric layers and a plurality of metal layers are stacked alternately, a plurality of the metal layers including a plurality of thin metal layers having a smaller thickness than oppositely disposed metal layers adjacent to each other in a stacking direction, wherein the oppositely disposed metal layers are disposed on both sides of each thin metal layer.

2. The multilayer piezoelectric element according to claim 1, wherein a plurality of the thin metal layers are spaced from each other, interposing in between other metal layers having a lager thickness than the thin metal layers.

3. The multilayer piezoelectric element according to claim 1, wherein a plurality of the thin metal layers are disposed regularly in the stacking direction.

4. The multilayer piezoelectric element according to claim 1, wherein a plurality of the metal layers include a plurality of thick metal layers having a larger thickness than oppositely disposed metal layers adjacent to each other in the stacking direction, wherein the oppositely disposed metal layers are disposed on both sides of each thick metal layer.

5. The multilayer piezoelectric element according to claim 4, wherein a plurality of the thick metal layers are disposed regularly in the stacking direction.

6. The multilayer piezoelectric element according to claim 4, wherein one or a pair of the metal layers adjacent to one of the thin metal layers in the stacking direction is the thick metal layer.

7. The multilayer piezoelectric element according to claim 4, wherein a pair of the metal layers adjacent to one of the thin metal layers in the stacking direction are the thick metal layers.

8. The multilayer piezoelectric element according to claim 4, wherein when the thicknesses of a plurality of the metal layers are compared to each other, there are a peak thickness in the thick metal layers and a tilting region where the thickness is gradually lowered from the thick metal layer over at least two metal layers in the stacking direction.

9. The multilayer piezoelectric element according to claim 1, wherein the thin metal layer is composed of a plurality of metal parts spaced apart from each other with voids in between.

10. The multilayer piezoelectric element according to claim 1, wherein in a plurality of the metal layers, one having a smaller thickness than oppositely disposed ones adjacent to each other in the stacking direction is taken as a thin metal layer, one having a larger thickness than the oppositely disposed ones adjacent to each other in the stacking direction is taken as a thick metal layer, metal layer except for the thin metal layer and the thick metal layer is taken as other metal layer, and a thickness ratio, $Y2/X2$, is in a range of 0.1 to 0.9, where $X2$ is a thickness of the other metal layer, and $Y2$ is a thickness of the thin metal layer.

11. The multilayer piezoelectric element according to claim 1, wherein in a plurality of the metal layers, one having a smaller thickness than oppositely disposed ones adjacent to each other in the stacking direction is taken as a thin metal layer, one having a larger thickness than the oppositely disposed ones adjacent to each other in the stacking direction is taken as a thick metal layer, metal layer except for the thin metal layer and the thick metal layer is taken as other metal layer, and a thickness ratio, $Z2/X2$, is in a range of 1.05 to 2, where $X2$ is a thickness of the other metal layer, and $Z2$ is a thickness of the thick metal layer.

12. A multilayer piezoelectric element in which a plurality of piezoelectric layers and a plurality of metal layers are stacked alternately, an inactive layer composed of a piezoelectric body being formed at both sides in a stacking direction, and a metal layer adjacent to the inactive layer being a thin metal layer having a smaller thickness than metal layers adjacent to each other in the stacking direction.

13. An injector comprising:
a container having an injection hole; and
a multilayer piezoelectric element according to claim 1, which is housed in the container,
the injector being configured so that a liquid filled in the container is discharged from the injection hole by driving of the multilayer piezoelectric element.

* * * * *